US011978825B2

United States Patent
McGroddy et al.

(10) Patent No.: US 11,978,825 B2
(45) Date of Patent: May 7, 2024

(54) LED WITH INTERNALLY CONFINED CURRENT INJECTION AREA

(71) Applicant: Apple Inc., Cupertino, CA (US)

(72) Inventors: Kelly McGroddy, San Francisco, CA (US); Hsin-Hua Hu, Los Altos, CA (US); Andreas Bibl, Los Altos, CA (US); Clayton Ka Tsun Chan, Fremont, CA (US); Daniel Arthur Haeger, Fremont, CA (US)

(73) Assignee: Apple Inc., Cupertino, CA (US)

( * ) Notice: Subject to any disclaimer, the term of this patent is extended or adjusted under 35 U.S.C. 154(b) by 42 days.

(21) Appl. No.: 17/388,949

(22) Filed: Jul. 29, 2021

(65) Prior Publication Data

US 2022/0013688 A1 Jan. 13, 2022

Related U.S. Application Data

(60) Continuation of application No. 16/783,737, filed on Feb. 6, 2020, now Pat. No. 11,101,405, which is a
(Continued)

(51) Int. Cl.
*H01L 33/14* (2010.01)
*H01L 23/00* (2006.01)
(Continued)

(52) U.S. Cl.
CPC ............ *H01L 33/145* (2013.01); *H01L 24/75* (2013.01); *H01L 24/95* (2013.01);
(Continued)

(58) Field of Classification Search
CPC ...................................................... H01L 33/06
See application file for complete search history.

(56) References Cited

U.S. PATENT DOCUMENTS

| 3,717,743 A | 2/1973 | Costello |
| 3,935,986 A | 2/1976 | Lattari et al. |

(Continued)

FOREIGN PATENT DOCUMENTS

| CN | 102479896 A | 5/2012 |
| EP | 0416226 A1 | 3/1991 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Yu-Hsi D Sun
(74) *Attorney, Agent, or Firm* — Aikin & Gallant, LLP

(57) ABSTRACT

Methods and structures for forming arrays of LED devices are disclosed. The LED devices in accordance with embodiments of the invention may include an internally confined current injection area to reduce non-radiative recombination due to edge effects. Several manners for confining current may include etch removal of a current distribution layer, etch removal of a current distribution layer and active layer followed by mesa re-growth, isolation by ion implant or diffusion, quantum well intermixing, and oxide isolation.

23 Claims, 38 Drawing Sheets

Related U.S. Application Data continuation of application No. 15/223,900, filed on Jul. 29, 2016, now Pat. No. 10,593,832, which is a division of application No. 14/194,509, filed on Feb. 28, 2014, now Pat. No. 9,450,147, which is a continuation-in-part of application No. 14/141,735, filed on Dec. 27, 2013, now Pat. No. 9,583,466.

(51) Int. Cl.
| | |
|---|---|
| *H01L 25/075* | (2006.01) |
| *H01L 27/01* | (2006.01) |
| *H01L 27/15* | (2006.01) |
| *H01L 33/00* | (2010.01) |
| *H01L 33/06* | (2010.01) |
| *H01L 33/30* | (2010.01) |
| *H01L 33/42* | (2010.01) |
| *G09G 3/32* | (2016.01) |
| *H01L 33/16* | (2010.01) |
| *H01L 33/20* | (2010.01) |

(52) U.S. Cl.
CPC ........ *H01L 25/0753* (2013.01); *H01L 27/016* (2013.01); *H01L 27/156* (2013.01); *H01L 33/0093* (2020.05); *H01L 33/06* (2013.01); *H01L 33/14* (2013.01); *H01L 33/30* (2013.01); *H01L 33/42* (2013.01); *G09G 3/32* (2013.01); *H01L 33/0016* (2013.01); *H01L 33/0095* (2013.01); *H01L 33/16* (2013.01); *H01L 33/20* (2013.01); *H01L 2224/75305* (2013.01); *H01L 2224/75725* (2013.01); *H01L 2224/7598* (2013.01); *H01L 2224/82203* (2013.01); *H01L 2924/12041* (2013.01); *H01L 2924/12042* (2013.01); *H01L 2924/12044* (2013.01)

(56) References Cited

U.S. PATENT DOCUMENTS

| | | |
|---|---|---|
| 5,131,582 A | 7/1992 | Kaplan et al. |
| 5,378,926 A | 1/1995 | Chi et al. |
| 5,399,885 A | 3/1995 | Thijs et al. |
| 5,435,857 A | 7/1995 | Han et al. |
| 5,592,358 A | 1/1997 | Shamouilian et al. |
| 5,740,956 A | 4/1998 | Seo et al. |
| 5,763,291 A | 6/1998 | Motoda et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 12/2008 | Marchl et al. |
| 7,585,703 B2 | 9/2009 | Matsumura et al. |
| 7,622,367 B1 | 12/2009 | Nuzzo et al. |
| 7,628,309 B1 | 12/2009 | Eriksen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,953,134 B2 | 5/2011 | Chin et al. |
| 7,972,875 B2 | 7/2011 | Rogers et al. |
| 7,982,296 B2 | 7/2011 | Nuzzo et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater, Jr. et al. |
| 8,186,568 B2 | 5/2012 | Coronel et al. |
| 8,333,860 B1 | 12/2012 | Bibl et al. |
| 8,349,116 B1 | 1/2013 | Bible et al. |
| 8,426,227 B1 | 4/2013 | Bible et al. |
| 8,440,546 B2 | 5/2013 | Nuzzo et al. |
| 8,506,867 B2 | 8/2013 | Menard |
| 8,518,204 B2 | 8/2013 | Hu et al. |
| 8,664,699 B2 | 3/2014 | Nuzzo et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 9,047,818 B1 | 6/2015 | Day et al. |
| 9,224,910 B2 | 12/2015 | Seong |
| 9,450,147 B2 | 9/2016 | McGroddy et al. |
| 9,583,466 B2 | 2/2017 | McGroddy et al. |
| 10,593,832 B2 | 3/2020 | McGroddy et al. |
| 11,101,405 B2 | 8/2021 | McGroddy et al. |
| 2001/0029088 A1 | 10/2001 | Odajima et al. |
| 2002/0076848 A1 | 6/2002 | Spooner et al. |
| 2002/0134987 A1* | 9/2002 | Takaoka ............ G02B 6/4202 257/98 |
| 2003/0010975 A1 | 1/2003 | Gibb et al. |
| 2003/0052326 A1 | 3/2003 | Ueda et al. |
| 2003/0173571 A1 | 9/2003 | Kish, Jr. et al. |
| 2003/0177633 A1 | 9/2003 | Haji et al. |
| 2003/0180980 A1 | 9/2003 | Margalith et al. |
| 2004/0099856 A1 | 5/2004 | Bour et al. |
| 2004/0100164 A1 | 5/2004 | Murata et al. |
| 2004/0184499 A1 | 9/2004 | Kondo |
| 2004/0232439 A1 | 11/2004 | Gibb et al. |
| 2004/0266044 A1 | 12/2004 | Park et al. |
| 2004/0266048 A1 | 12/2004 | Platt et al. |
| 2005/0139856 A1 | 6/2005 | Hino et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0246733 A1 | 10/2007 | Oshima |
| 2008/0048206 A1 | 2/2008 | Lee et al. |
| 2008/0150134 A1 | 6/2008 | Shinkai et al. |
| 2008/0163481 A1 | 7/2008 | Shida et al. |
| 2008/0196237 A1 | 8/2008 | Shinya et al. |
| 2008/0205027 A1 | 8/2008 | Coronel et al. |
| 2008/0194054 A1 | 9/2008 | Lin et al. |
| 2008/0232414 A1 | 9/2008 | Masui et al. |
| 2008/0283190 A1 | 11/2008 | Papworth et al. |
| 2008/0283849 A1 | 11/2008 | Imai |
| 2008/0283852 A1 | 11/2008 | Tsuji et al. |

(56) References Cited

U.S. PATENT DOCUMENTS

| | | |
|---|---|---|
| 2008/0303038 A1 | 12/2008 | Grotsch et al. |
| 2009/0068774 A1 | 3/2009 | Slater, Jr. et al. |
| 2009/0072253 A1 | 3/2009 | Karino et al. |
| 2009/0072382 A1 | 3/2009 | Guzek |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0052004 A1 | 3/2010 | Slater, Jr. et al. |
| 2010/0105172 A1 | 4/2010 | Li et al. |
| 2010/0109030 A1 | 5/2010 | Krames et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0240162 A1 | 9/2010 | Bae |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0101372 A1 | 5/2011 | Oya et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0227121 A1 | 9/2011 | Kato et al. |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0092389 A1 | 4/2012 | Okuyama |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0105836 A1 | 5/2013 | Yokozeki et al. |
| 2013/0126081 A1 | 5/2013 | Hu et al. |
| 2013/0130440 A1 | 5/2013 | Hu et al. |
| 2013/0134591 A1 | 5/2013 | Sakamoto et al. |
| 2013/0175573 A1 | 7/2013 | Mayer et al. |
| 2013/0210194 A1 | 8/2013 | Bibl et al. |
| 2014/0373898 A1 | 12/2014 | Rogers et al. |

FOREIGN PATENT DOCUMENTS

| | | |
|---|---|---|
| JP | 07060675 | 3/1995 |
| JP | H1117218 A | 1/1999 |
| JP | 11142878 | 5/1999 |
| JP | 2001298072 A | 10/2001 |
| JP | 2001353682 A | 12/2001 |
| JP | 2002134822 A | 5/2002 |
| JP | 2002164695 A | 6/2002 |
| JP | 2002176291 A | 6/2002 |
| JP | 2004095944 A | 3/2004 |
| JP | 2005019945 | 1/2005 |
| JP | 2006108635 | 4/2006 |
| JP | 2006196589 A | 7/2006 |
| JP | 2007251220 A | 9/2007 |
| JP | 2002240943 A | 8/2008 |
| JP | 2008200821 A | 9/2008 |
| JP | 2010056458 A | 3/2010 |
| JP | 2010161212 A | 7/2010 |
| JP | 2010186829 A | 8/2010 |
| JP | 2011181834 A | 9/2011 |
| JP | 2013070111 | 4/2013 |
| JP | 2013110374 A | 6/2013 |
| JP | 2013530543 | 7/2013 |
| KR | 100610632 B1 | 8/2006 |
| KR | 1020070042214 A | 4/2007 |
| KR | 1020070093091 A | 9/2007 |
| KR | 100973928 B1 | 8/2010 |
| KR | 101001454 B1 | 12/2010 |
| KR | 1020070006885 A | 1/2011 |
| KR | 1020110084888 A | 7/2011 |
| WO | 0054342 A1 | 9/2000 |
| WO | 2005099310 A2 | 10/2005 |
| WO | 2011123285 | 10/2011 |
| WO | 2015099944 A1 | 7/2015 |

OTHER PUBLICATIONS

Bower, C.A., et al., "Active-Matrix OLEO Display Backplanes Using Transfer-Printed Microscale Integrated Circuits", iEEE, 201 O Electronic Components and Technology Conference, pQs. 1339-1343.

"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, 8-12, Oct, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. @ 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping For Next Generation Semiconductor Devices" Apr. 21, 1999, 4 pgs.

Dixon, et al., "(Ai,Ga)As Double-Heterostructure Lasers: Comparison of Devices Fabricated with Deep and Shallow Proton Bombardment," American Telephone and Telegraph Company, The Bell System Technical Journal, vol. 49, No. 6, Jul.-Aug. 1980, pp. 975-985.

Dai et al, "On the symmetry of efficiency-versus-carrier-concentration curves in GaInN/GaN light-emitting diodes and relation to droop-causing mechanisms" American Institute of Physics, Applied Physics Letters 94, 033506, Jan. 20, 2011, 3 pgs.

Keeping, Steven, "Identifying the Causes of LED Efficiency Droop" Electronic Products Web. http://www.digikey.com/us/en/techzone/lighting/resources/articles/identifying-the-causes-of-led-efficiency-droop.html, accessed Nov. 19, 2013, 3 pgs.

Naone et al., "Interdiffused Quantum Wells for Lateral Carrier Confinement in VCSEL's" IEEE Journal Of Selected Topics In Quantum Electronics, vol. 4, No. 4, Jul./Aug. 1998, pp. 706-714.

(56) References Cited

OTHER PUBLICATIONS

Ohtoshi, et al., "Analysis of Current Leakage in InGaAsP /InP Buried Heterostructure Lasers" IEEE Journal Of Quantum Electronics. vol. 25. No. 6. Jun. 1989, pp. 1369-1375.
Sarzala, et al., "An impact of a localization of an oxide aperture within a vertical-cavity surface-emitting diode laser (VCSEL) cavity on its lasing threshold" Optica Applicata, vol. XXXV, No. 3, 2005, pp. 635-644.
Unold, et al., "Single-Mode VCSELs" Proceedings of SPIE, vol. 4649, 2002, pp. 218-229.
PCT International Search Report and Written Opinion for International Application No. PCT/US2014/067501, dated Feb. 18, 2015, 10 pages.
Vurgaftman, et al., "Band parameters for III-V compound semiconductors and their alloys," J. Appl. Phys. 89, 5815 (2001), pp. 5829 and 5851.
PCT International Preliminary Report on Patentability for International Application No. PCT/US2014/067501, dated Jul. 7, 2016, 6 pages.
Merriam-Webster Online definition of "protrude." No Date.

\* cited by examiner

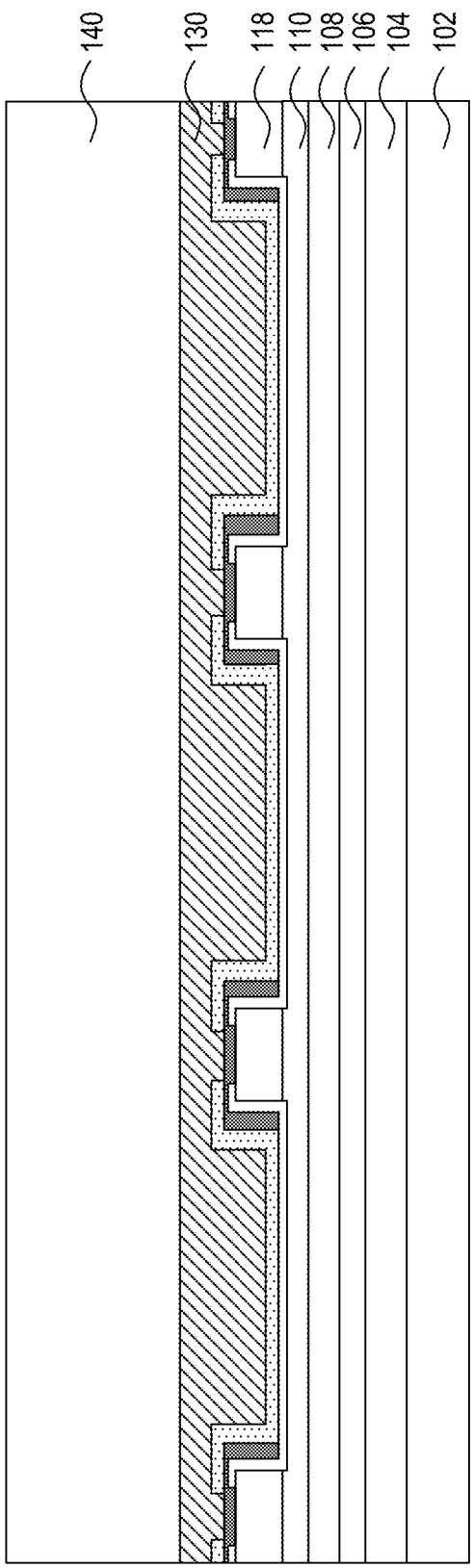
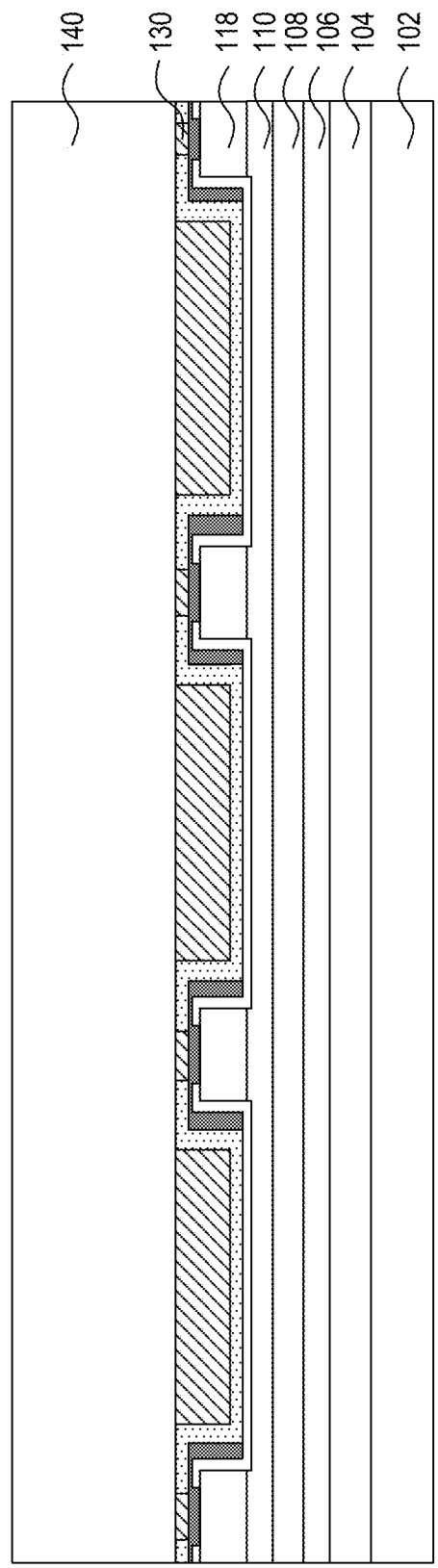

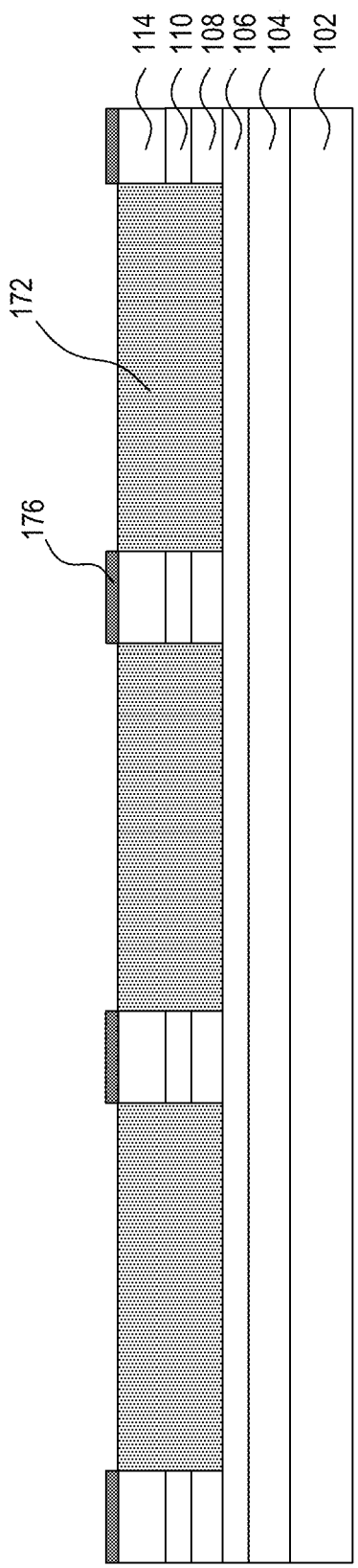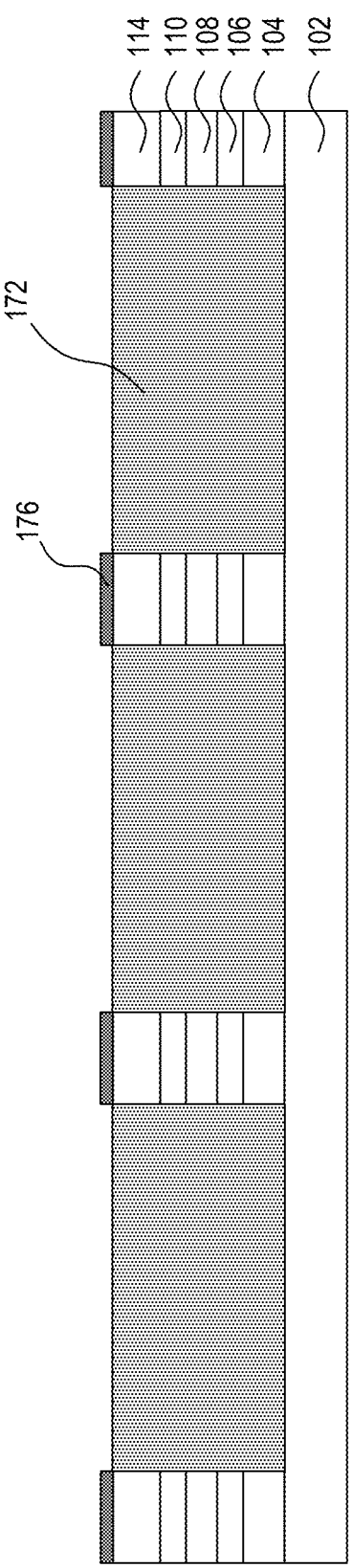

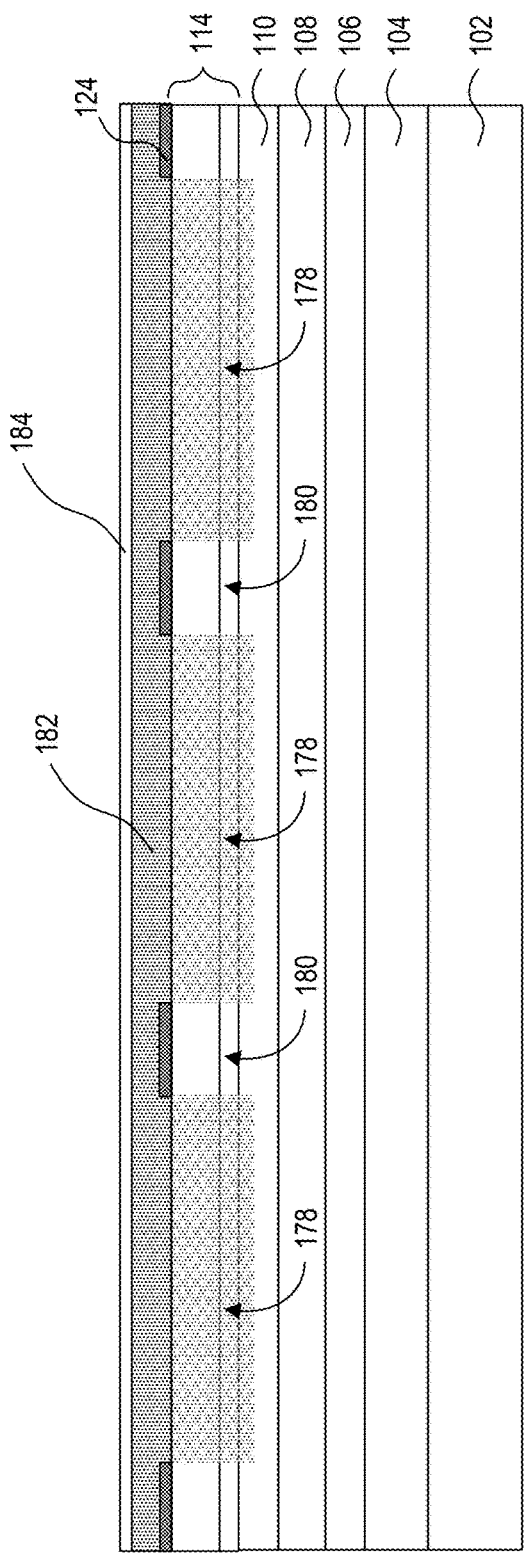
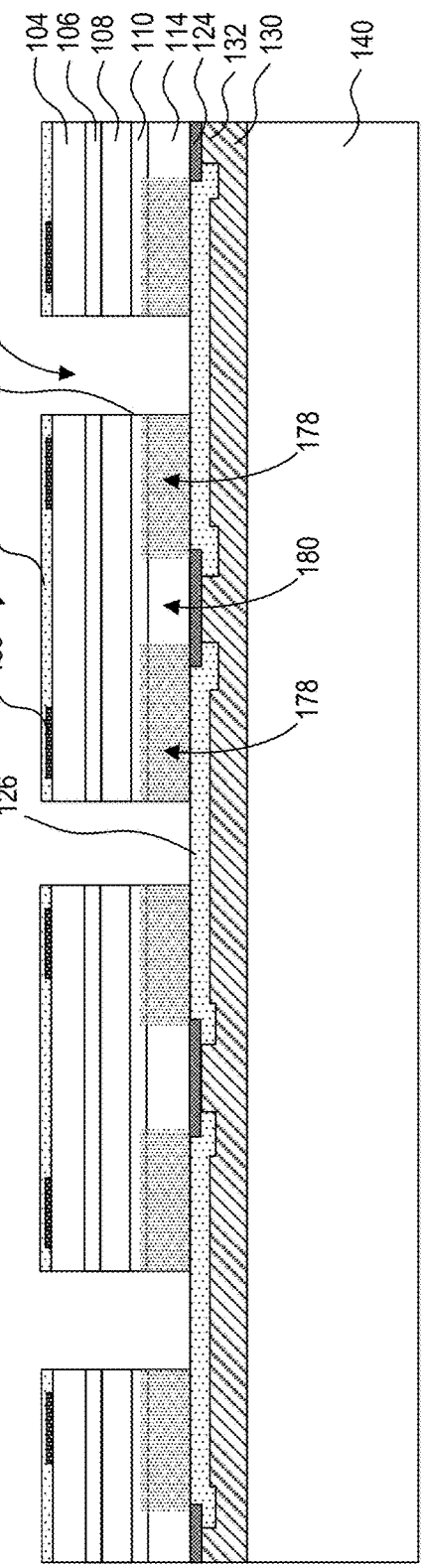

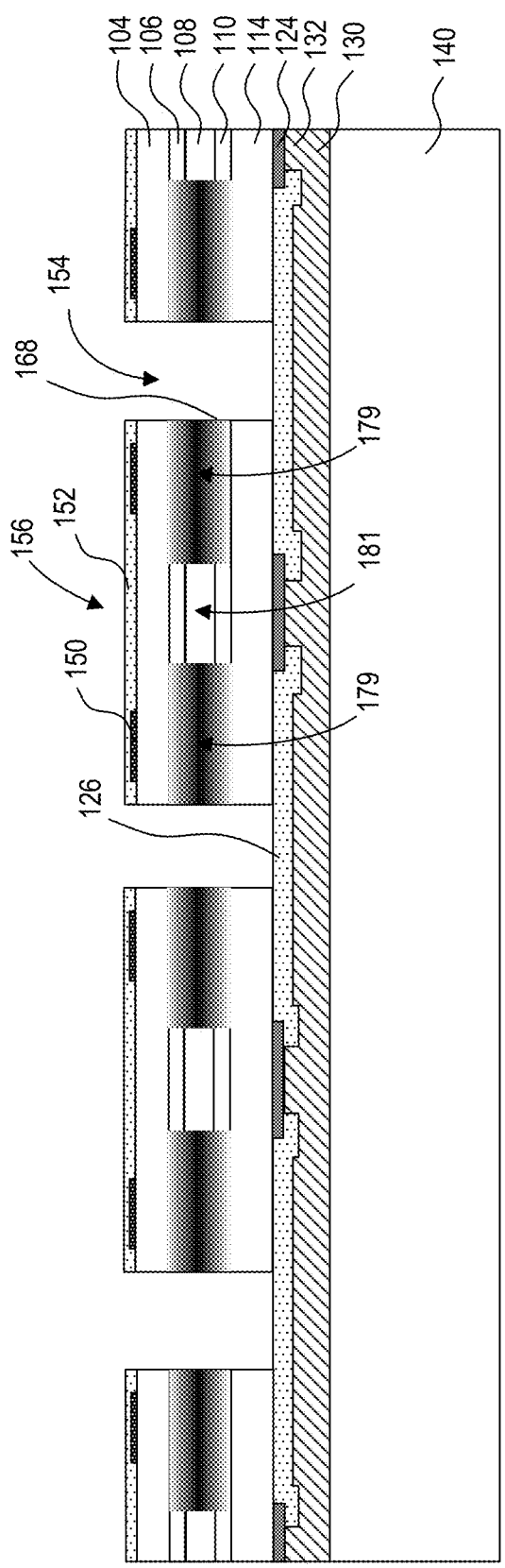
FIG. 26A
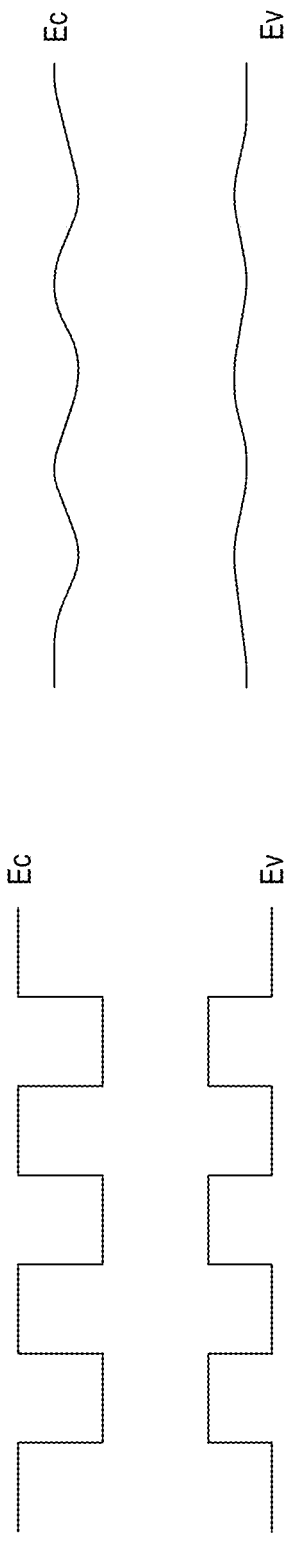
FIG. 26B
FIG. 26C

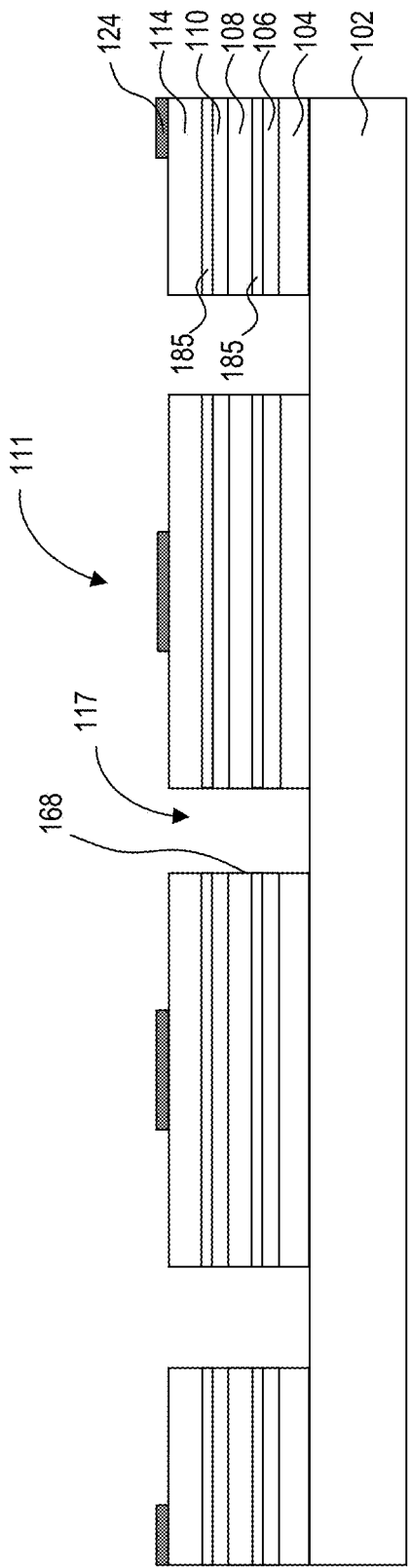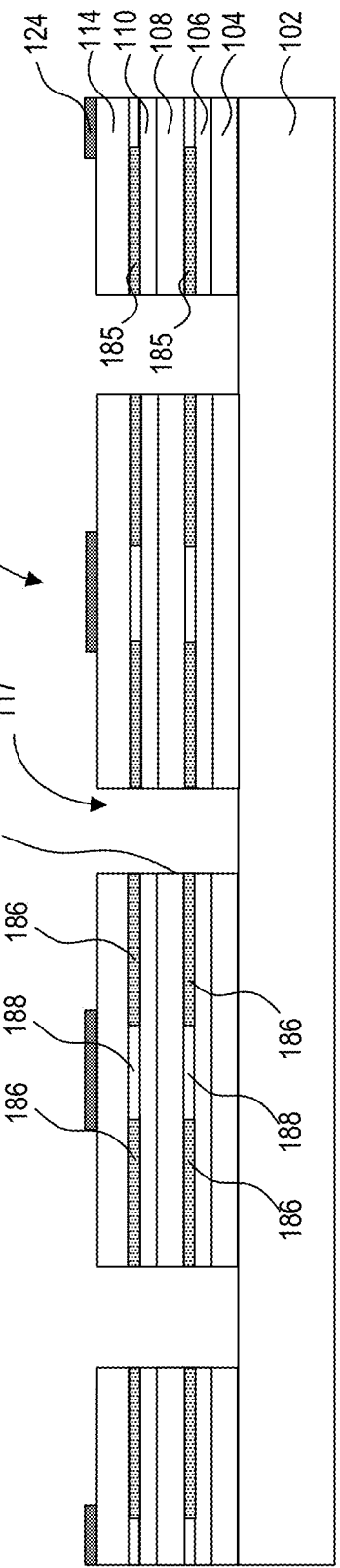

LED WITH INTERNALLY CONFINED CURRENT INJECTION AREA

RELATED APPLICATIONS

This application is a continuation of U.S. patent application Ser. No. 16/783,737, filed Feb. 6, 2020, which is a continuation of U.S. patent application Ser. No. 15/223,900, filed Jul. 29, 2016, now U.S. Pat. No. 10,593,832, which is a divisional of U.S. patent application Ser. No. 14/194,509, filed Feb. 28, 2014, now U.S. Pat. No. 9,450,147, which is a continuation-in-part of U.S. patent application Ser. No. 14/141,735 filed on Dec. 27, 2013, now U.S. Pat. No. 9,583,466. The full disclosures of U.S. patent application Ser. No. 14/194,509 and U.S. patent application Ser. No. 14/141,735 are incorporated herein by reference.

BACKGROUND

Field

The present invention relates to light emitting diode (LED) devices. More particularly, embodiments of the invention relate to LED devices with a confined current injection area.

Background Information

Light emitting diodes (LEDs) are increasingly being considered as a replacement technology for existing light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

One type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as cell phones and digital cameras.

Another type of LED is a semiconductor-based LED in which the emissive layer of the diode includes one or more semiconductor-based quantum well layers sandwiched between thicker semiconductor-based cladding layers. Some advantages of semiconductor-based LEDs compared to OLEDs can include increased efficiency and longer lifespan. High luminous efficacy, expressed in lumens per watt (lm/W), is one of the main advantages of semiconductor-based LED lighting, allowing lower energy or power usage compared to other light sources. Luminance (brightness) is the amount of light emitted per unit area of the light source in a given direction and is measured in candela per square meter ($cd/m^2$) and is also commonly referred to as a Nit (nt). Luminance increases with increasing operating current, yet the luminous efficacy is dependent on the current density ($A/cm^2$), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. External quantum efficiency (EQE) is defined as the number of photons emitted divided by the number of electrons injected. EQE is a function of IQE and the light extraction efficiency of the LED device. At low operating current density (also called injection current density, or forward current density) the IQE and EQE of an LED device initially increases as operating current density is increased, then begins to tail off as the operating current density is increased in the phenomenon known as the efficiency droop. At low current density the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a low value, typically between 1.0 and 10 $A/cm^2$.

Semiconductor-based LEDs are commonly found in a variety of applications, including low-power LEDs used as indicators and signage, medium-power LEDs such as for light panels and automotive tail lights, and high-power LEDs such as for solid-state lighting and liquid crystal display (LCD) backlighting. In one application, high-powered semiconductor-based LED lighting devices may commonly operate at 400-1,500 mA, and may exhibit a luminance of greater than 1,000,000 $cd/m^2$. High-powered semiconductor-based LED lighting devices typically operate at current densities well to the right of peak efficiency on the efficiency curve characteristic of the LED device. Low-powered semiconductor-based LED indicator and signage applications often exhibit a luminance of approximately 100 $cd/m^2$ at operating currents of approximately 20-100 mA. Low-powered semiconductor-based LED lighting devices typically operate at current densities at or to the right of the peak efficiency on the efficiency curve characteristic of the LED device. To provide increased light emission, LED die sizes have been increased, with a 1 $mm^2$ die becoming a fairly common size. Larger LED die sizes can result in reduced current density, which in turn may allow for use of higher currents from hundreds of mA to more than an ampere, thereby lessening the effect of the efficiency droop associated with the LED die at these higher currents.

Thus, the trend in current state-of-the art semiconductor-based LEDs is to increase both the operating current as well as LED size in order to increase efficiency of LEDs since increasing the LED size results in decreased current density and less efficiency droop. At the moment, commercial semiconductor-based LEDs do not get much smaller than 1 $mm^2$.

SUMMARY

Embodiments of the invention describe LED devices with a confined current injection area. In an embodiment, an LED device includes an active layer between a first current spreading layer pillar and a second current spreading layer. The first current spreading layer pillar is doped with a first dopant type and the second current spreading layer is doped with a second dopant type opposite the first dopant type. A first cladding layer is between the first current spreading layer pillar and the active layer, and a second cladding layer is between the second current spreading layer and the active layer. The first current spreading layer pillar protrudes away from the first cladding layer, and the first cladding layer is wider than the first current spreading layer pillar. In an embodiment, the first current spreading layer pillar is doped with a p-dopant. In an embodiment, the first current spreading layer pillar comprises GaP, and the first cladding layer includes a material such as AlInP, AlGaInP, or AlGaAs. In an embodiment, the active layer includes less than 10 quantum well layers. In an embodiment the active layer includes a single quantum well layer, and does not include multiple quantum well layers. In an embodiment, the active layer of the LED device has a maximum width of 100 μm or less, and the first current spreading layer pillar has a maximum width of 10 μm or less. In an embodiment the active layer of the LED device has a maximum width of 20 μm or less, and the first current spreading layer pillar has a maximum width of 10 μm or less. In an embodiment, the second current spreading layer is wider than the first current spreading layer pillar.

A passivation layer may span along a surface of the first cladding layer and sidewalls of the first current spreading layer pillar. In an embodiment, an opening is formed in the passivation layer on a surface of the first current spreading layer pillar opposite the first cladding layer. A conductive contact can then be formed within the opening in the passivation layer and in electrical contact with the first current spreading layer pillar without being in direct electrical contact with the first cladding layer.

In an embodiment, the LED device is supported by a post, and a surface area of the top surface of the post is less than the surface area of a bottom surface of the first current spreading layer pillar. In such a configuration, the LED device may be on a carrier substrate. In an embodiment, the LED device is bonded to a display substrate within a display area of the display substrate. For example, the LED device may be bonded to the display substrate and in electric connection with working circuitry within the display substrate, or the LED device may be bonded to a display substrate and in electrical connection with a micro chip also bonded to the display substrate within the display area. In an embodiment, the LED device is incorporated within a display area of a portable electronic device.

In an embodiment, a method of forming an LED device includes patterning a p-n diode layer of an LED substrate to form an array of current spreading layer pillars separated by an array of confinement trenches in a current spreading layer of the p-n diode layer, where the confinement trenches extend through the current spreading layer and expose a cladding layer of the p-n diode layer underneath the current spreading layer. A sacrificial release layer is formed over the array of current spreading layer pillars and the cladding layer. The LED substrate is bonded to a carrier substrate, and a handle substrate is removed from the LED substrate. The p-n diode layer is patterned laterally between the array of current spreading layer pillars to form an array of LED devices, with each LED device including a current spreading layer pillar of the array of current spreading layer pillars. Patterning of the p-n diode layer may include etching through a top current spreading layer, a top cladding layer, one or more quantum well layers, and the cladding layer (e.g. bottom cladding layer) to expose the sacrificial release layer.

An array of bottom electrically conductive contacts may be formed on and in electrical contact with the array of current spreading layer pillars prior to forming the sacrificial release layer over the array of current spreading layer pillars and the cladding layer. The sacrificial release layer may additionally be patterned to form an array of openings in the sacrificial release layer over the array of current spreading layer pillars prior to bonding the LED substrate to the carrier substrate. In such an embodiment, the LED substrate is bonded to the carrier substrate with a bonding material that is located within the array of openings in the sacrificial release layer. Upon forming the array of LED devices, the sacrificial release layer may be removed, and a portion of the array of LED devices is transferred from the carrier substrate to a receiving substrate, for example a display substrate, using an electrostatic transfer head assembly.

In an embodiment, a method of operating a display includes sending a control signal to a driving transistor, and driving a current through an LED device including a confined current injection area in response to the control signal, where the LED device includes a current spreading layer pillar that protrudes away from a cladding layer and the cladding layer is wider than the current spreading layer pillar. For example, the display is a portable electronic device. LED devices in accordance with embodiments of the invention may be driven at injection currents and current densities well below the normal or designed operating conditions for standard LEDs. In an embodiment, the current driven through the LED device is from 1 nA-400 nA. In an embodiment the current is from 1 nA-30 nA. In such an embodiment, the current density flowing the LED device may be from 0.001 A/cm$^2$ to 3 A/cm$^2$. In an embodiment the current is from 200 nA-400 nA. In such an embodiment, the current density flowing the LED device may be from 0.2 A/cm$^2$ to 4 A/cm$^2$. In an embodiment the current is from 100 nA-300 nA. In such an embodiment, the current density flowing the LED device may be from 0.01 A/cm$^2$ to 30 A/cm$^2$.

In an embodiment, an LED device includes an active layer between a first current spreading layer and a second current spreading layer, where the first current spreading layer is doped with a first dopant type and the second current spreading layer is doped with a second dopant type opposite the first dopant type. A first cladding layer is between the first current spreading layer and the active layer, and a second cladding layer is between the second current spreading layer and the active layer. A current confinement region laterally surrounds a current injection region to confine current that flows through the active layer to an interior portion of the LED device and away from sidewalls of the LED device. In an embodiment the LED device does not include a distributed Bragg reflector layer on each side of the active layer. The LED device may be a micro LED device, for example, having a maximum width of 300 μm or less, 100 μm or less, 20 μm or less, or even smaller sizes. The current injection region that confines current that flows through the active layer to an interior portion of the LED device and away from sidewalls of the LED device may have a maximum width less than the LED device, for example, 10 μm or less.

In some configurations the LED device is supported by a post and a sacrificial release layer spans directly beneath the LED device. For example, such a configuration may be on a carrier substrate prior to transferring to a receiving substrate such as a display substrate. In other configurations the LED device is incorporated within a display area of a portable electronic device. In an embodiment the LED device is bonded to a display substrate within a display area of the display substrate and the LED device is in electrical connection with a subpixel driver circuit in the display substrate or a micro chip that is also bonded to the display substrate within the display area where the micro chip includes a subpixel driver circuit for driving the LED device.

A variety of configurations are possible for confining current that flows through the active layer to an interior portion of the LED device and away from sidewalls of the LED device. In an embodiment, the current injection region includes a pillar structure that includes the first current spreading layer, the first cladding layer, and the active layer, and the current confinement region includes a confinement barrier fill that laterally surrounds the pillar structure. The confinement barrier fill may have a larger bandgap than one or more quantum well layers in the active layer. The electrical path through the confinement barrier fill may be characterized by a higher resistance than the electrical path through the pillar structure. For example, the confinement barrier fill may include a material characterized by a higher resistivity than the materials forming the pillar structure, or the confinement barrier fill may include a junction, such as a p-n-p junction. The confinement barrier fill may include multiple layers, for example, a buffer layer and a barrier layer or multiple layers forming a p-n-p junction.

In an embodiment, the current injection region is located within the first current spreading layer and the current confinement region includes a modified confinement barrier region within the first current spreading layer that laterally surrounds the current injection region. For example the modified confinement barrier region may be characterized by a higher resistivity than the current injection region. The modified confinement barrier region may also be doped with a dopant type opposite of the dopant type of the first current spreading layer in the pillar structure. For example, the confinement barrier region within the first current spreading layer may be n-type where the first current spreading layer in the pillar structure is p-type.

In an embodiment, the current injection region is located within the active layer and the current confinement region includes a modified barrier region within the active layer that laterally surrounds the current injection region. The modified confinement barrier region may be characterized by a larger bandgap than the current injection region, for example, by quantum well intermixing in the modified confinement barrier region.

In an embodiment, the current injection region includes a first current injection region located within a first laterally oxidized confinement layer, and the current confinement region includes a first oxidized region of the first laterally oxidized confinement layer that laterally surrounds the first current injection region. The current injection region may additionally include a second current injection region located within a second laterally oxidized confinement layer, and the current confinement region includes a second oxidized region of the second laterally oxidized confinement layer that laterally surrounds the second current injection region. In an embodiment, the one or more laterally oxidized confinement layers may be characterized by higher aluminum concentration than other layers within the LED device, such as the first and second current spreading layers, the first and second cladding layers, and the active layer.

BRIEF DESCRIPTION OF THE DRAWINGS

FIGS. 7A-7B are cross-sectional side view illustrations of a patterned bulk LED substrate bonded to a carrier substrate with a stabilization layer in accordance with embodiments of the invention.

FIGS. 16A-16B are cross-sectional side view illustrations of a confinement barrier fill within the mesa regrowth trenches of FIGS. 15A-15B, respectively, in accordance with embodiments of the invention.

FIG. 24 is a cross-sectional side view illustration of forming a modified confinement barrier region within a current distribution layer by diffusion in accordance with an embodiment of the invention.

FIG. 25 is a cross-sectional side view illustration of an LED device with a modified confinement barrier region within a current distribution layer in accordance with an embodiment of the invention.

FIG. 26A is a cross-sectional side view illustration of an LED device with quantum well intermixing in accordance with an embodiment of the invention.

FIG. 26B is a schematic bandgap diagram of an active layer including three quantum wells prior to quantum well intermixing in accordance with an embodiment of the invention.

FIG. 26C is a schematic bandgap diagram of the active layer of FIG. 26A after quantum well intermixing in accordance with an embodiment of the invention.

FIGS. 29-32 are cross-sectional side view illustrations of a two-sided process for forming an array of LED devices including an oxidized cladding layer and sidewall passivation layer in accordance with an embodiment of the invention.

DETAILED DESCRIPTION OF THE INVENTION

Figure 1:
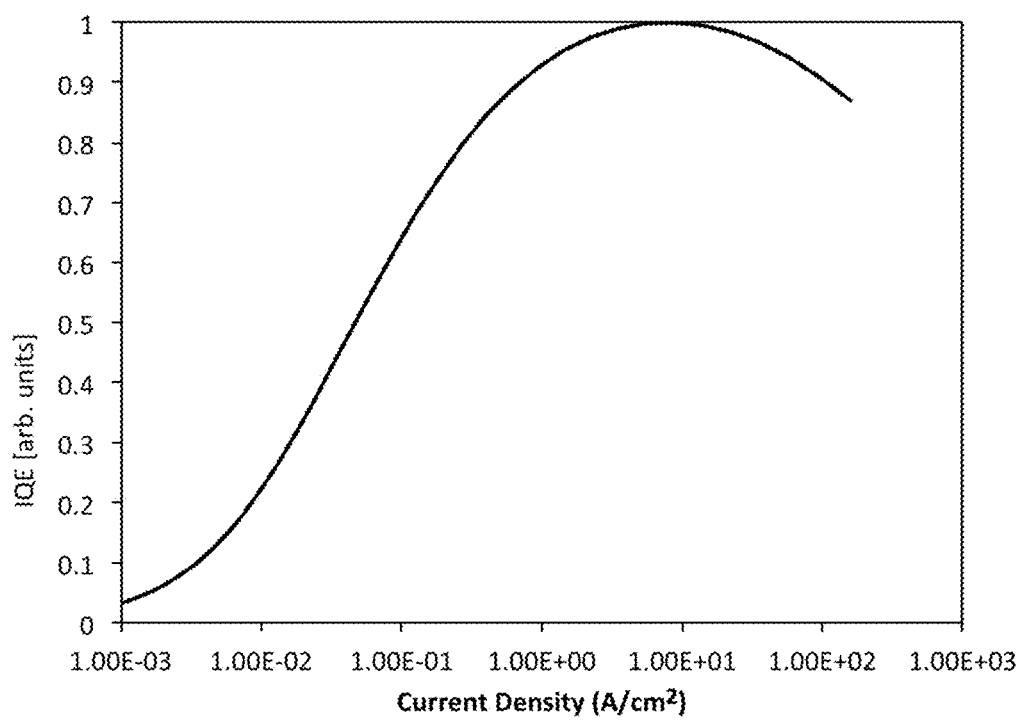
FIG. 1 is a graphical illustration of the relationship of internal quantum efficiency to current density for an LED device in accordance with embodiments of the invention.

Embodiments of the present invention describe LED devices and manners of forming LED devices with a confined current injection area. In particular, some embodiments of the present invention may relate to micro LED devices and manners of forming micro LED devices with a confined current injection area.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning," "over" or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments of the invention describe an LED device integration design in which an LED device is transferred from a carrier substrate and bonded to a receiving substrate using an electrostatic transfer head assembly. In accordance with embodiments of the present invention, a pull-in voltage is applied to an electrostatic transfer head in order to generate a grip pressure on an LED device. It has been observed that it can be difficult to impossible to generate sufficient grip pressure to pick up micro devices with vacuum chucking equipment when micro device sizes are reduced below a specific critical dimension of the vacuum chucking equipment, such as approximately 300 μm or less, or more specifically approximately 100 μm or less.

Furthermore, electrostatic transfer heads in accordance with embodiments of the invention can be used to create grip pressures much larger than the 1 atm of pressure associated with vacuum chucking equipment. For example, grip pressures of 2 atm or greater, or even 20 atm or greater may be used in accordance with embodiments of the invention. Accordingly, in one aspect, embodiments of the invention provide the ability to transfer and integrate micro LED devices into applications in which integration is not possible with current vacuum chucking equipment. In some embodiments, the term "micro" LED device or structure as used herein may refer to the descriptive size, e.g. length or width, of certain devices or structures. In some embodiments, "micro" LED devices or structures may be on the scale of 1 μm to approximately 300 μm, or 100 μm or less in many applications. However, it is to be appreciated that embodiments of the present invention are not necessarily so limited, and that certain aspects of the embodiments may be applicable to larger micro LED devices or structures, and possibly smaller size scales.

In one aspect, embodiments of the invention describe LED devices that are poised for pick up and supported by one or more stabilization posts. In accordance with embodiments of the present invention, a pull-in voltage is applied to a transfer head in order to generate a grip pressure on an LED device and pick up the LED device. In accordance with embodiments of the invention, the minimum amount pick up pressure required to pick up an LED device from a stabilization post can be determined by the adhesion strength between the adhesive bonding material from which the stabilization posts are formed and the LED device (or any intermediate layer), as well as the contact area between the top surface of the stabilization post and the LED device. For example, adhesion strength which must be overcome to pick up an LED device is related to the minimum pick up pressure generated by a transfer head as provided in equation (1):

$$P_1 A_1 = P_2 A_2 \quad (1)$$

where $P_1$ is the minimum grip pressure required to be generated by a transfer head, $A_1$ is the contact area between a transfer head contact surface and LED device contact surface, $A_2$ is the contact area on a top surface of a stabilization post, and $P_2$ is the adhesion strength on the top surface of a stabilization post. In an embodiment, a grip pressure of greater than 1 atmosphere is generated by a transfer head. For example, each transfer head may generate a grip pressure of 2 atmospheres or greater, or even 20 atmospheres or greater without shorting due to dielectric breakdown of the transfer heads. Due to the smaller area, a higher pressure is realized at the top surface of the corresponding stabilization post than the grip pressure generate by a transfer head.

In another aspect, embodiments of the invention describe LED devices, which may be micro LED devices, including a confined current injection area. In an embodiment, an LED device includes a first (e.g. bottom) current spreading layer pillar doped with a first dopant type, a first (e.g. bottom) cladding layer on the bottom current spreading layer, an active layer on the bottom cladding layer, a second (e.g. top) cladding layer on the active layer, and a second (e.g. top) current spreading layer doped with a second dopant type opposite the first dopant type. The bottom current spreading layer pillar protrudes away from the bottom cladding layer, in which the bottom cladding layer is wider than the bottom current spreading layer pillar. In accordance with embodiments of the invention, the active layer is also wider than the bottom current spreading layer pillar. The top cladding layer and top current spreading layer may also be wider than the bottom current spreading layer pillar. In this manner, when a potential is applied across the top current spreading layer and bottom current spreading layer pillar, the current injection area within the active layer is modified by the relationship of the areas of the bottom current spreading layer pillar and top current spreading layer. In operation, the current injection area is reduced as the area of the bottom current spreading layer pillar configuration is reduced. In this manner, the current injection area can be confined internally within the active layer away from external or side surfaces of the active layer.

In other embodiments a current confinement region laterally surrounds a current injection region to confine current that flows through the active layer to an interior portion of the LED device and away from sidewalls of the LED device. A variety of configurations are possible including mesa regrowth techniques, dopant or proton modification of a current distribution layer or cladding layer, quantum well intermixing, and lateral oxidation of a confinement layer. In addition, many of the several current confinement configurations described herein may be combined within a single LED device.

In addition, it is possible to design an LED device in which a top surface area of the top surface of the p-n diode layer is larger than a surface area of the current confinement region within the active layer. This enables larger LED devices to be fabricated, which may be beneficial for transferring the LED devices using an electrostatic transfer head assembly, while also providing a structure in which the confined current injection area results in an increased current density and increased efficiency of the LED device, particularly when operating at injection currents and injection current densities below or near the pre-droop region of the LED device internal quantum efficiency curve.

In another aspect, it has been observed that non-radiative recombination may occur along exterior surfaces of the active layer (e.g. along sidewalls of the LED devices). It is believed that such non-radiative recombination may be the result of defects, for example, that may be the result of forming mesa trenches through the p-n diode layer to form an array of LED devices or a result of surface states from dangling bonds at the terminated surface that can enable current flow and non-radiative recombination. This non-radiative recombination can also be a result of band bending at the surface leading to a density of states were electrons and holes can be confined until they combine non-radiatively. Such non-radiative recombination may have a significant effect on LED device efficiency, particularly at low current densities in the pre-droop region of the IQE curve where the LED device is driven at currents that are unable to saturate the defects. In accordance with embodiments of the invention, the current injection area can be confined internally within the active layer, so that the current does not spread laterally to the exterior or side surfaces of the active layer where a larger amount of defects may be present. As a result, the amount of non-radiative recombination near the exterior or side surfaces of the active layer can be reduced and efficiency of the LED device increased.

The LED devices in accordance with embodiments of the invention are highly efficient at light emission and may consume very little power compared to LCD or OLED display technologies. For example, a conventional display panel may achieve a full white screen luminance of 100-750 cd/m$^2$. It is understood that a luminance of greater than 686 cd/m$^2$ may be required for sunlight readable screens. In accordance with some embodiments of the invention, an LED device may be transferred and bonded to a display backplane such as a thin film transistor (TFT) substrate backplane used for OLED display panels, where the semiconductor-based LED device replaces the organic LED film of the OLED display. In this manner, a highly efficient semiconductor-based LED device replaces a less efficient organic LED film. Furthermore, the width/length of the semiconductor-based LED device may be much less than the allocated subpixel area of the display panel, which is typically filled with the organic LED film. In other embodiments, the LED devices are integrated with a substrate including a plurality of micro chips that replace the working circuitry (e.g. subpixel driver circuits) that are typically formed within a TFT substrate backplane.

LED devices in accordance with embodiments of the invention may operate well below the normal or designed operating conditions for standard LEDs. The LED devices may also be fundamentally different than lasers, and operate at significantly lower currents than lasers. For example, the principle of emission for LED devices in accordance with embodiments of the invention may be spontaneous, non-directional photon emission, compared to stimulated, coherent light that is characteristic of lasers. Lasers typically include distributed Bragg reflector (DBR) layers on opposite sides of the active layer for stimulating coherent light emission, also known as lasing. Lasing is not necessary for operation of LED devices in accordance with embodiments of the invention. As a result, the LED devices may be thinner than typical lasers, and do not require reflector layers on opposite sides of the active layer for stimulating coherent light emission.

For illustrative purposes, in accordance with embodiments of the invention it is contemplated that the LED devices may be driven using a similar driving circuitry as a conventional OLED display panel, for example a thin film transistor (TFT) backplane. However, embodiments are not so limited. For example, in another embodiment the LED devices are driven by micro chips that are also electrostatically transferred to a receiving substrate. Assuming subpixel operating characteristics of 25 nA injection current, an exemplary LED device having a 1 $\mu m^2$ confined current injection area roughly corresponds to a current density of 2.5 $A/cm^2$, an exemplary LED device having a 25 $\mu m^2$ confined current injection area roughly corresponds to a current density of 0.1 $A/cm^2$, and an exemplary LED device having a 100 $\mu m^2$ confined current injection area roughly corresponds to a current density of 0.025 $A/cm^2$. Referring to FIG. 1, in accordance with embodiments of the invention these low injection currents and current densities may correspond to a pre-droop region of a characteristic efficiency curve. This is well below the normal or designed operating conditions for standard LEDs. Furthermore, in some embodiments, the low injection currents and current densities may correspond to a portion on the pre-droop region of the characteristic efficiency curve for the LED device in which the slope of the curve is greater than 1:1 such that a small increase in current density results in a greater increase in IQE, and hence EQE, of the LED device. Accordingly, in accordance with embodiments of the invention, significant efficiency increases may be obtained by confining the current injection area of the LED device, resulting in increased luminous efficacy and luminance of the LED device. In some embodiments, LED devices with confined current injection areas are implemented into display panel applications designed for target luminance values of approximately 300 Nit for indoor display applications and up to about 2,000 Nit for outdoor display applications. It is to be appreciated that the above examples, including injection currents and display applications are exemplary in nature in order to provide a context for implementing embodiments of the invention, and that embodiments are not so limited and may be used with other operating conditions, and that embodiments are not limited to display applications or TFT backplanes.

Figure 2A:
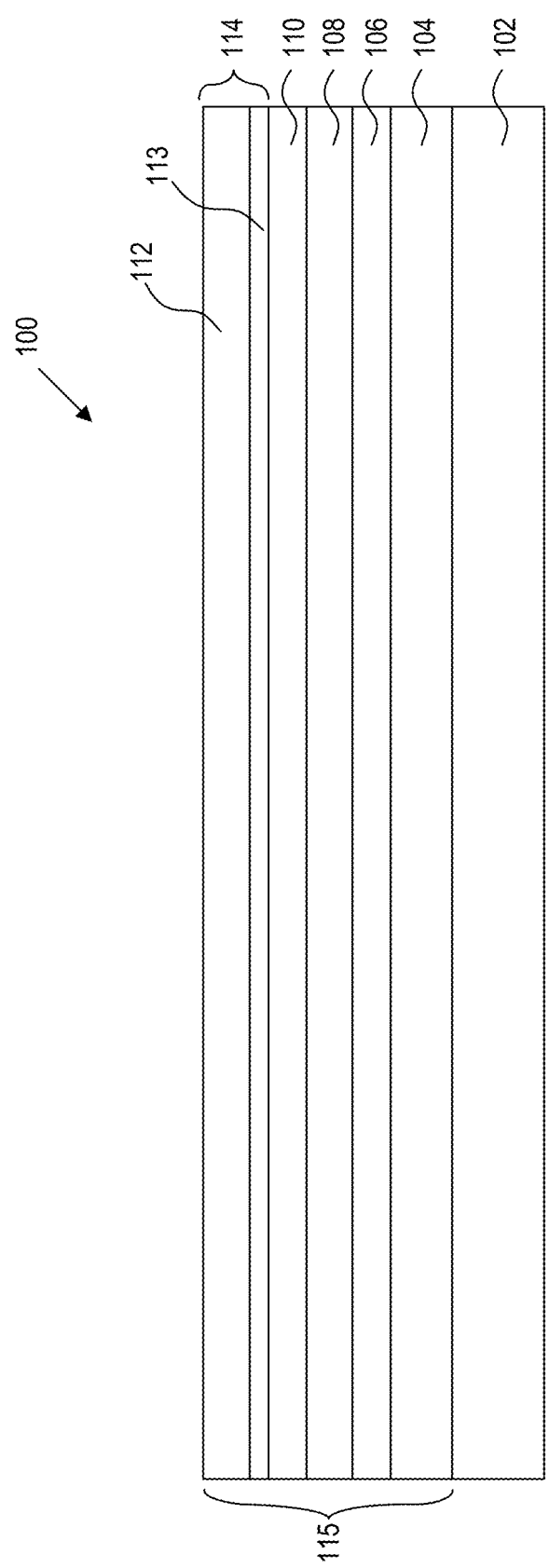
FIG. 2A is a cross-sectional side view illustration of a bulk LED substrate in accordance with an embodiment of the invention.

In the following description exemplary processing sequences are described for forming an array of LED devices, which may be micro LED devices. Referring now to FIG. 2A, a cross-sectional side view illustration is provided of a bulk LED substrate 100 in accordance with an embodiment of the invention. For example, the bulk LED substrate illustrated in FIG. 2A may be designed for emission of primary red light (e.g. 620-750 nm wavelength), primary green light (e.g. 495-570 nm wavelength), or primary blue light (e.g. 450-495 nm wavelength), though embodiments of the invention are not limited to these exemplary emission spectra. In an embodiment, a bulk LED substrate 100 includes a p-n diode layer 115 formed on a growth substrate 102. The p-n diode layer 115 may be formed of a variety of compound semiconductors having a bandgap corresponding to a specific region in the spectrum. For example, the p-n diode layer 115 can include one or more layers based on II-VI materials (e.g. ZnSe) or III-V materials including III-V nitride materials (e.g. GaN, AlN, InN, InGaN, and their alloys) and III-V phosphide materials (e.g. GaP, AlGaInP, and their alloys). The growth substrate 102 may include any suitable substrate such as, but not limited to, silicon, SiC, GaAs, GaN, and sapphire.

Specifically, exemplary primary processing sequences are described for forming an array of red emitting LED devices. While the primary processing sequences are described for red emitting LED devices, it is to be understood that the exemplary processing sequences can be used for LED devices with different emission spectra, and that certain modifications are contemplated, particularly when processing different materials. Additionally, in different materials the shape of the IQE curve may differ, specifically the peak may occur at current densities other than that shown in FIG. 1. In one embodiment, the bulk LED substrate 100 is designed for emission of red light, and growth substrate 102 is formed of GaAs. Growth substrate 102 may optionally be doped. In the embodiment illustrated growth substrate 102 is n-doped, though in alternative embodiments the growth substrate 102 is p-doped. A current spreading layer 104 is formed on the growth substrate 102 with a first dopant type. In an embodiment, the current spreading layer 104 is n-doped GaAs, though other materials and opposite dopant types may be used. As illustrated, a cladding layer 106 is formed over the current spreading layer 104. Cladding layer 106 may function to confine current within the active layer 108, and possess a larger bandgap energy than the active layer. The cladding layer 106 may be doped or undoped. In an embodiment, the cladding layer 106 is formed of a material such as AlInP, AlGaInP, or AlGaAs. Cladding layer 106 may optionally be doped or undoped. Cladding layer 106 may optionally be doped, for example with the same dopant type as current spreading layer 114. For example, doping of cladding layer 106 may improve vertical current injection into the active layer 108.

Figure 2B:
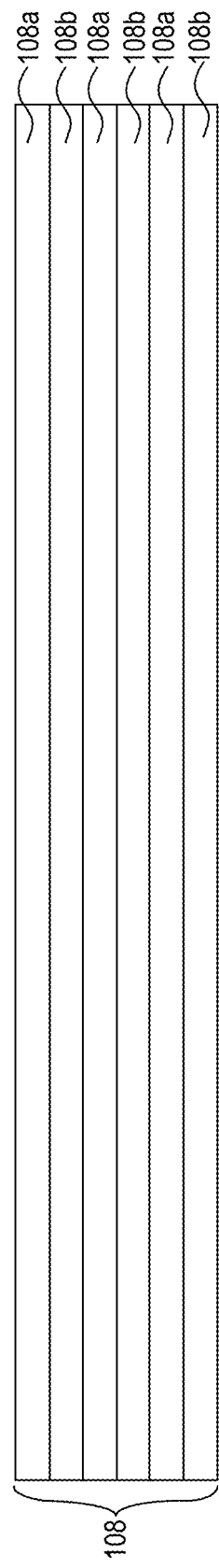
FIG. 2B is a cross-sectional side view illustration of a multiple quantum well configuration in accordance with an embodiment of the invention.

An active layer 108 is formed on the cladding layer 106. The active layer 108 may include a multi-quantum-well (MQW) configuration or a single-quantum-well (SQW) configuration. In accordance with embodiments of the invention, a reduced number of quantum wells may offer more resistance to lateral current spreading, higher carrier density, and aid in confining current internally within the completed LED device. In an embodiment, the active layer 108 includes a SQW. In an embodiment, active layer 108 includes a MQW configuration with less than 10 quantum well layers. Additional layers may also be included in the active layer 108, such as one or more barrier layers. For example, a MQW configuration may include multiple quantum well layers separated by barrier layers. FIG. 2B is an illustration of a MQW configuration including three quantum wells in accordance with an embodiment of the invention. As illustrated the quantum well layers 108a are separated by barrier layers 108b. The material forming quantum well layers 108a have a lower bandgap than the material forming barrier layers 108b in order to trap and confine carriers within the quantum wells. The active layer 108 may be formed of materials such as $(Al_xGa_{1-x})_yIn_{1-y}P$ ($0 \le x \le 1$, $0 \le y \le 1$), AlGaAs, InGaP, or other suitable materials. For example, the quantum well layers 108a and barrier layers 108b may be formed of $(Al_xGa_{1-x})_yIn_{1-y}P$ ($0 \le x \le 1$, $0 \le y \le 1$) with different x and/or y values to achieve desired bandgap energies. In accordance with embodiments of the invention, the material(s) forming the active layer 108 have a smaller bandgap energy than both the cladding layers 106, 110 on opposite sides of the active layer 108.

Referring again to FIG. 2A, a cladding layer 110 is formed on the active layer 108, and a current spreading layer 114 is formed on the cladding layer 110. In accordance with embodiments of the invention, the cladding layer 108 material and thickness may be selected to achieve a desired resistivity at the target operating current so that the cladding layer 110 has a higher resistivity than the current spreading layer 114 from which current spreading layer pillars will be formed. In this manner, the cladding layer 110 resists lateral current spreading to a degree so that current is confined internally within the completed LED device. Similarly as cladding layer 106, cladding layer 110 may function to confine electrons and holes within the active layer 108, and possess a larger bandgap energy than the active layer. In an embodiment, current spreading layer 114 is doped with an opposite dopant type than current spreading layer 104. For example, current spreading layer 114 may be p-doped where current spreading layer 104 is n-doped, and vice versa. In an embodiment, current spreading layer 114 is GaP. In an embodiment, current spreading layer 114 is formed of multiple layers. In an embodiment, the current spreading layer 114 includes a top p-doped GaP layer 112 and underlying InGaP etch stop layer 113 on the cladding layer 110. In an embodiment, the cladding layer 110 is formed of a material such as AlInP, AlGaInP, or AlGaAs. The cladding layer 110 may be doped or undoped. Cladding layer 110 may optionally be doped, for example with the same dopant type as current spreading layer 114. In an embodiment, cladding layer 110 has a lower dopant concentration (including no doping) than cladding layer 106 dopant concentration.

In an embodiment, bulk LED substrate 100 includes a 250-500 μm thick growth substrate 102, a 0.1-1.0 μm thick current spreading layer 104, a 0.05-0.5 μm thick cladding layer 106, an active layer 108, a 0.05-5 μm thick cladding layer 110, and a 0.1-1.5 μm thick current spreading layer 114. These thicknesses are exemplary, and embodiments of the invention are not limited to these exemplary thicknesses.

Figure 3:
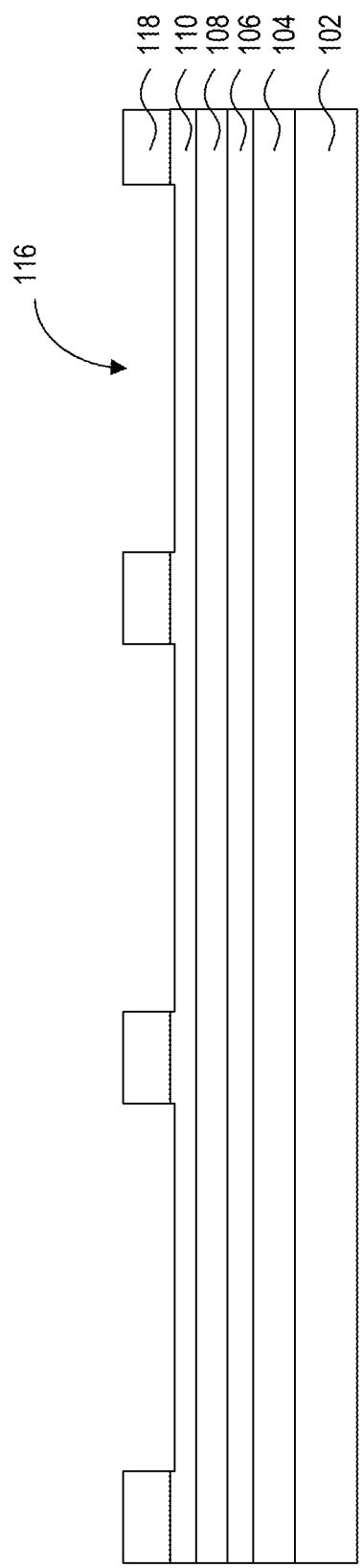
FIG. 3 is a cross-sectional side view illustration of an array of current spreading layer confinement trenches formed through a current spreading layer in accordance with an embodiment of the invention.

Referring now to FIG. 3 an array of current spreading layer confinement trenches 116 are formed through a current spreading layer 114 in accordance with an embodiment of the invention. As shown, the current spreading layer confinement trenches may be etched completely through the current spreading layer 114 forming an array of current spreading layer pillars 118. In an embodiment, etching stops on the cladding layer 110. In another embodiment, cladding layer 110 is partially etched to ensure complete removal of the current spreading layer 114. In accordance with embodiments of the invention, etching is stopped before reaching the active layer 108. Etching may be performed using a suitable technique such as wet etching or dry etching techniques. For example, dry etching techniques such as reactive ion etching (RIE), electro-cyclotron resonance (ECR), inductively coupled plasma reactive ion etching (ICP-RIE), and chemically assisted ion-beam etching (CAIBE) may be used. The etching chemistries may be halogen based, containing species such as $Cl_2$, $BCl_3$, or $SiCl_4$. The etching chemistries may also be wet chemistries containing species such as $Br_2$ or $HIO_4$. In an embodiment, the current spreading layer 114 includes a top p-doped GaP layer 112 and underlying InGaP etch stop layer 113 on the cladding layer 110. In such an embodiment, the top p-doped GaP layer 112 is wet etched using a wet etch chemistry containing $Br_2$ or $HIO_4$, stopping on an etch stop layer 113 formed of InGaP. The etch stop layer 113 may then be removed by wet etching in a solution of $HCl+H_3PO_4$. Alternatively, both the GaP 112 and InGaP 113 layers can be etched using a timed dry etching technique.

As will become more apparent in the following description, the width of the current spreading layer pillars 118 at least partly determines the ability to increase current density within the LED device as well as the ability to confine current internally within the LED devices and away from the external sidewalls where non-radiative recombination may occur. While some lateral current spreading occurs within the device, embodiments of the invention generally refer to the confined current area as the area of the quantum well directly above the current spreading layer pillars 118. Width of the current spreading layer pillars 118 may also be related to width of the LED devices. In some embodiments, current spreading layer pillars 118 have a width between 1 and 10 μm. In an embodiment, current spreading layer pillars 118 have a width or diameter of approximately 2.5 μm.

Figure 4:
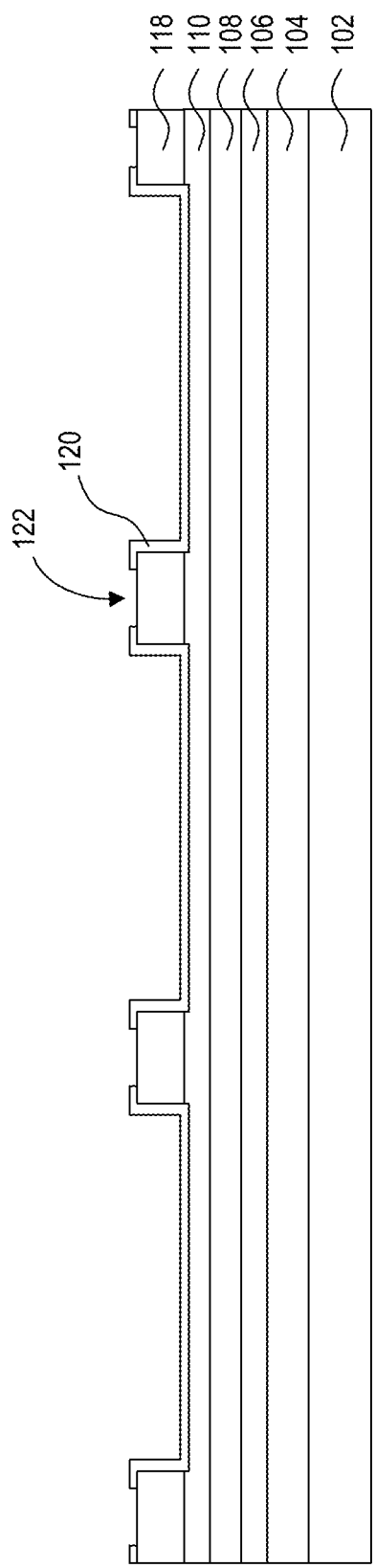
FIG. 4 is a cross-sectional side view illustration of a patterned passivation layer formed over an array of current spreading layer pillars in accordance with an embodiment of the invention.

FIG. 4 is a cross-sectional side view illustration of a patterned passivation layer 120 formed over an array of current spreading layer pillars 118 in accordance with an embodiment of the invention. In an embodiment, a passivation layer 120 is formed of an electrically insulating material such as an oxide or nitride. In an embodiment, passivation layer is approximately 50 angstroms to 3,000 angstroms thick $Al_2O_3$. In an embodiment, passivation layer 120 is formed using a high quality thin film deposition procedure, such as atomic layer deposition (ALD). As will become more apparent in the following description, a high quality thin film deposition procedure may protect the integrity of the passivation layer 120 during the sacrificial release layer etch operation. In an embodiment, passivation layer 120 is approximately 200 angstroms thick $Al_2O_3$ deposited by ALD. Openings 122 may then be formed over the current spreading layer pillars 118 to expose the topmost surface of the current spreading layer pillars using a suitable patterning technique such as lithography and etching. In the embodiment illustrated, patterned passivation layer 120 is formed along sidewalls of current spreading layer pillars 118 and on cladding layer 110. In other embodiments, a passivation layer 120 is not formed.

Figure 5:
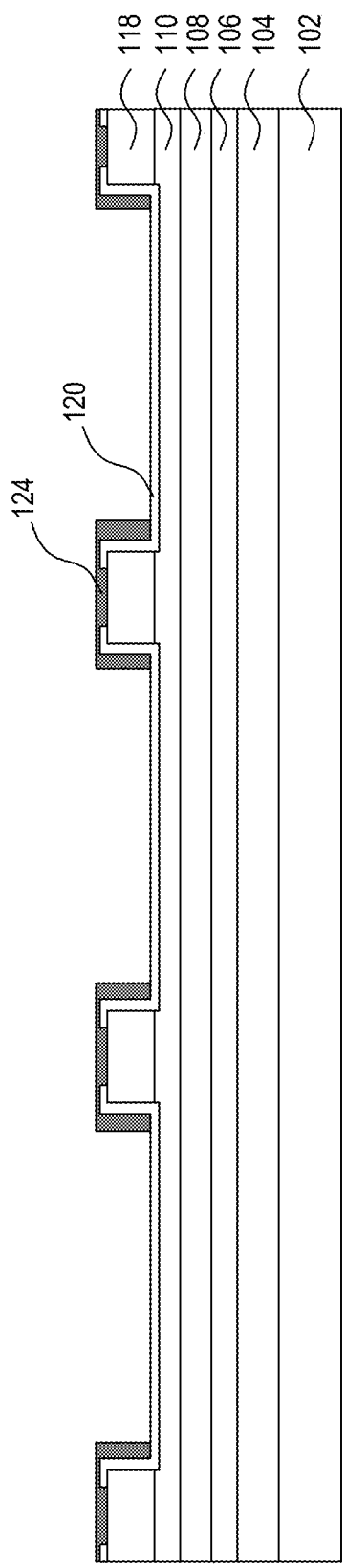
FIG. 5 is a cross-sectional side view illustration of an array of bottom conductive contacts formed over the array of current spreading layer pillars in accordance with an embodiment of the invention.

Referring now to FIG. 5, an array of bottom conductive contacts 124 are formed over the array of current spreading layer pillars 118 in accordance with an embodiment of the invention. Conductive contacts 124 may be formed of a variety of conductive materials including metals, conductive oxides, and conductive polymers. In an embodiment, conductive contacts 124 are formed using a suitable technique such as evaporation or sputtering. In an embodiment, conductive contacts 124 may include BeAu metal alloy, or a metal stack of Au/GeAu/Ni/Au layers. In an embodiment, conductive contacts 124 include a first layer to make ohmic contact with current spreading layer pillars 118, and a second bonding-release layer such as gold to control adhesion with a stabilization layer used to bond to a carrier substrate. Following the formation of the bottom conductive contacts 124, or at least the ohmic layer, the substrate stack may be annealed to make ohmic contact, for example, at 510° C. for 10 minutes. In the embodiment illustrated in FIG. 5, conductive contacts 124 do not completely span between adjacent current spreading layer pillars 118. In an embodiment, conductive contacts 124 span along the sidewalls of the current spreading layer pillars 118 covered by passivation layer 120. In an embodiment, conductive contacts 124 do not span along the sidewalls of the current spreading layer pillars 118.

Figure 6:
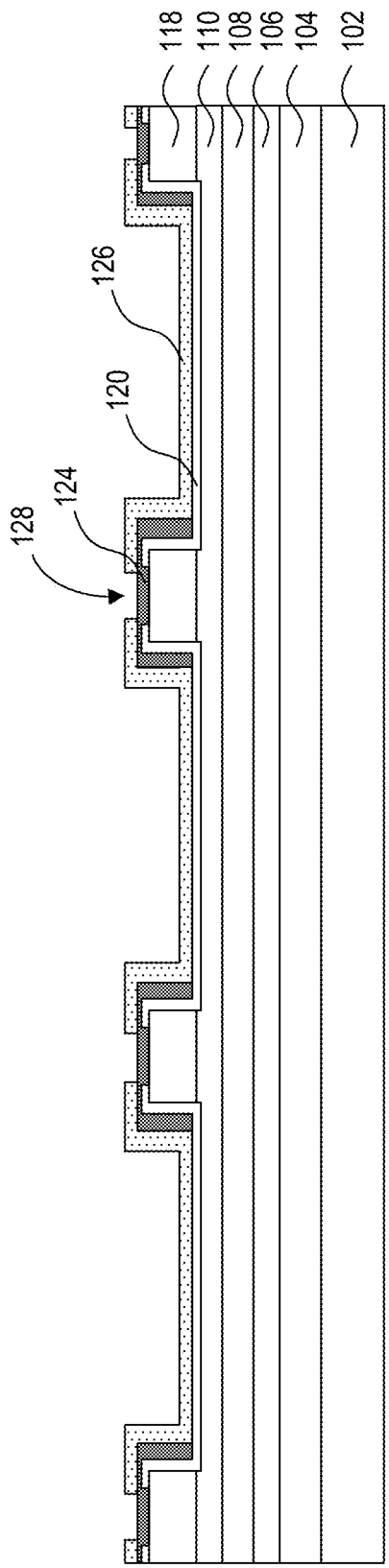
FIG. 6 is a cross-sectional side view illustration of a patterned sacrificial release layer formed over the array of current spreading layer pillars in accordance with an embodiment of the invention.

A sacrificial release layer 126 may then be formed over the array of current spreading layer pillars 118 as illustrated in FIG. 6. In the particular embodiment illustrated, the sacrificial release layer 126 is formed within current confinement trenches 116. In an embodiment, the sacrificial release layer 126 is formed of a material which can be readily and selectively removed with vapor (e.g. vapor HF) or plasma etching. In an embodiment, the sacrificial release layer is formed of an oxide (e.g. $SiO_2$) or nitride (e.g. $SiN_x$), with a thickness of 0.2 μm to 2 μm. In an embodiment, the sacrificial release layer is formed using a comparatively low quality film formation technique compared to the passivation layer 120. In an embodiment, the sacrificial release layer 126 is formed by sputtering, low temperature plasma enhanced chemical vapor deposition (PECVD), or electron beam evaporation.

Still referring to FIG. 6, the sacrificial release layer 126 is patterned to from an array of openings 128 over the array of current spreading layer pillars 118. In an embodiment, each opening 128 exposes an underlying conductive contact 124. As will become more apparent in the following description, the dimensions of the openings 128 in the sacrificial release layer 126 correspond to the dimensions and contact area of the stabilization posts to be formed, and resultantly to the adhesion strength that must be overcome to pick up the array of LED devices that is supported by and poised for pick from the array of stabilization posts. In an embodiment, openings 128 are formed using lithographic techniques and have a length and width of approximately 0.5 μm by 0.5 μm, though the openings may be larger or smaller. In an embodiment, openings 128 have a width (or area) that is less than the width (or area) of the current spreading layer pillars 118.

Referring now to FIGS. 7A-7B, in some embodiments a stabilization layer 130 is formed over the patterned sacrificial release layer 126 and the patterned bulk LED substrate 100 is bonded to a carrier substrate 140. In accordance with embodiments of the invention, stabilization layer 130 may be formed of an adhesive bonding material. In an embodiment the adhesive bonding material is a thermosetting material such as benzocyclobutene (BCB) or epoxy. For example, the thermosetting material may be associated with 10% or less volume shrinkage during curing, or more particularly about 6% or less volume shrinkage during curing so as to not delaminate from the conductive contacts 124 on the LED devices to be formed. In order to increase adhesion the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 130 over the patterned sacrificial release layer 126.

In an embodiment, stabilization layer 130 is spin coated or spray coated over the patterned sacrificial release layer 126, though other application techniques may be used. Following application of the stabilization layer 130, the stabilization layer may be pre-baked to remove the solvents. After pre-baking the stabilization layer 130 the patterned bulk substrate 100 is bonded to the carrier substrate 140 with the stabilization layer 130. In an embodiment, bonding includes curing the stabilization layer 130. Where the stabilization layer 130 is formed of BCB, curing temperatures should not exceed approximately 350° C., which represents the temperature at which BCB begins to degrade. Achieving a 100% full cure of the stabilization layer may not be required in accordance with embodiments of the invention. In an embodiment, stabilization layer 130 is cured to a sufficient curing percentage (e.g. 70% or greater for BCB) at which point the stabilization layer 130 will no longer reflow. Moreover, it has been observed that partially cured BCB may possess sufficient adhesion strengths with carrier substrate 140 and the patterned sacrificial release layer 126. In an embodiment, stabilization layer may be sufficiently cured to sufficiently resist the sacrificial release layer release operation.

In an embodiment, the stabilization layer 130 is thicker than the height of the current spreading layer pillars 118 and openings 128 in the patterned sacrificial release layer 126. In this manner, the thickness of the stabilization layer filling openings 128 will become stabilization posts 132, and the remainder of the thickness of the stabilization layer 130 over the filled openings 128 can function to adhesively bond the patterned bulk LED substrate 100 to a carrier substrate 140.

In the embodiment illustrated in FIG. 7A, after bonding to the carrier substrate 140 a continuous portion of stabilization layer 130 remains over the carrier substrate 140. In an embodiment illustrated in FIG. 7B, the sacrificial release layer 126 (or another intermediate layer) is pressed against the carrier substrate 140 during bonding such that there is not a thickness of the stabilization layer 130 below the stabilization posts 132 to be formed. In such an embodiment, the confinement trenches 116 can function as overflow cavities for the stabilization layer during bonding.

Figure 8:
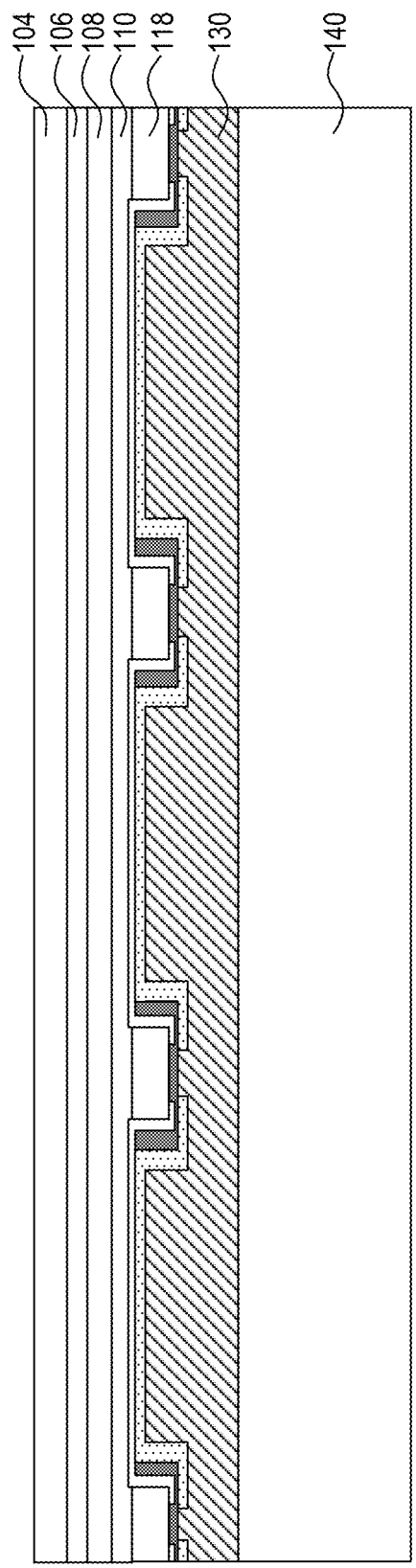
FIG. 8 is a cross-sectional side view illustration of an LED device layer and carrier substrate after removal of a handle substrate in accordance with an embodiment of the invention.

Following bonding of the patterned bulk LED substrate 100 to the carrier substrate 140, the handle substrate 102 is removed as illustrated in FIG. 8. Removal of handle substrate 102 may be accomplished by a variety of methods including laser lift off (LLO), grinding, and etching depending upon the material selection of the growth substrate 102. In the particular embodiment illustrated where handle substrate 102 is a growth substrate formed of GaAs, removal may be accomplished by etching, or a combination of grinding and etching. For example, the GaAs growth substrate 102 can be removed with a $H_2SO_4+H_2O_2$ solution, $NH_4OH+H_2O_2$ solution, or $CH_3OH+Br_2$ chemistry.

Figure 9:
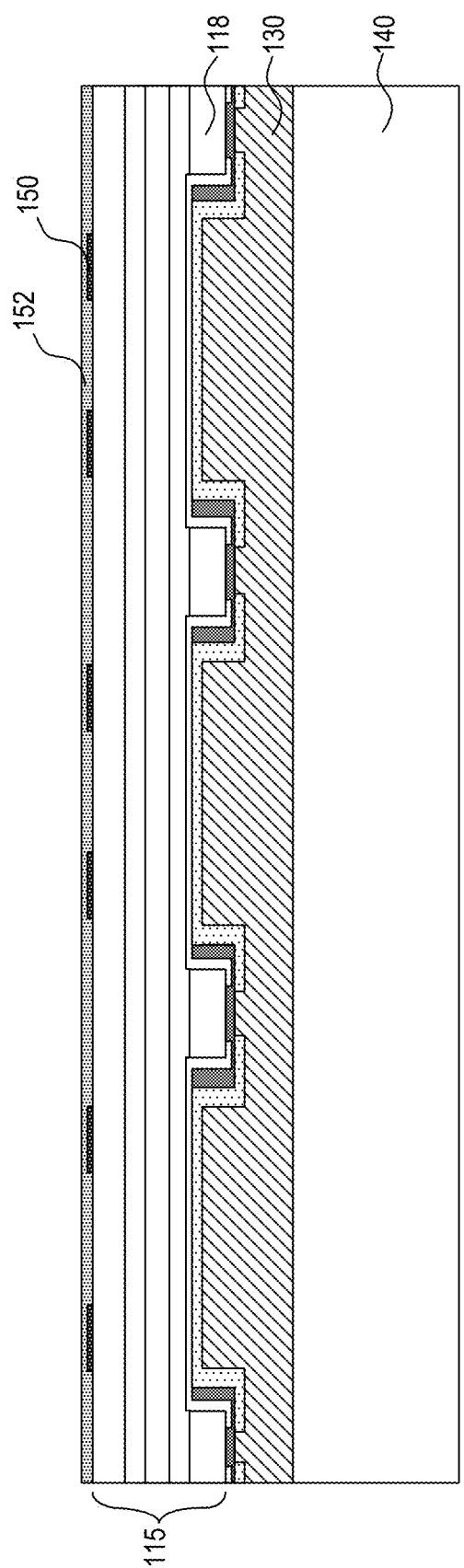
FIG. 9 is a cross-sectional side view illustration of a top conductive contact layer formed over an LED device layer on a carrier substrate in accordance with an embodiment of the invention.

Referring now to FIG. 9, following the removal of the growth substrate 102 a top conductive contact layer 152 may be formed. Top conductive contact layer 152 may be formed of a variety of electrically conductive materials including metals, conductive oxides, and conductive polymers. In an embodiment, conductive contact layer 152 is formed using a suitable technique such as evaporation or sputtering. In an embodiment, conductive contact layer 152 is formed of a transparent electrode material. Conductive contact layer 152 may include BeAu metal alloy, or a metal stack of Au/GeAu/Ni/Au layers. Conductive contact layer 152 may also be a transparent conductive oxide (TCO) such as indium-tin-oxide (ITO). Conductive contact layer 152 can also be a combination of one or more metal layers and a conductive oxide. In an embodiment, conductive contact layer 152 is approximately 300 angstroms thick ITO. In an embodiment, after forming the conductive contact layer 152, the substrate stack is annealed to generate an ohmic contact between the conductive contact layer and the current spreading layer 104. Where the stabilization layer 130 is formed of BCB, the annealing temperature may be below approximately 350° C., at which point BCB degrades. In an embodiment, annealing is performed between 200° C. and 350° C., or more particularly at approximately 320° C. for approximately 10 minutes.

In an embodiment, prior to forming the top conductive contact layer 152 an ohmic contact layer 150 can optionally be formed to make ohmic contact with the current spreading layer 104. In an embodiment, ohmic contact layer 150 may be a metallic layer. In an embodiment, ohmic contact layer 150 is a thin GeAu layer. For example, the ohmic contact layer 150 may be 50 angstroms thick. In the particular embodiment illustrated, the ohmic contact layer 150 is not formed directly over the current spreading layer pillars 118, corresponding to the current confinement area within the LED devices, so as to not reflect light back into the LED device and potentially reduce light emission. In some embodiments, ohmic contact layer 150 forms a ring around the current spreading layer pillars 118.

Figure 10:
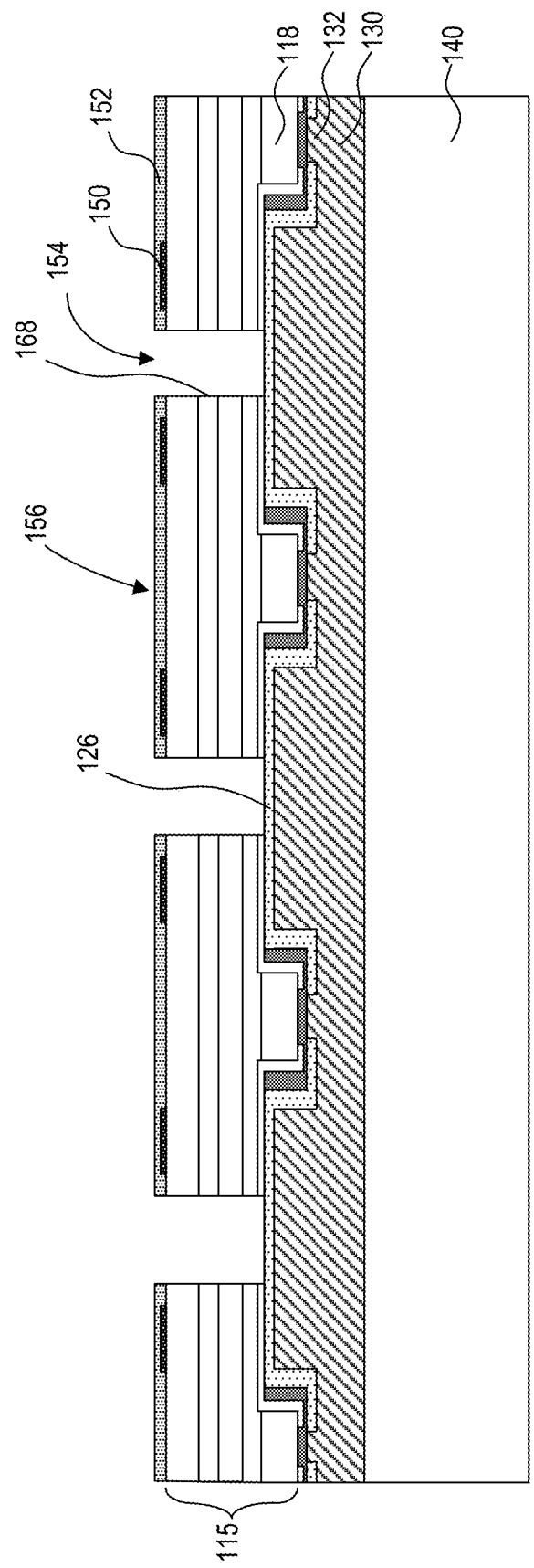
FIG. 10 is a cross-sectional side view illustration of an array of mesa trenches formed in the LED device layer to form an array of LED devices embedded in a sacrificial release layer in accordance with an embodiment of the invention.

Referring now to FIG. 10, an array of mesa trenches 154 is formed in the LED device layer 115 to form an array of LED devices 156 embedded in the sacrificial release layer in accordance with an embodiment of the invention. In the embodiment illustrated, mesa trenches 154 extend through the top conductive contact layer 152 and LED device layer 115 laterally between the array of current spreading layer pillars 118 stopping on the sacrificial release layer to form an array of LED devices 156. As illustrated, each LED device 156 includes mesa structure with sidewalls 168 formed through the device layer 115 and a current spreading layer pillar 118 of the array of current spreading layer pillars. In an embodiment, current spreading layer pillars 118 are centrally located in the middle of the LED devices 156 so as to confine current equally from the sidewalls 168 of the LED devices 156. At this point, the resultant structure is still robust for handling and cleaning operations to prepare the substrate for subsequent sacrificial layer removal and electrostatic pick up. Etching may be performed using a suitable technique such as dry etching. For example, dry etching techniques such as reactive ion etching (RIE), electro-cyclotron resonance (ECR), inductively coupled plasma reactive ion etching (ICP-RIE), and chemically assisted ion-beam etching (CAME) may be used. The etching chemistries may be halogen based, containing species such as $Cl_2$, $BCl_3$, or $SiCl_4$. In an embodiment, etching is continued through passivation layer 120, stopping on the sacrificial release layer 126.

Still referring to FIG. 10, in an embodiment the top conductive contacts 152 on each LED device 156 cover substantially the entire top surface of each LED device 156. In such a configuration, the top conductive contacts 152 cover substantially the maximum available surface area to provide a large, planar surface for contact with the electrostatic transfer head, as described in more detail in FIGS. 15A-15E. This may allow for some alignment tolerance of the electrostatic transfer head assembly.

Figure 11A:
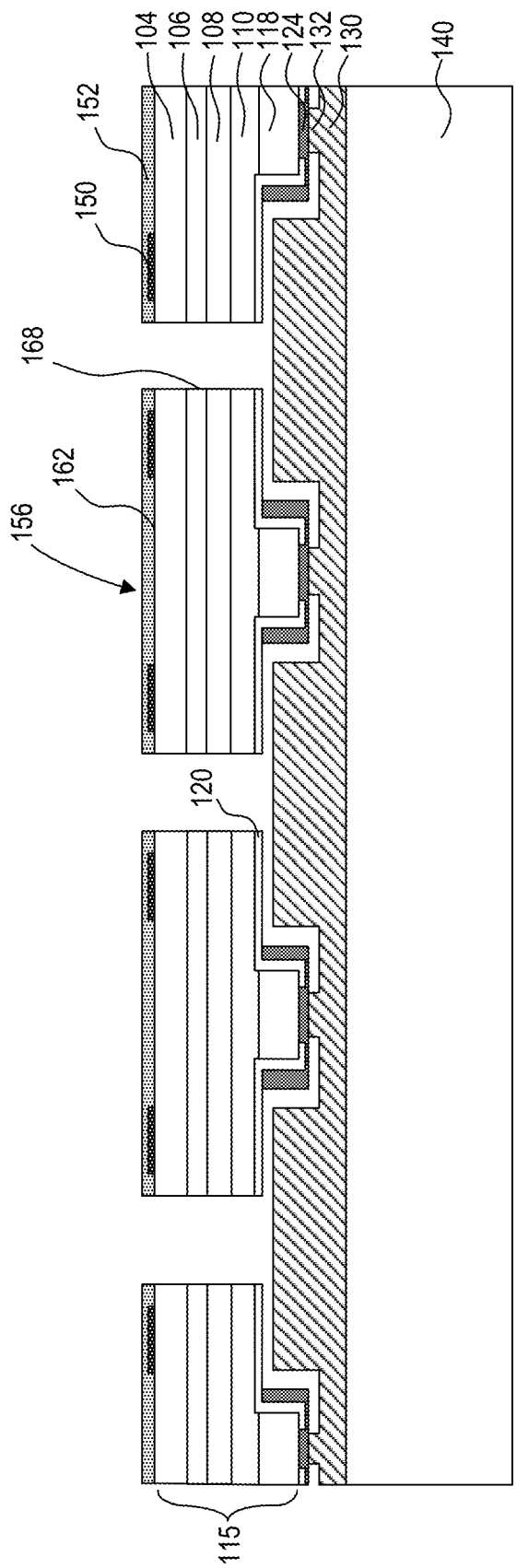
FIG. 11A is a cross-sectional side view illustrations of an array of LED devices supported by an array of stabilization posts after the removal of a sacrificial release layer in accordance with an embodiment of the invention.

Following the formation of discrete and laterally separate LED devices 156, the sacrificial release layer 126 may be removed. FIG. 11A is cross-sectional side view illustrations of an array of LED devices 156 supported by an array of stabilization posts 132 after removal of the sacrificial release layer in accordance with an embodiment of the invention. In the embodiment illustrated, sacrificial release layer 126 is completely removed resulting in an open space below each LED device 156. A suitable etching chemistry such as HF vapor, or $CF_4$ or $SF_6$ plasma may used to etch the $SiO_2$ or $SiN_x$ sacrificial release layer 126. In an embodiment, the array of LED devices 156 is on the array of stabilization posts 132, and supported only by the array of stabilization posts 132. In the embodiment illustrated, passivation layer 120 is not removed during removal of the sacrificial release layer 126. In an embodiment, passivation layer 120 is formed of $Al_2O_3$, and a $SiO_2$ or $SiN_x$ sacrificial release layer 126 is selectively removed with vapor HF.

Still referring to FIG. 11A, the LED device includes an active layer 108 between a first current spreading layer pillar 118 and a second current spreading layer 104, where the first current spreading layer pillar 118 is doped with a first dopant type and the second current spreading layer 104 is doped with a second dopant type opposite the first dopant type. A first cladding layer 110 is between the first current spreading layer pillar 118 and the active layer 108. A second cladding layer 106 is between the second current spreading layer 104 and the active layer 108. The first current spreading layer pillar protrudes away from the first cladding layer 110 and the first cladding layer 110 is wider than the first current spreading layer pillar 118. In an embodiment, the first current spreading layer pillar 118 is a bottom current spreading layer pillar, the first cladding layer 110 is a bottom cladding layer, the second cladding layer 106 is a top cladding layer, and the second current spreading layer is a top current spreading layer of the LED device. As shown, the passivation layer 120 may span along a bottom surface of the bottom cladding layer 110 and sidewalls of the bottom current spreading layer pillar 118. An opening is formed in the passivation layer 120 on a bottom surface of the bottom current spreading layer pillar 118. The bottom conductive contact 124 is formed within the opening in the passivation layer and in electrical contact with the bottom current spreading layer pillar 118. In an embodiment, the bottom conductive contact is not in direct electrical contact with the bottom cladding layer 110. In an embodiment, a top surface 162 of the top current spreading layer 104 is wider than a bottom surface of the bottom current spreading layer pillar 118. This may allow for a larger surface area for electrostatic pick up in addition to a structure for confining current. In an embodiment, the LED device 156 is supported by a post 132, and a surface area of a top surface of the post 132 is less than the surface area of the bottom current spreading layer pillar 118.

In accordance with embodiments of the invention the LED devices 156 may be micro LED devices. In an embodiment, an LED device 156 has a maximum width or length at the top surface 162 of top current spreading layer 104 of 300 μm or less, or more specifically approximately 100 μm or less. The active area within the LED device 156 may be smaller than the top surface 162 due to location of the bottom current spreading layer pillars 118. In an embodiment, the top surface 162 has a maximum dimension of 1 to 100 μm, 1 to 50 μm, or more specifically 3 to 20 μm. In an embodiment, a pitch of the array of LED devices 156 on the carrier substrate may be (1 to 300 µm) by (1 to 300 µm), or more specifically (1 to 100 µm) by (1 to 100 µm), for example, 20 µm by 20 µm, 10 µm by 10 µm, or 5 µm by 5 µm. In an exemplary embodiment, a pitch of the array of LED devices 156 on the carrier substrate is 11 µm by 11 µm. In such an exemplary embodiment, the width/length of the top surface 162 is approximately 9-10 µm, and spacing between adjacent LED devices 156 is approximately 1-2 µm. Sizing of the bottom current spreading layer pillars 118 may be dependent upon the width of the LED devices 156 and the desired efficiency of the LED devices 156.

In the above exemplary embodiments, manners for forming LED devices 156 including current spreading layer pillars are described. In the above embodiments, the current spreading layer pillars are formed from current spreading layer 114 using a one-sided process in which the pillars are formed prior to transferring the p-n diode layer from the handle substrate to the carrier substrate. In other embodiments, the current spreading layer pillars may be formed from current spreading layer 104 using a two-sided process in which the pillars are formed after transferring the p-n diode layer from the handle substrate to the carrier substrate. Accordingly, in some embodiments the LED device pillar structure may be inverted. Though an inverted LED device pillar structure may not provide a larger contact area for a transfer operation to a receiving substrate, such as described with regard to FIGS. 32A-32E.

Figure 11B:
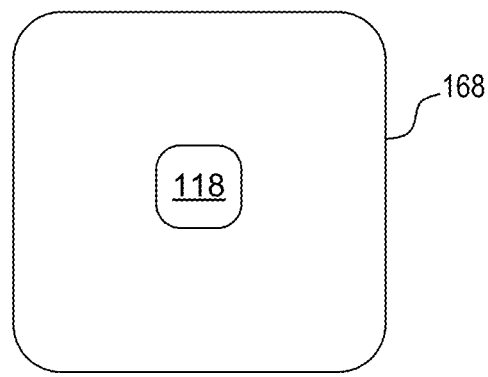
FIGS. 11B-11D are top-bottom combination schematic view illustrations of LED devices in accordance with embodiments of the invention.
Figure 11C:
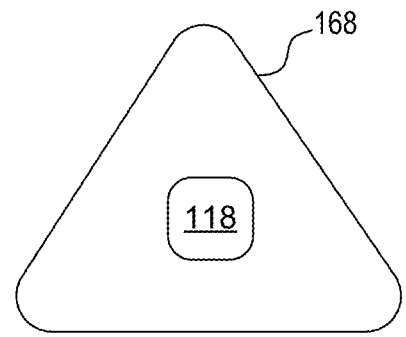
Figure 11D:
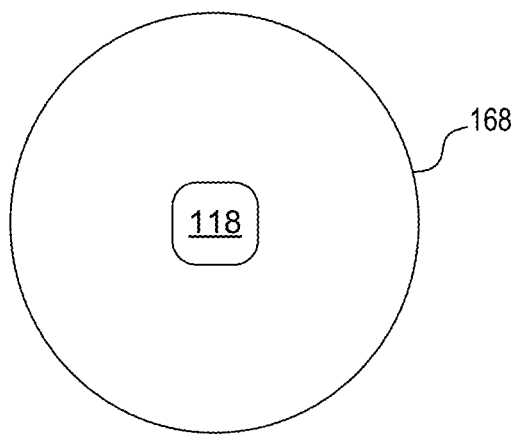

Referring now to FIGS. 11B-11D, top-bottom combination schematic view illustrations are provided of LED devices with different sidewall configurations in accordance with embodiments of the invention. As illustrated, each LED device may include mesa structure sidewalls 168 and a current spreading layer pillar 118. Sidewalls may include a variety of configurations such as rectangular or square as shown in FIG. 11B, triangular as shown in FIG. 11C, or circular as shown in FIG. 11D, amongst other shapes. Current spreading layer pillars 118 may also assume a variety of shapes including rectangular, square, triangular, circular, etc. In this manner, embodiments of the invention can be used with LED devices of various shapes, which may affect light extraction and EQE of the LED devices. As described above, the current spreading layer pillar 118 may protrude from a bottom of the LED device, or the device may be inverted and the current spreading layer pillar 118 protrudes from a top of the LED device.

Figure 12A:
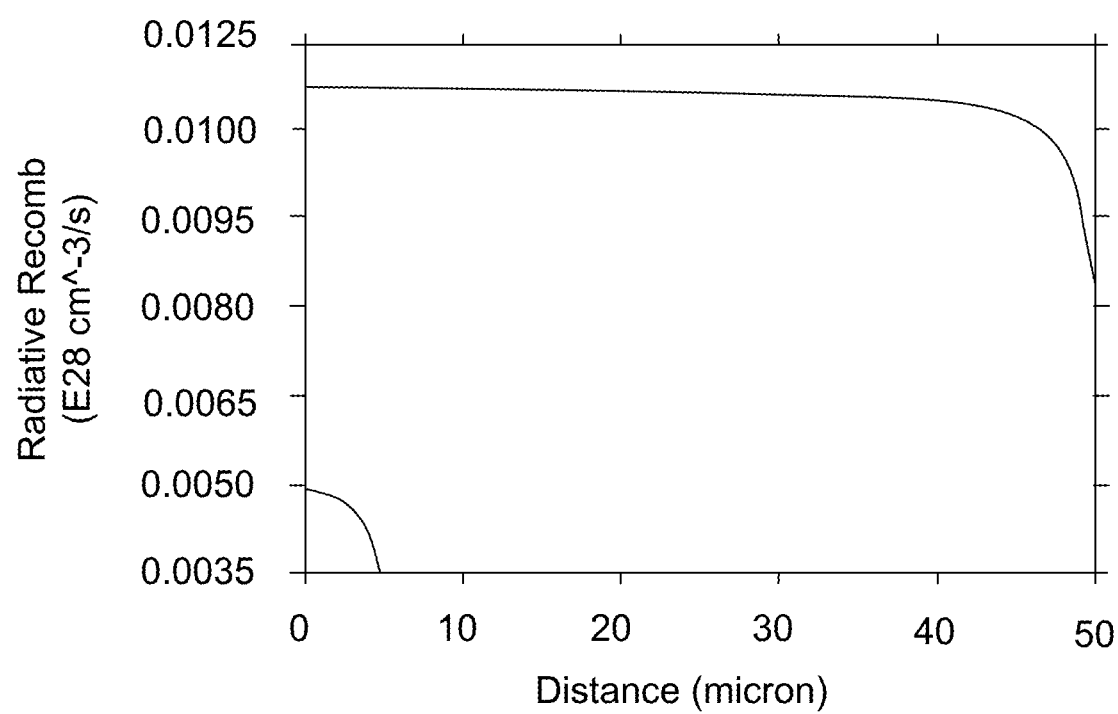
FIG. 12A is plot of radiative recombination at a current density of 300 nA/$\mu m^2$ as a function of distance from center of LED devices with different widths in accordance with an embodiment of the invention.

FIG. 12A is plot of radiative recombination as a function of distance from center of LED devices with different widths in accordance with an embodiment of the invention. Specifically, FIG. 12A illustrates simulation data for a 10 µm wide LED device and a 100 µm wide LED device, as shown in solid lines, at operating current densities of 300 nA/µm$^2$ (30 A/cm$^2$). The simulation data provided in FIG. 12A is based upon LED devices of constant width, without a pillar formation in the bottom current spreading layer. Referring now specifically to the simulation data for a 100 µm wide LED device, radiative recombination (resulting in light emission) is at a peak value in the center of the LED device indicated by a distance of 0 µm. The peak value is relatively constant moving away from the center until approximately 40 µm from center, where a non-radiative zone begins and the radiative recombination begins to tail off. Thus, this suggests that non-radiative recombination may occur along exterior surfaces of the active layer (e.g. along sidewalls of the LED devices). The simulation data for the 100 µm wide LED device suggests that this non-radiative zone begins to occur at approximately 10 µm from the exterior sidewalls, which may account for 20% of the LED device being affected by the non-radiative recombination zone. The simulation data for the 10 µm wide LED device shows that the peak value of radiative recombination (resulting in light emission) is at a peak value in the center of the LED device and immediately begins to degrade moving away from the center. Furthermore, the peak value of radiative recombination is well below the peak value of the radiative recombination for the 100 µm wide LED device, despite being driven at the same operating current density of 300 nA/µm$^2$. This suggests that non-radiative recombination due to edge effects is dominant within the 10 µm LED device, even within the center of the LED device. Thus, 100% of the LED device may be affected by the non-radiative recombination zone resulting in lower efficiency or EQE.

Figure 12B:
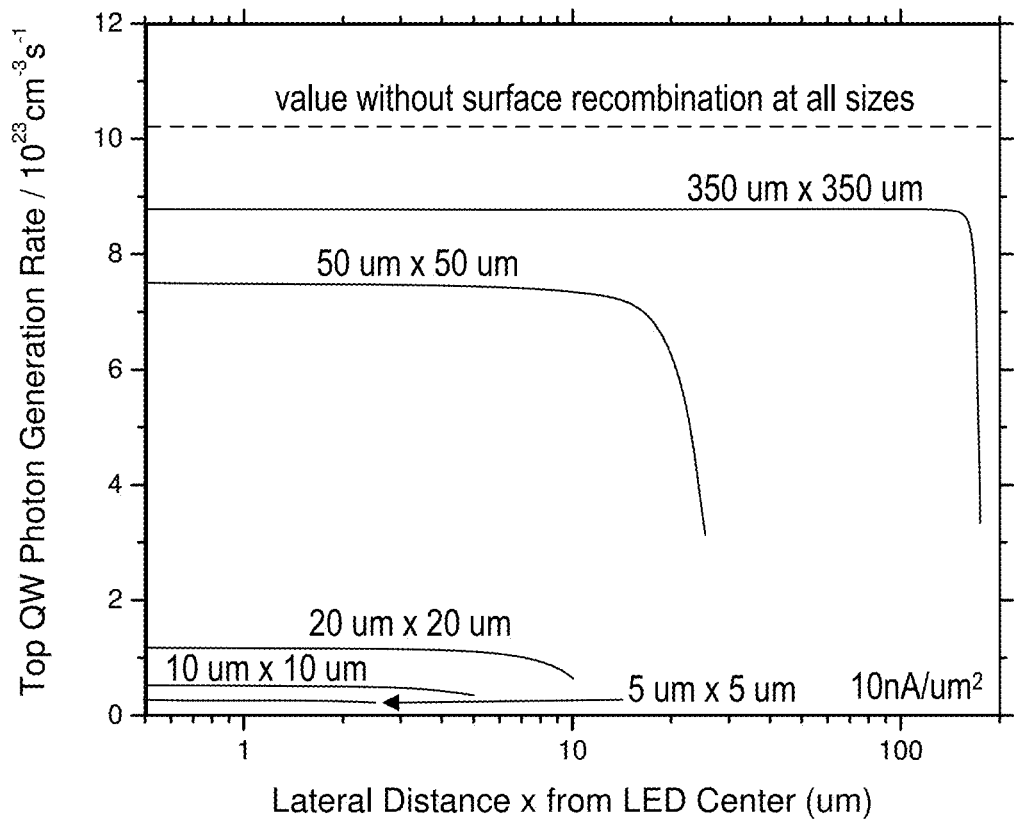
FIG. 12B is plot of radiative recombination at a current density of 10 nA/$\mu m$ 2 a function of distance from center of LED devices with different widths in accordance with an embodiment of the invention.

FIG. 12B is plot of radiative recombination as a function of distance from center of LED devices with different widths in accordance with an embodiment of the invention. Specifically, FIG. 12B illustrates simulation data for 5 µm, 10 µm, 20 µm, 50 µm, and 350 µm wide LED devices, as shown in solid lines, at operating current densities of 10 nA/µm$^2$ (1 A/cm$^2$). The simulation data provided in FIG. 12B is based upon LED devices of constant width, as a cylindrical shape, and without a pillar formation in the bottom current spreading layer. The theoretical value for surface recombination in a top quantum well, regardless of LED device size, is shown as a dotted line with a value of approximately 11×10$^{-23}$ cm$^{-3}$s$^{-1}$. Referring now specifically to the simulation data for a 50 µm wide LED device, radiative recombination (resulting in light emission) is at a peak value in the center of the LED device indicated by a distance of 0 µm. The peak value is relatively constant moving away from the center until approximately 15 µm from center, where a non-radiative zone begins and the radiative recombination begins to tail off. Thus, this suggests that non-radiative recombination may occur along exterior surfaces of the active layer (e.g. along sidewalls of the LED devices). The simulation data for the 50 µm wide LED device suggests that this non-radiative zone begins to occur at approximately 10 µm from the exterior sidewalls, which may account for 40% of the LED device being affected by the non-radiative recombination zone.

Figure 12C:
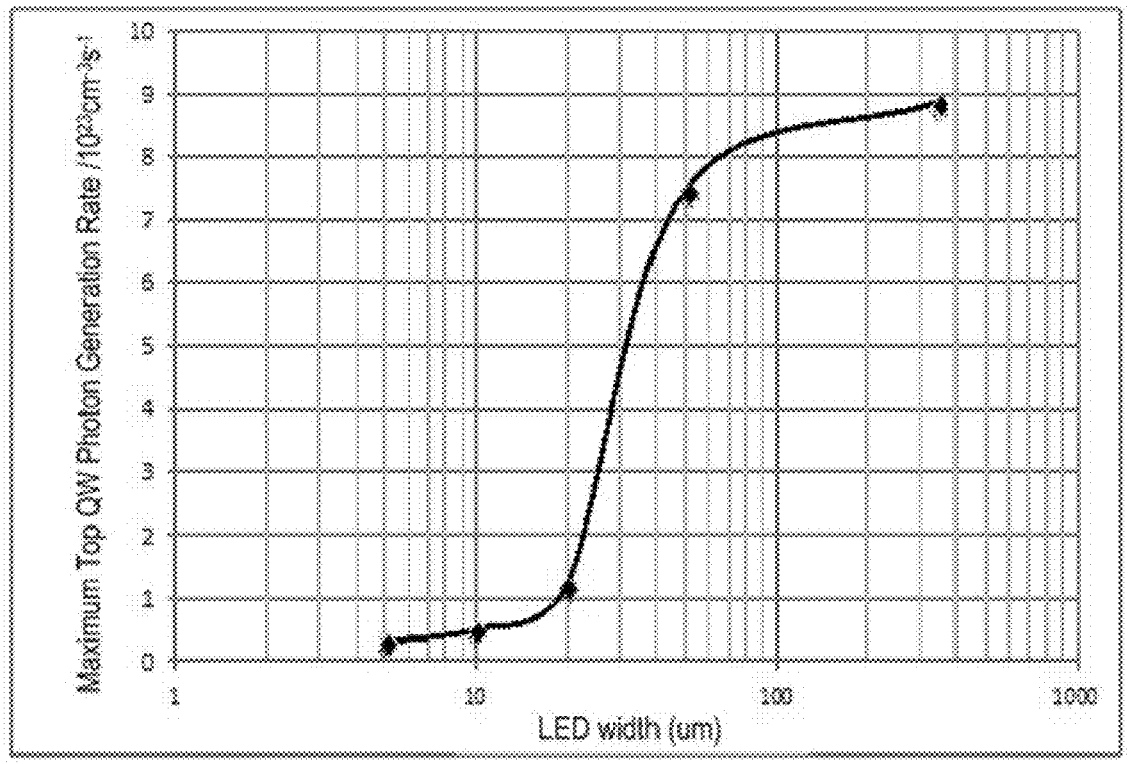
FIG. 12C is a plot of maximum radiative recombination of the LED devices of FIG. 12B at a current density of 10 nA/$cm^2$ in accordance with an embodiment of the invention.

FIG. 12C is a plot of maximum radiative recombination of the LED devices of FIG. 12B at a current density of 10 nA/µm$^2$ in accordance with an embodiment of the invention. The simulation data for the 50 µm wide LED device shows a slight decrease of radiative recombination at the center of the LED device compared to the 350 µm wide LED device. Assuming a measured radiative recombination of 8.9 for the 350 µm wide LED device and 7.5 for the 50 µm wide LED device, this reduction amounts to approximately a 15.7% reduction at the center, though the simulation results do indicate the peak value of radiative recombination is maintained for approximately 15 microns from the center of the LED device prior to degrading further away from the center. The simulation data for the 20 µm wide LED device shows a greater decrease of radiative recombination at the center of the LED device compared to the 350 µm wide LED device. Assuming a measured radiative recombination of 8.9 for the 350 µm wide LED device and 1.2 for the 20 µm wide LED device, this reduction amounts to about 86.5% at the center. This suggests that non-radiative recombination due to edge effects is dominant within the 20 µm LED device, even within the center of the LED device. Thus, 100% of the 20 µm wide LED device may be affected by the non-radiative recombination zone resulting in lower efficiency or EQE. Still referring to FIG. 12C, a rapid drop-off in top quantum well photon generation due to radiative recombination is observed at and below approximately 50 μm wide LED devices, illustrating the influence of edge effects on LED device efficiency as LED device size is reduced.

It is believed that such non-radiative recombination may be the result of defects, for example, that may be the result of forming mesa trenches through the p-n diode layer to form an array of LED devices or a result of surface states from dangling bonds at the terminated surface that can enable current flow and non-radiative recombination. Such non-radiative recombination may have a significant effect on LED device efficiency, particularly at low current densities in the pre-droop region of the IQE curve where the LED device is driven at currents that are unable to saturate the defects. As illustrated in the above simulation data, it is expected that for LED devices without internally confined current injection areas, as the LED device width (and active layer width) is increased above 10-20 μm the radiative recombination (resulting in light emission) in the center of the device increases as the width increases until the peak value approaches the theoretical value for surface recombination. In accordance with embodiments of the invention, the current injection area can be confined internally within the active layer using a variety of different structures so that the current does not spread laterally to the exterior or side surfaces of the active layer where a larger amount of defects may be present. As a result, the amount of non-radiative recombination due to edge effects in the non-radiative zone near the exterior sidewall surfaces of the active layer can be reduced or eliminated and efficiency of the LED device increased.

Figure 13:
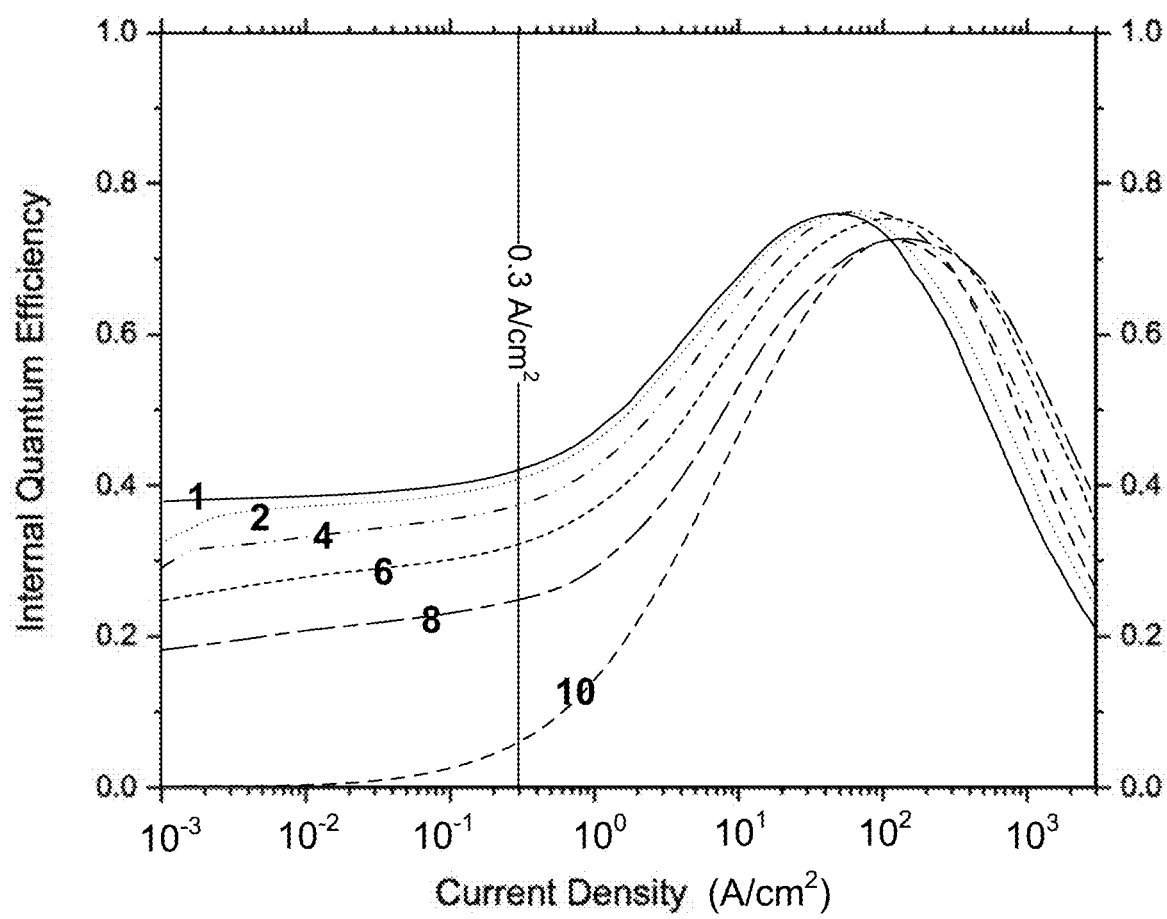
FIG. 13 is a plot of internal quantum efficiency as a function of current density for LED devices with current spreading layer pillars of different widths in accordance with embodiments of the invention.

FIG. 13 is a plot of internal quantum efficiency as a function of current density for exemplary 10 μm wide LED devices (quantum well width) with current spreading layer pillars (p-doped) of different widths (1 μm, 2 μm, 4 μm, 6 μm, 8 μm, and 10 μm) in accordance with embodiments of the invention. As illustrated, IQE for the devices increases as the pillar size is reduced from 10 μm (no pillar) to 1 μm. This suggests that the pillar configuration is successful in confining the injection current internally within the LED devices away from the sidewalls, particularly at low current densities in the pre-droop region of the IQE curve where IQE can be dominated by defects.

Figure 14:
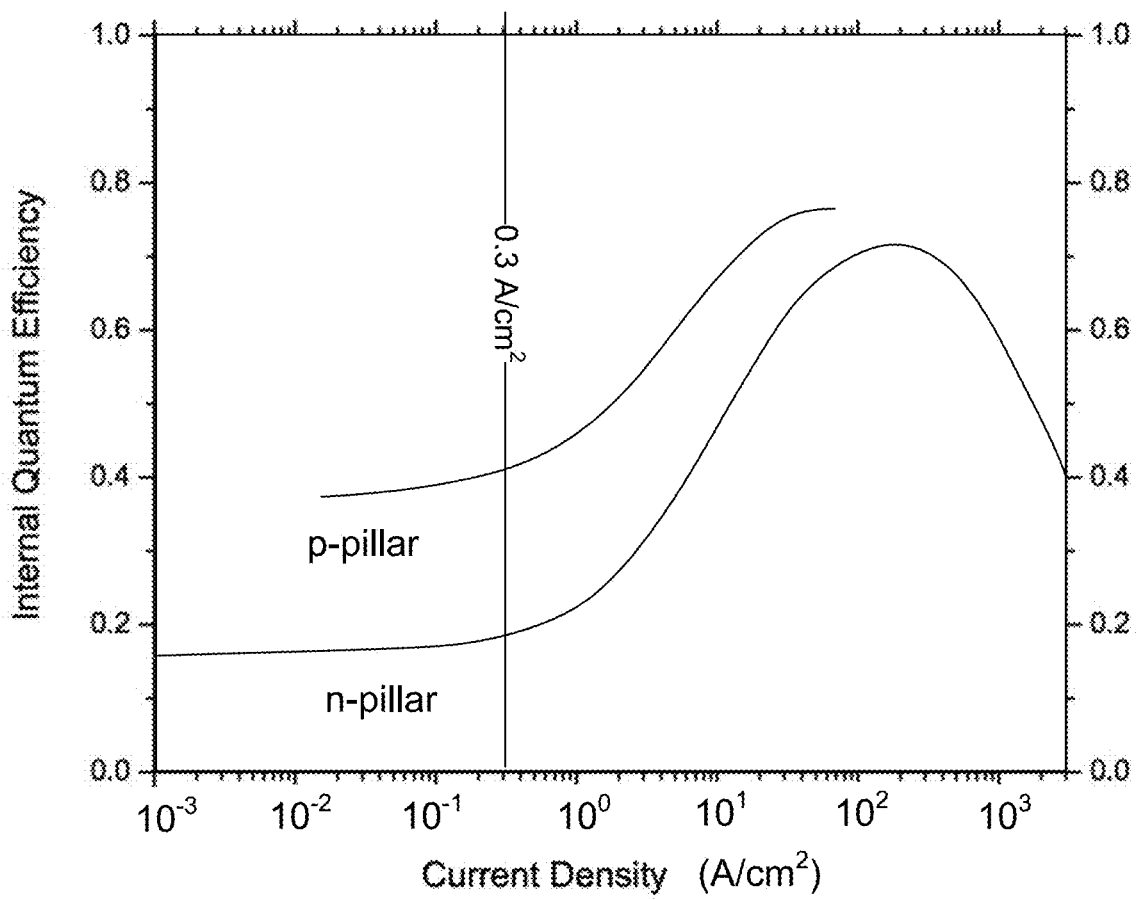
FIG. 14 is a plot of internal quantum efficiency as a function of current density for LED devices with current spreading layer pillars of different doping in accordance with embodiments of the invention.

FIG. 14 is a plot of internal quantum efficiency as a function of current density for exemplary LED devices with current spreading layer pillars of different doping in accordance with embodiments of the invention. Specifically, the simulation data provided in FIG. 14 is for 10 μm wide LED devices (quantum well width) with 2 μm wide current spreading layer pillars, where n-pillar simulation data is presented along with the 2 μm wide p-pillar data from FIG. 13. The simulation data suggests IQE increases for both p-pillar and n-pillar configurations and that the p-pillar configuration obtains a larger IQE. This may be attributed to holes having a lower mobility than electrons and suggests that lower mobility holes may be more effectively confined.

Figure 15A:
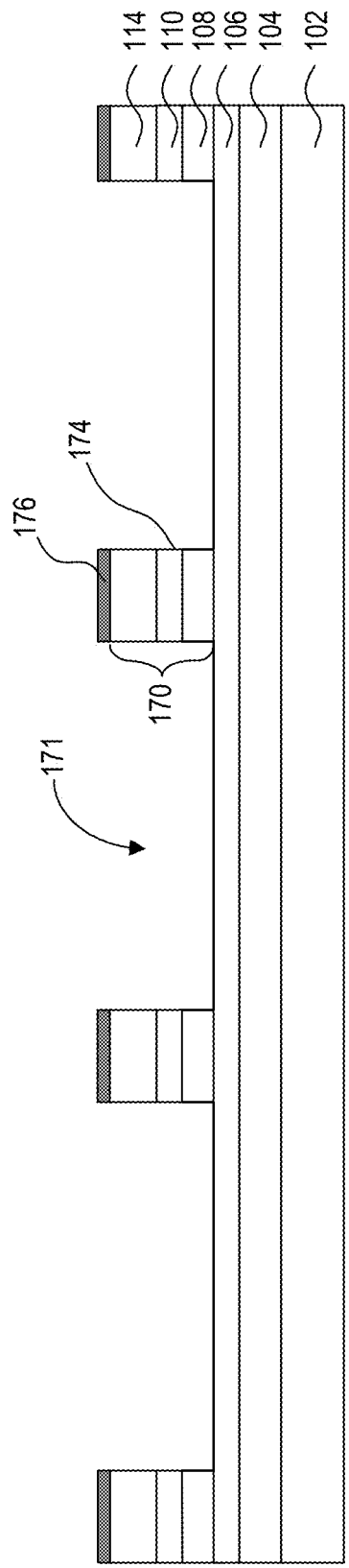
FIGS. 15A-15B are cross-sectional side view illustrations of the formation of mesa regrowth trenches etched partially or completely through a p-n diode layer to form pillar structures in accordance with embodiments of the invention.

FIGS. 15A-21A are cross-sectional side view illustrations of manners for forming an array of LED devices including etch removal of a portion of the p-n diode layer to form an array of pillar structures followed by mesa re-growth in accordance with embodiments of the invention. Referring to FIGS. 15A-15B, mesa regrowth trenches 171 may be etched partially or completely through p-n diode layer to form pillar structures 170. Referring to FIG. 15A, pillar structures 170 are formed by etching completely through current spreading layer 114, cladding layer 110 and active layer 108 stopping on cladding layer 106. For example, this may be accomplished with a timed etch or a selective etch. In an embodiment, a patterned mask 176 is used for etching the pillar structures 170. For example, suitable mask materials may be silicon oxide, silicon nitride, and aluminum nitride. Referring to FIG. 15B, pillar structures 170 are formed by etching completely through the p-n diode layer. Pillar structures 170 may include a variety of layers, so long as etching of mesa regrowth trenches 171 proceeds past the active layer 108 in accordance with some embodiments. Thus, etching can be terminated at any location past the active layer 108. In an embodiment, etching is continued into the substrate 102, for example, a few hundred nanometers to ensure complete etching through current spreading layer 104. Etching may be performed using a suitable technique such as wet etching or dry etching techniques described above for the formation of current spreading layer confinement trenches 116. For example, dry etching techniques such as reactive ion etching (RIE), electro-cyclotron resonance (ECR), inductively coupled plasma reactive ion etching (ICP-RIE), and chemically assisted ion-beam etching (CAIBE) may be used. Following the etching of confinement trenches to form the pillar structures 170 a confinement barrier fill 172 is formed within the mesa regrowth trenches 171.

Figure 15B:
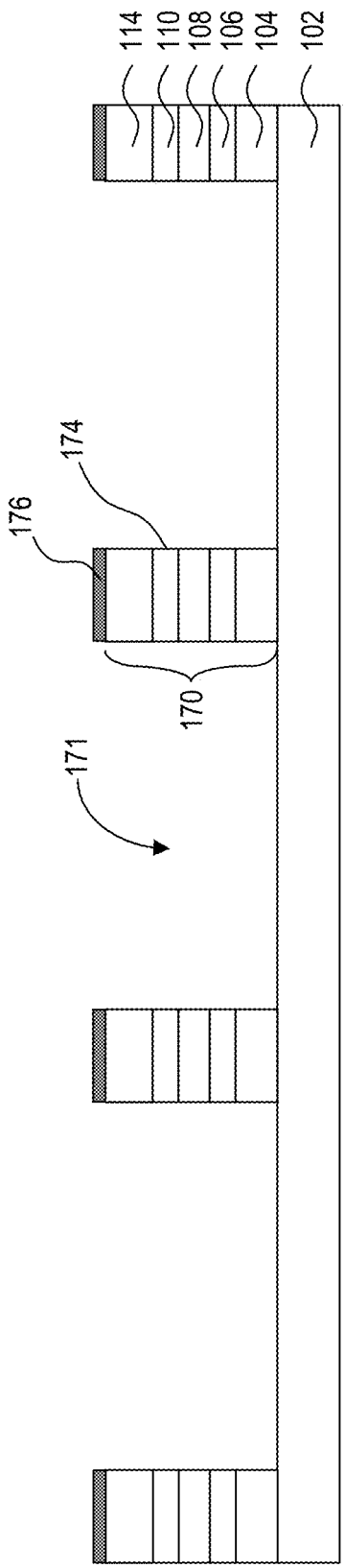

In the embodiment illustrated in FIGS. 16A-16B the confinement barrier fill 172 completely fills the mesa regrowth trenches 171 formed in FIGS. 15A-15B, respectively, and spans sidewalls 174 of the pillar structures 170. As illustrated in FIG. 16A, the confinement barrier fill 172 spans sidewalls of the current spreading layer 114, cladding layer 110, and active layer 108 for each pillar structure 170. As illustrated in FIG. 16B, the confinement barrier fill 172 spans sidewalls of the current spreading layer 114, cladding layer 110, active layer 108, cladding layer 106, and current spreading layer 104 for each pillar structure 170. A calibrated and timed etch may optionally be performed after regrowth using the mask 176 as a self-aligned etch mask in order to achieve a desired height of the regrown confinement barrier fill 172. In other embodiments, the confinement barrier fill 172 is formed only as high as necessary to cover the side surfaces of the active layer 108. Thus, side surfaces of cladding layer 110 and current spreading layer 114 may not be surrounded by the confinement barrier fill 172. In an embodiment, patterned mask 176 used for forming the pillar structures 170 is also used during growth of the confinement barrier fill 172 to inhibit regrowth on top of the pillar structures as well as form the confinement barrier fill 172 using a self-aligned process.

As described above, it is believed that non-radiative recombination may be the result of defects, for example, that may be the result of etching through the p-n diode layer or a result of surface states from dangling bonds at the terminated surface that can enable current flow and non-radiative recombination. Such non-radiative recombination may have a significant effect on LED device efficiency, particularly at low current densities in the pre-droop region of the IQE curve where the LED device is driven at currents that are unable to saturate the defects. In an embodiment, confinement barrier fill 172 is formed using an epitaxial growth technique such as MBE or MOCVD in order to occupy the available surface states along the pillar structure 170, particularly along the active layer 108. In this manner, a continuous crystal structure possessing a larger bandgap and/or higher resistivity than the layers forming the pillar structures 170 can be formed laterally around the pillar structures 170, and discrete sidewalls are not formed around the active layer 108 forming the pillar structure 170. In accordance with some embodiments of the invention, the confinement barrier fill 172 forms a current confinement region laterally surrounding the pillar structures forming the current injection region in order to confine current that flows through the active layer 108 to an interior portion of the LED device and away from sidewalls of the LED device.

In an embodiment, the confinement barrier fill 172 has a larger bandgap and/or larger resistivity than the materials forming the active layer 108. In an embodiment, the confinement barrier fill 172 has a larger bandgap and/or larger resistivity than the current spreading layer 114. The confinement barrier fill 172 may also have a larger bandgap and/or larger resistivity than the cladding layer 110. The inclusion of a confinement barrier fill 172 with a larger bandgap than the active region may have two effects. One is that a larger bandgap may be transparent to the light emitted from the active layer. Another effect is that the larger bandgap and/or larger resistivity will create a hetero-barrier that inhibits current from leaking through the regrown confinement barrier fill 172. In addition to bandgap and/or resistivity, other considerations such as lattice matching factor into suitability of particular regrowth materials are taken for the confinement barrier fill 172. Exemplary materials, in order of suitability, for the exemplary red emitting LED devices described herein include GaP, AlP, AlGaP, AlAs, AlGaAs, AlInGaP, AlGaAsP, and any As—P—Al—Ga—In may allow a larger bandgap than the material(s) forming the active layer 108. Additional potentially suitable materials include GaN, InN, InGaN, AlN, AlGaN, and any nitride alloy with a larger bandgap than the material(s) forming the active layer 108. The confinement barrier fill 172 for red emitting LED devices may additionally be doped (e.g. in-situ doped) with a dopant material to increase resistivity or render the confinement barrier fill 172 semi-insulating. For example, the red emitting LED devices described herein may be doped with a material such as Cr, Ni, or Fe. Exemplary materials for the exemplary blue or green emitting LED devices described herein include GaN, AlGan, InGaN, AlN, InAlN, AlInGaN. The confinement barrier fill 172 for blue or green emitting LED devices may additionally be doped (e.g. in-situ doped) with a material such as Fe or C.

Figure 17A:
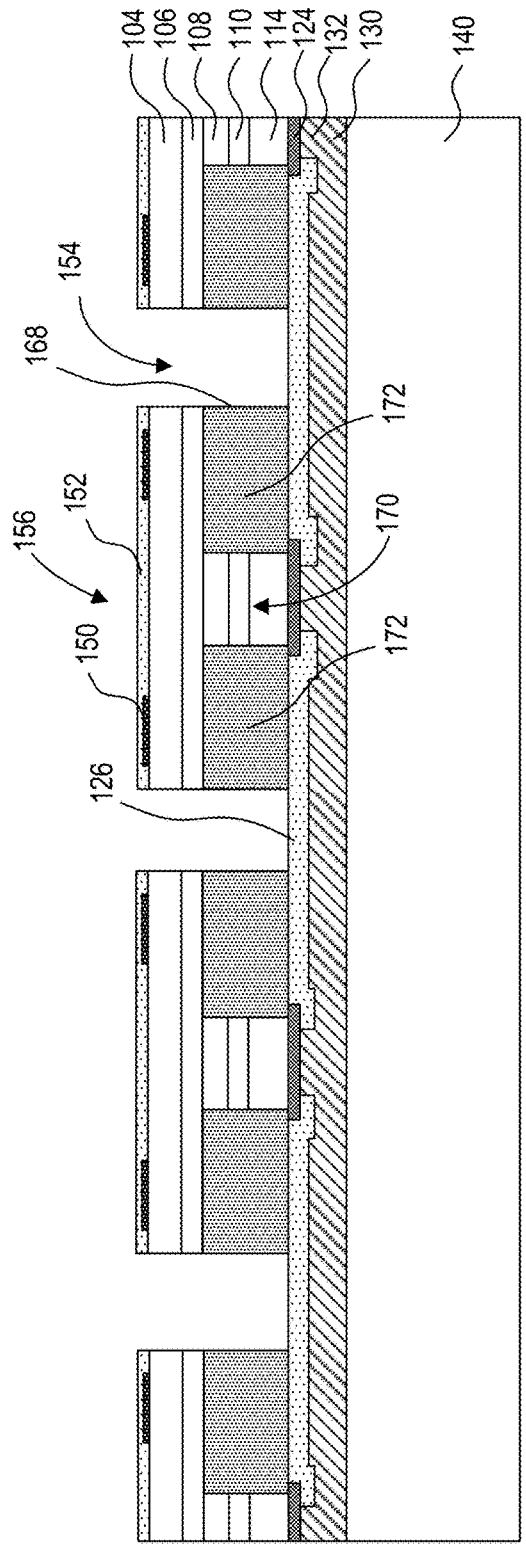
FIGS. 17A-17B are cross-sectional side view illustrations of an LED device including a confinement barrier fill laterally surrounding a pillar structure in accordance with embodiments of the invention.
Figure 17B:
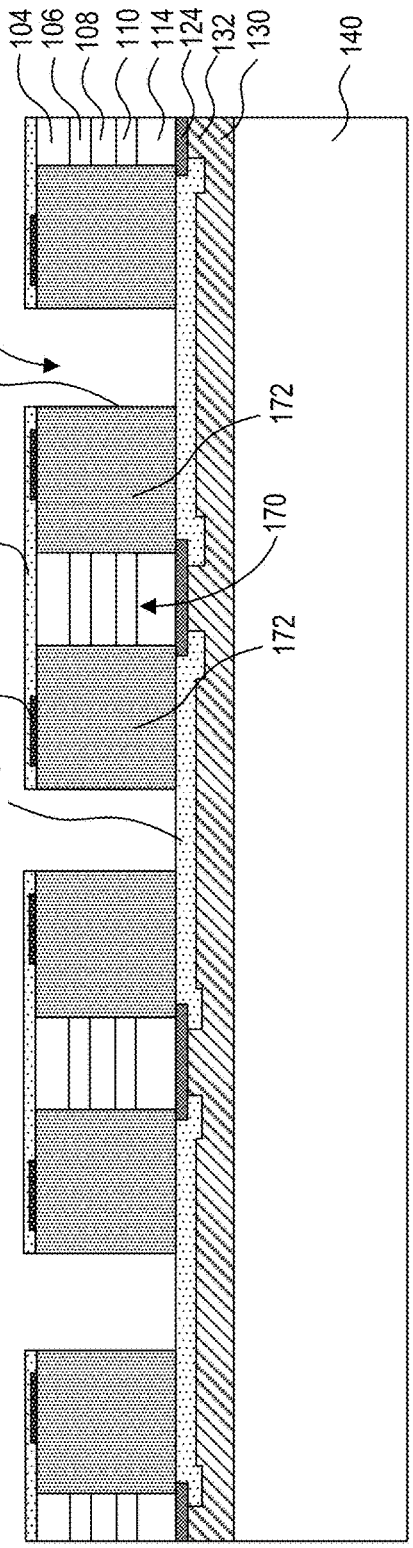

After forming the confinement barrier fill 172, the p-n diode layer may be transferred from the handle substrate 102 to a carrier substrate 140. FIG. 17A is a cross-sectional side view illustration of an LED device including a pillar structure 170 comprising the current spreading layer 114, cladding layer 110, and active layer 108 and a confinement barrier fill 172 laterally surrounding the pillar structure 170 in accordance with an embodiment of the invention. FIG. 17B is a cross-sectional side view illustration of an LED device including a pillar structure 170 comprising the current spreading layer 114, cladding layer 110, active layer 108, cladding layer 106, and current spreading layer 104 and a confinement barrier fill 172 laterally surrounding the pillar structure 170 in accordance with an embodiment of the invention. In the embodiments illustrated in FIGS. 17A-17B, the confinement barrier fill 172 represents a current confinement region that laterally surround a current injection region characterized by the pillar structure 170 to confine current that flows through the active layer 108 to an interior portion of the LED device 156 and away from exterior sidewalls 168 of the LED device. Furthermore, due to the manner of formation of the confinement barrier fill 172, the available surface states along the pillar structure 170, particularly along the active layer 108 are occupied. In this manner, the material transition between the pillar structure 170 and confinement barrier fill is a continuous crystal structure in which discrete sidewalls are not formed around the active layer 108. As a result, edge effects along the material transition are mitigated.

The structures illustrated in FIGS. 17A-17B may be formed using a processing sequence similar to the one previously described above with regard to FIGS. 5-10. In interest of conciseness the processing sequences are not separately described and illustrated. Following the formation of the structures illustrated in FIGS. 17A-17B including the array of LED devices supported by posts 132, the sacrificial release layer 126 spanning between and directly underneath the array of LED devices 156 may be removed similarly as described above with regard to FIG. 11A to condition the array of LED devices so that they are poised for pick up and transfer to a receiving substrate.

Figure 18:
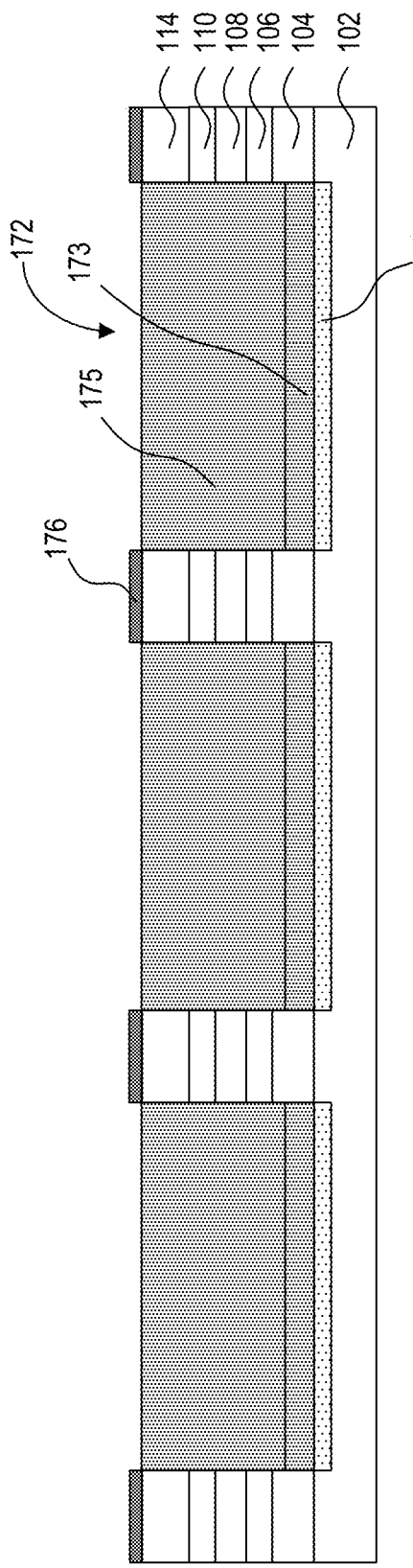
FIG. 18 is a cross-sectional side view illustration of a multi-layer confinement barrier fill within mesa regrowth trenches in accordance with an embodiment of the invention.

Referring now to FIGS. 18-21A structures are illustrated that include a multi-layer confinement barrier fill 172 formed within the mesa regrowth trenches 171. FIG. 18 is an illustration of a multi-layer confinement barrier fill 172 including a buffer layer 173 and barrier layer 175 grown on top of the buffer layer 173, where the barrier layer 175 is formed laterally adjacent sidewalls 174 of the pillar structures 170 including the active layer 108 in order to confine current that flows through the active layer to an interior portion of the LED device and away from sidewalls 168 of the LED device. In an embodiment, the buffer layer 173 acts as a lattice transition layer between the growth substrate 102 and barrier layer 175. In an embodiment, buffer layer 173 is a graded layer that transitions between the composition of the growth substrate and the barrier layer 175 in order to promote growth of a high quality barrier layer 175. This may promote the formation of barrier layer 175 that occupies the available surface states along the pillar structure 170, particularly along the active layer 108 so that the material transition between the pillar structure 170 and confinement barrier fill is a continuous crystal structure in which discrete sidewalls are not formed around the active layer 108. In an embodiment, buffer layer 173 is formed of the same material as barrier layer 175. In some embodiments, barrier layer 175 may be doped as described above with regard to the confinement barrier fill 172 of FIGS. 16A-16B. Likewise, buffer layer 173 may optionally be doped. In some embodiments, the formation of buffer layer 173 may result in the formation of an unintentionally doped region 103 of growth substrate 102. Referring to FIG. 18, in an embodiment barrier layer 175 is grown within the mesa regrowth trenches 171 at least a couple hundred nanometers below the active layer 108 in order to form the high quality barrier layer 175 laterally around the active layer 108. Accordingly, transition from the buffer layer 173 may occur laterally adjacent the current spreading layer 104 or cladding layer 106, so long as the transition occurs at least a couple hundred nanometers below the active layer 108. Furthermore, it is not required for barrier layer 175 to completely fill the mesa regrowth trenches 171 so long as growth is continued past/above the active layer 108 illustrated in FIG. 18.

In an exemplary red emitting LED device structure, growth substrate 102 is formed of GaAs, buffer layer 173 is a graded layer that is graded from GaAs to GaP or is GaP, and barrier layer 175 is formed of GaP. In an embodiment, barrier layer 175 has a larger bandgap and/or resistivity than the material(s) forming the active layer 108. As previously described, barrier layer 175 may be doped, for example with a Cr, Ni, or Fe dopant to increase resistivity or render the barrier layer 175 semi-insulating.

Figure 19:
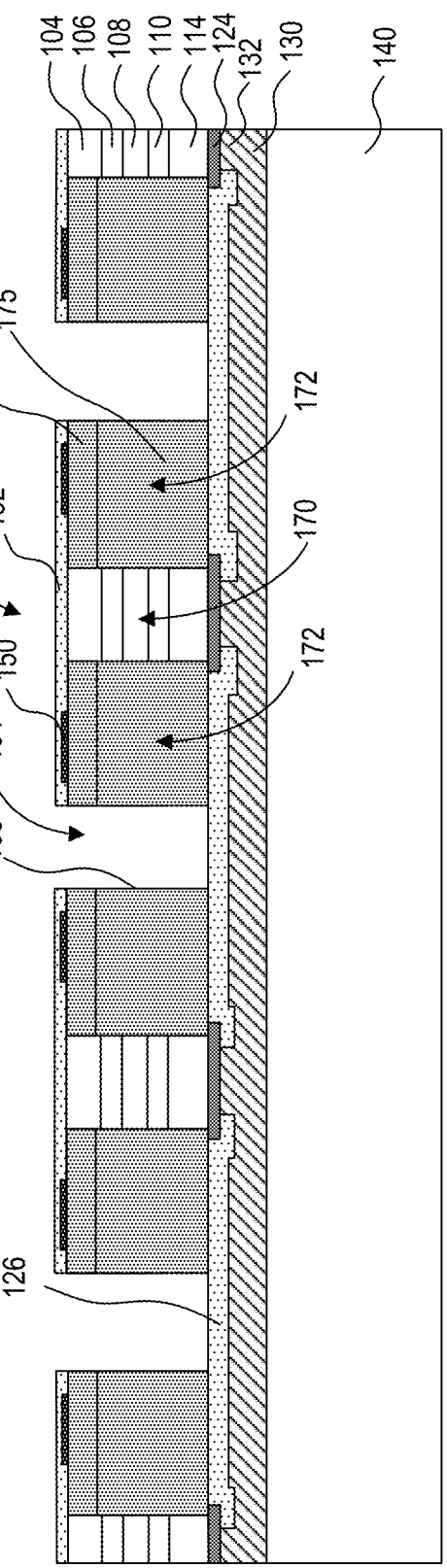
FIG. 19 is a cross-sectional side view illustration of an LED device including a multi-layer confinement barrier fill laterally surrounding a pillar structure in accordance with an embodiment of the invention.

After forming the confinement barrier fill 172, the p-n diode layer may be transferred from the handle substrate 102 to a carrier substrate 140. FIG. 19 is a cross-sectional side view illustration of an LED device including a pillar structure 170 and multi-layer confinement barrier fill 172 laterally surrounding the pillar structure 170 in accordance with an embodiment of the invention. The structure illustrated in FIG. 19 may be formed using a processing sequence similar to the one previously described above with regard to FIGS. 5-10. In interest of conciseness the processing sequence is not separately described and illustrated. Following the formation of the structure illustrated in FIG. 19 including the array of LED devices supported by posts 132, the sacrificial release layer 126 spanning between and directly underneath the array of LED devices 156 may be removed similarly as described above with regard to FIG. 11A to condition the array of LED devices so that they are poised for pick up and transfer to a receiving substrate.

Figure 20:
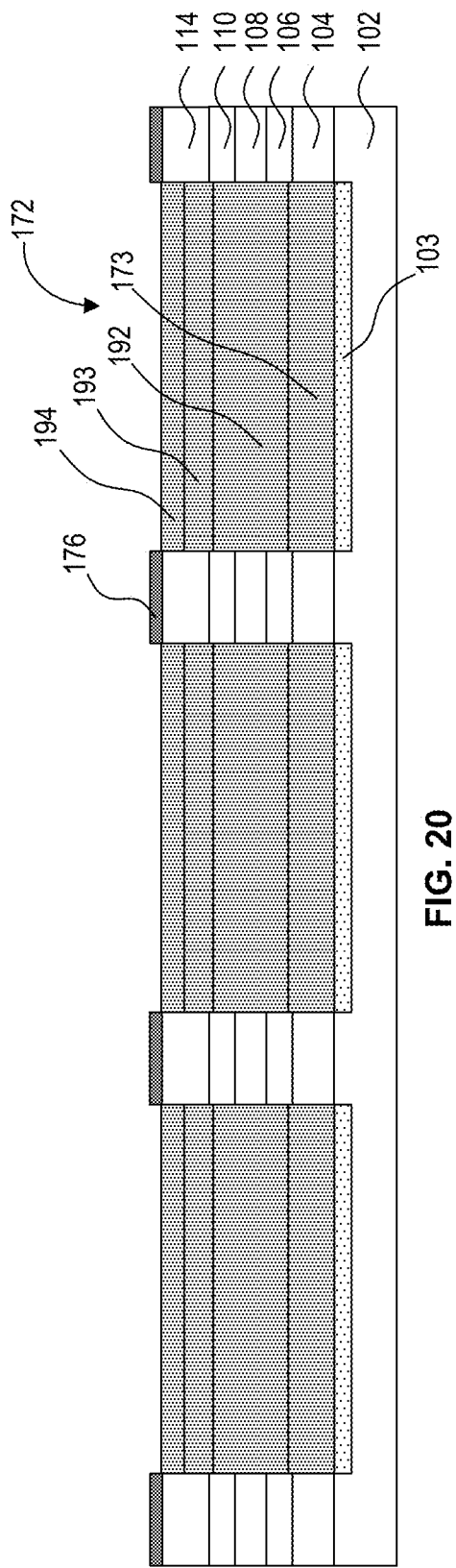
FIG. 20 is a cross-sectional side view illustration of a confinement barrier fill comprising a p-n-p junction within mesa regrowth trenches in accordance with an embodiment of the invention.

FIG. 20 is an illustration of a multi-layer confinement barrier fill 172 including two p-n junctions in order to confine current that flows through the active layer to an interior portion of the LED device and away from sidewalls 168 of the LED device. The multi-layer confinement barrier fill 172 in FIG. 20 may be formed similarly as the multi-layer confinement barrier fill 172 of FIG. 18, with one difference being that the barrier layer 175 of FIG. 18 is replaced with layers 192, 193, 194 forming a p-n-p reverse bias junction. In this manner the electrical path through the confinement barrier fill 172 including the p-n-p junction may be characterized by a higher resistance than the electrical path through the pillar structure 170. Layers 192, 193, 194 may be formed of the same material as barrier layer 175, with the only difference being doping. In an embodiment, barrier fill layers 192, 194 are in-situ p-doped (e.g. Zn, Mg, or C for As/P materials, or Mg for nitride materials) and barrier fill layer 193 is in-situ n-doped (e.g. Si for nitrides or Si, Sn, S, Se, or Te for As/P materials). For example, layer 192, 193, 194 may be formed of a p-doped GaP (Zn dopant) and n-doped GaP (Si dopant). Layers 192, 193, 194 may additionally be formed of a larger bandgap material than the material(s) forming the active layer 108 to provide transparency to emitted light. As illustrated in FIG. 20, in an embodiment p-doped barrier fill layer 192 is growth above active layer 108. In an embodiment p-doped barrier fill layer 192 is growth both above and below active layer 108 such that p-doped barrier fill layer 192 completely laterally surrounds active layer 108. A more detailed description of the regrowth layers 192, 193, 194 as they relate to conductivity and current leakage through the regrowth structure is described in more detail with regard to FIGS. 21A-21C.

Figure 21A:
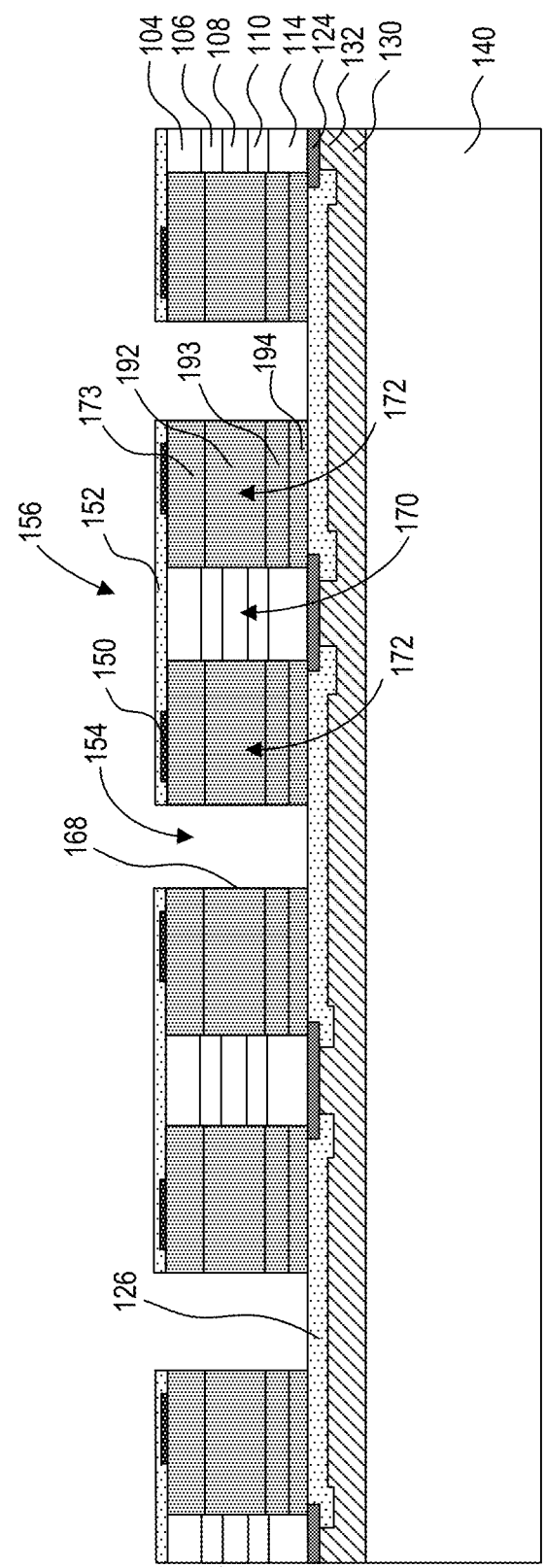
FIG. 21A is a cross-sectional side view illustration of an LED device including a confinement barrier fill comprising a p-n-p junction laterally surrounding a pillar structure in accordance with an embodiment of the invention.

After forming the confinement barrier fill 172, the p-n diode layer may be transferred from the handle substrate 102 to a carrier substrate 140. FIG. 21A is a cross-sectional side view illustration of an LED device including a pillar structure 170 and multi-layer confinement barrier fill 172 laterally surrounding the pillar structure 170 in accordance with an embodiment of the invention. The structure illustrated in FIG. 21A may be formed using a processing sequence similar to the one previously described above with regard to FIGS. 5-10. In interest of conciseness the processing sequence is not separately described and illustrated. Following the formation of the structure illustrated in FIG. 21A including the array of LED devices supported by posts 132, the sacrificial release layer 126 spanning between and directly underneath the array of LED devices 156 may be removed similarly as described above with regard to FIG. 11A to condition the array of LED devices so that they are poised for pick up and transfer to a receiving substrate.

Figure 21B:
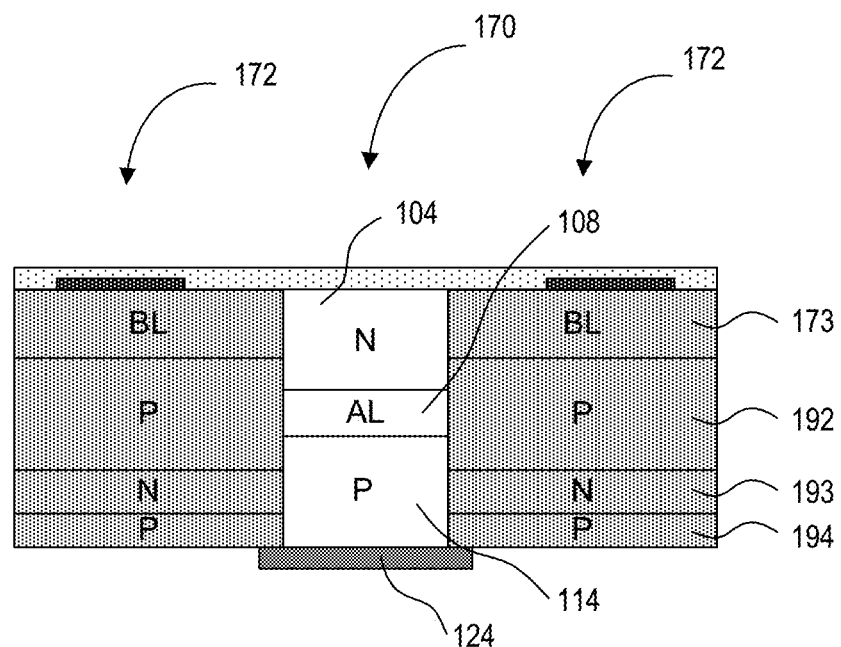
FIGS. 21B-21C are a close-up cross-sectional view illustrations of an LED including a confinement barrier fill comprising a p-n-p junction laterally surrounding a pillar structure in accordance with embodiments of the invention.

FIG. 21B is a close-up cross-sectional view illustration of an LED including a confinement barrier fill 172 comprising a p-n-p junction laterally surrounding a pillar structure in accordance with an embodiment of the invention. In the particular embodiment illustrated, exemplary doping characteristics are provided by the layers to demonstrate how the particular structure inhibits conductivity and current leakage through the regrowth structure. As shown, the mesa regrowth structure including layers the p-n-p junction blocking layers 192, 193, 194 inhibits vertical conductivity through the regrowth structure. Buffer layer 173 may optionally be n-type in FIG. 21B. The particular location of blocking layers 192, 193, 194 relative to the active layer 108 within the pillar structure also inhibits lateral leakage into the regrowth structure.

Figure 21C:
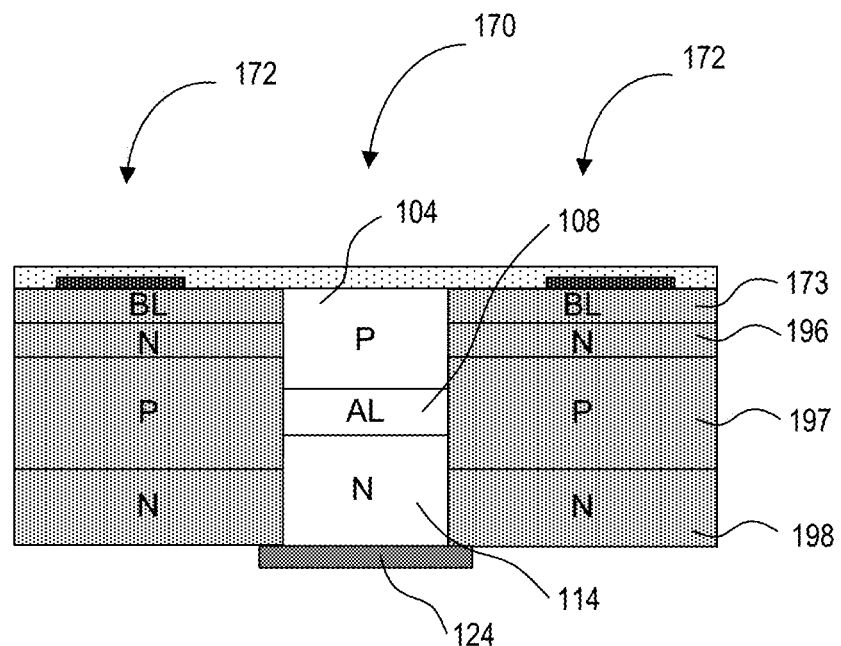

In the particular embodiment illustrated in FIG. 21B a p-p connection type is formed between the pillar structure 170 and the confinement barrier fill 172. In a p-p connection type the p-type current spreading layer 114 (or p-type cladding layer 110) is laterally adjacent the p-type blocking layer 192. A p-p connection type is expected to result in less current leakage in the device than a comparable n-n connection type between the pillar structure 170 and confinement barrier fill 172. This may be attributed to an n-type blocking layer having lower resistivity than a p-type blocking layer. Still referring to FIG. 21B, the leakage current path through the confinement barrier fill 172 region is limited by the n-type blocking layer 193, which is an electrically floating region where the carriers are not directly supplied from the contacts 124, 150/152. The shorter the overlap/connection length of the p-type blocking layer 192 with the p-type current spreading layer 114 (or p-type cladding layer 110), the better the electrical confinement, and the lower the leakage current. Additionally the doping levels of the different n-type and p-type blocking layers are important to control. Very high doping levels (higher than the respective current spreading layer and cladding layers in the pillar structure 170) reduces the mobility of the charge carries in the blocking regions and increases the built-in potential at the reverse biased junctions, reducing leakage. Unlike a laser, in the LEDs in accordance with embodiments of the invention, the optical loss from free-carrier-absorption due to very high doping levels is not a concern. A larger bandgap material for the blocking layers is beneficial to prevent significant optical absorption as well as to increase the barrier height through the blocking regions to promote confinement. FIG. 21C illustrates an embodiment of an LED device including reversed doping within the pillar structure 170, in which a p-p connection type is maintained between the pillar structure 170 and the confinement barrier fill 172 including blocking layers 196 (n-type), 197 (p-type), 198 (n-type). Buffer layer 173 may optionally be p-type in FIG. 21C. As illustrated, n-type blocking layer 196 of FIG. 21C is floating similar to n-type blocking layer 193 of FIG. 21B. Likewise the shorter the overlap/connection length of the p-type blocking layer 197 with the p-type current spreading layer 104 (or p-type cladding layer 106), the better the electrical confinement, and the lower the leakage current.

Figure 22:
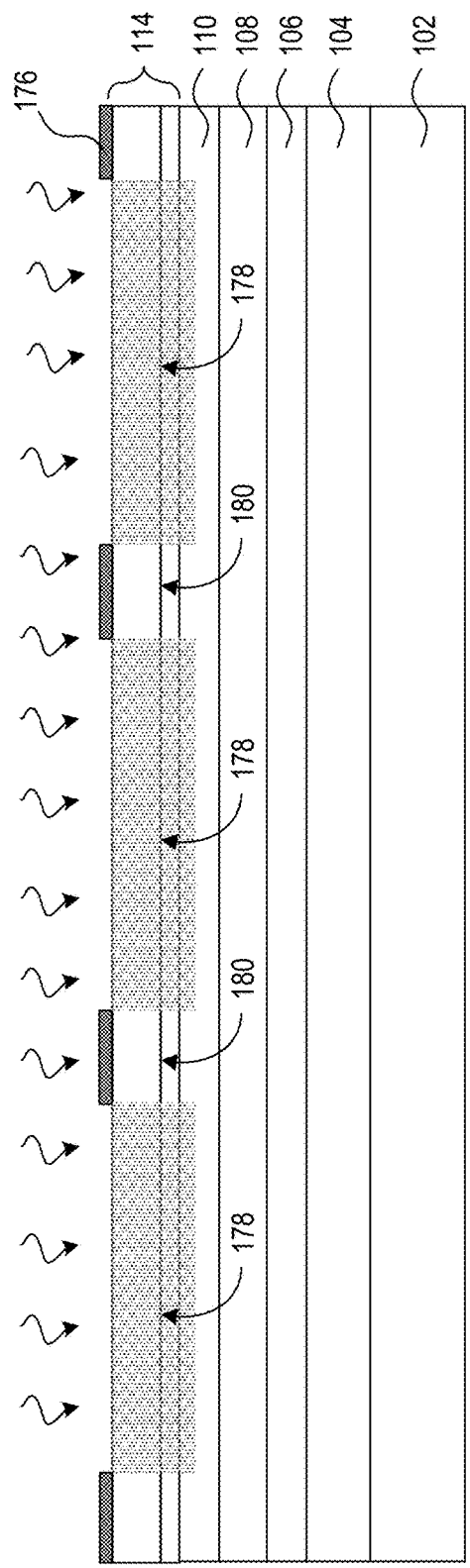
FIG. 22 is a cross-sectional side view illustration of forming a modified confinement barrier region within a current distribution layer by implantation in accordance with an embodiment of the invention.

Referring now to FIGS. 22-25, embodiments are illustrated for confining current that flows through the active layer to an interior portion of the LED device and away from sidewalls of the LED device by implantation or diffusion into the current spreading layer 104. Referring to FIG. 22, a patterned implantation mask 176 such as, but not limited to, silicon oxide or silicon nitride is formed over the current distribution layer 114 followed by implantation to form modified confinement barrier regions 178 that laterally surround a current injection region 180. As illustrated, an unmodified current injection region 180 remains within the current spreading layer 114, and the modified confinement barrier region 178 is formed within the current spreading layer 114 and laterally surrounds the injection region 180. The modified confinement barrier region 178 may extend partially into the cladding layer 110. In an embodiment, the modified confinement barrier region 178 does not extend into the one or more quantum wells within the active layer 108. In an alternative embodiment, the modified confinement barrier region 178 extends through the active layer 108.

Figure 23:
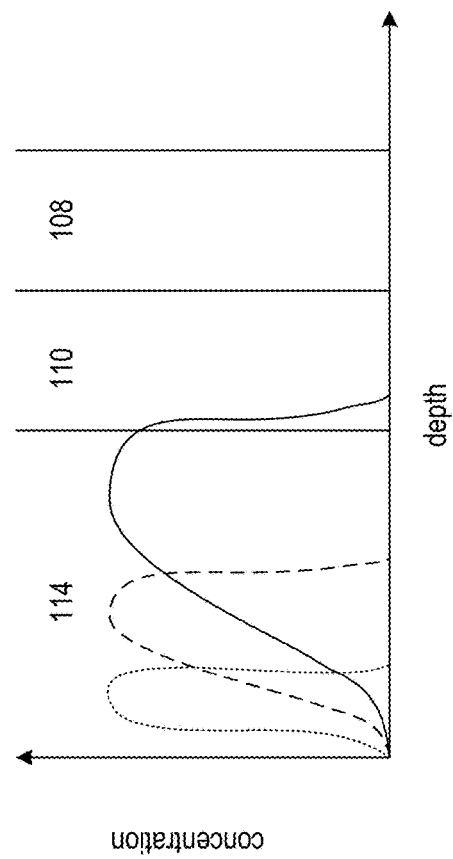
FIG. 23 is a graphical illustration of several implantation profiles in accordance with an embodiment of the invention.

Referring to FIG. 23, in an embodiment, implantation is accomplished with a series of implantation operations. For example, a high energy implantation operation may be first as indicated by the solid concentration profile, followed by successively lower implantation operations in order to achieve a more uniform implant concentration within the current spreading layer 114. In an embodiment, the implantation does not extend into the one or more quantum wells in the active layer since it is expected that the creation of defects in the one or more quantum wells may result in sites for non-radiative recombination. In an alternative embodiment, the implantation extends through the active layer.

A variety of species may be implanted into the current spreading layer 114. In one embodiment, a neutral species is implanted into the current spreading layer 114 to create defects to current spreading. For example, He or H can be implanted, also known as proton bombardment or proton implantation. The damage created by proton bombardment in turn increases the resistivity of the implanted material. In an embodiment, implantation extends through the active layer 108. In such an embodiment, the amount of damage is significant enough to increase resistivity for current confinement while not too much damage to act as a significant source for non-radiative recombination.

In an embodiment, a dopant is implanted into the current spreading layer 114 to increase the resistivity of the current spreading layer, render the current spreading layer semi-insulating, or change the overriding dopant type of the layer (e.g. from p-type to n-type). For example, Si may be implanted into a p-doped current spreading layer 114, and Zn or Mg may be implanted into an n-doped current spreading layer 114. Or Fe, Cr, Ni, or some other such dopant can be added to make the layer semi-insulting.

Referring to FIG. 24 a modified confinement barrier region 178 may also be formed by thermal diffusion from a donor layer 182. A capping layer 184 (e.g. oxide) may optionally be formed over the donor layer 182 to direct diffusion into the current distribution layer 114. In an embodiment, a dopant is diffused into the current spreading layer 114 to increase the resistivity of the current spreading layer, render the current spreading layer semi-insulating, or change the overriding dopant type of the layer (e.g. from p-type to n-type). For example, Si may be diffused into a p-doped current spreading layer 114 from a silicon donor layer 182, and Zn or Mg may be implanted into an n-doped current spreading layer 114 from a Zn or Mg donor layer 182. Following the diffusion operation, the donor layer 182 and capping layer 184 are removed.

Following the implantation or diffusion operations to form the modified confinement barrier region 178, the p-n diode layer may be transferred from the handle substrate 102 to a carrier substrate 140 using a processing sequence similar to the one previously described above with regard to FIGS. 5-10, resulting in the structure illustrated in FIG. 25. In interest of conciseness the processing sequence is not separately described and illustrated.

Referring to FIG. 26A, in an embodiment, the modified confinement barrier region 179 may be fabricated through diffusion or implantation with a rapid thermal anneal to extend through the one or more quantum wells of the active layer 108 to accomplish quantum well intermixing which creates a modified confinement barrier region 179 of the active layer 108 that has a larger bandgap and laterally surrounds a current injection region 181 within the active layer in order to confine current that flows through the active layer to an interior portion of the LED device and away from sidewalls of the LED device. Intermixing of the one or more quantum wells may be accomplished using diffusion or implantation with RTA as previously described with regard to the modified confinement barrier region 178. Similarly, in such an embodiment, the unmodified injection region 181 and modified confinement barrier region 179 are formed within the quantum well layer 108. One difference of the modified confinement barrier region 179 of FIG. 26A for quantum well intermixing, and the modified confinement barrier region 178 of FIG. 25 for isolation of the current distribution layer is that the modified confinement barrier region 179 of FIG. 26A can be largely concentrated in or about the active layer 108 to create quantum well intermixing. Accordingly, it is not necessary to achieve a uniform protons or impurity concentration profile outside of the active layer 108. In an embodiment, a significant concentration of protons or impurities is implanted within the active region 108 to facilitate inter-diffusion of Al and Ga between the quantum wells and the confinement barrier. In an embodiment, the impurity is Si.

Intermixing of the quantum wells may result in the transformation of multiple quantum wells separated by barrier layers to a single intermixed layer with a larger bandgap than the original quantum wells. FIG. 26B provides a graphical illustration of the bandgap energy between the conduction and valence bands for three quantum wells, each sandwiched between a barrier layer prior to quantum well intermixing in accordance with an embodiment of the invention. For example, the quantum well layer and barrier layer may be similar to those described above with regard to FIG. 2B. While three quantum well layer are illustrated, it to be understood that such an embodiment is exemplary, and that the active layer may include one or more quantum well layers. FIG. 26C provides a graphical illustration of the bandgap energy between the conduction and valence bands of the structure of FIG. 26A after quantum well intermixing. As illustrated, atoms diffuse in the crystal structure preferentially along the point defects created by implantation or diffusion transferring the previously distinct multiple quantum wells and barrier layers into an intermixed modified confinement barrier region 179 with a uniform composition that is an average of the original well and barrier compositions. In this way the new layer has an overall larger bandgap than the original one or more quantum wells. This increase in bandgap enables lateral current confinement within the injection region 181. Aluminum in particular has been observed to have a high diffusion coefficient. In one embodiment, quantum well intermixing is accomplished by diffusion of aluminum from one or more barrier layers containing a higher aluminum concentration than an adjacent quantum well layer. In an embodiment, aluminum is diffused into the active layer from the surrounding aluminum containing cladding layers 106, 108.

Figure 27:
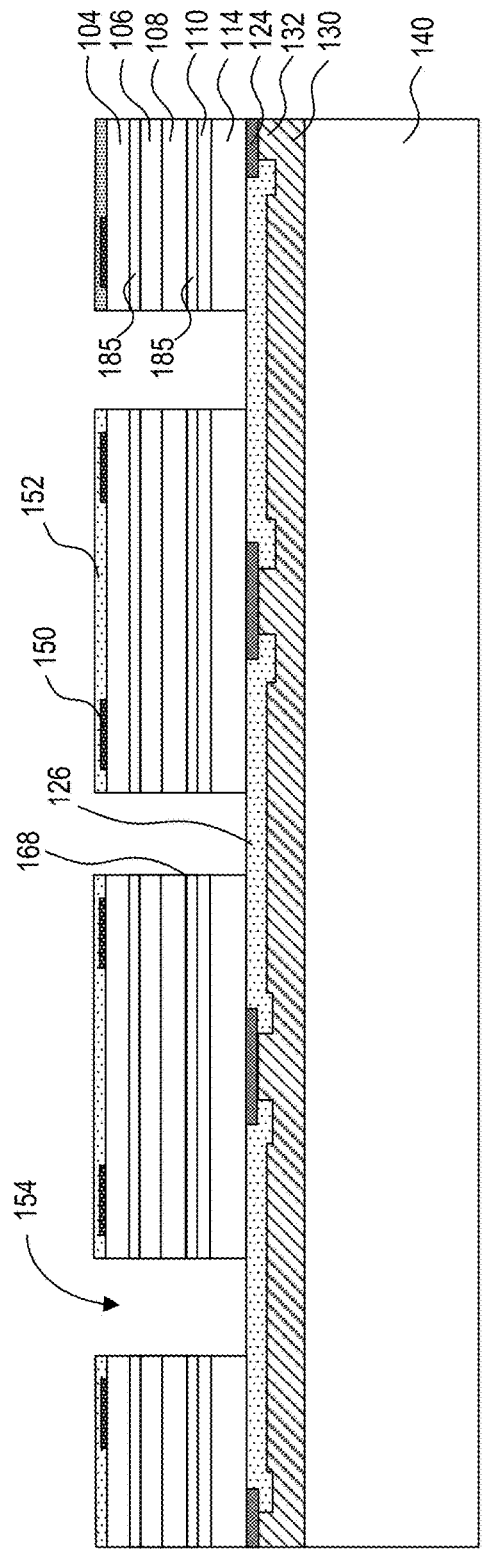
FIGS. 27-28 are cross-sectional side view illustrations of a one-sided process for forming an array of LED devices including an oxidized cladding layer in accordance with an embodiment of the invention.
Figure 28:
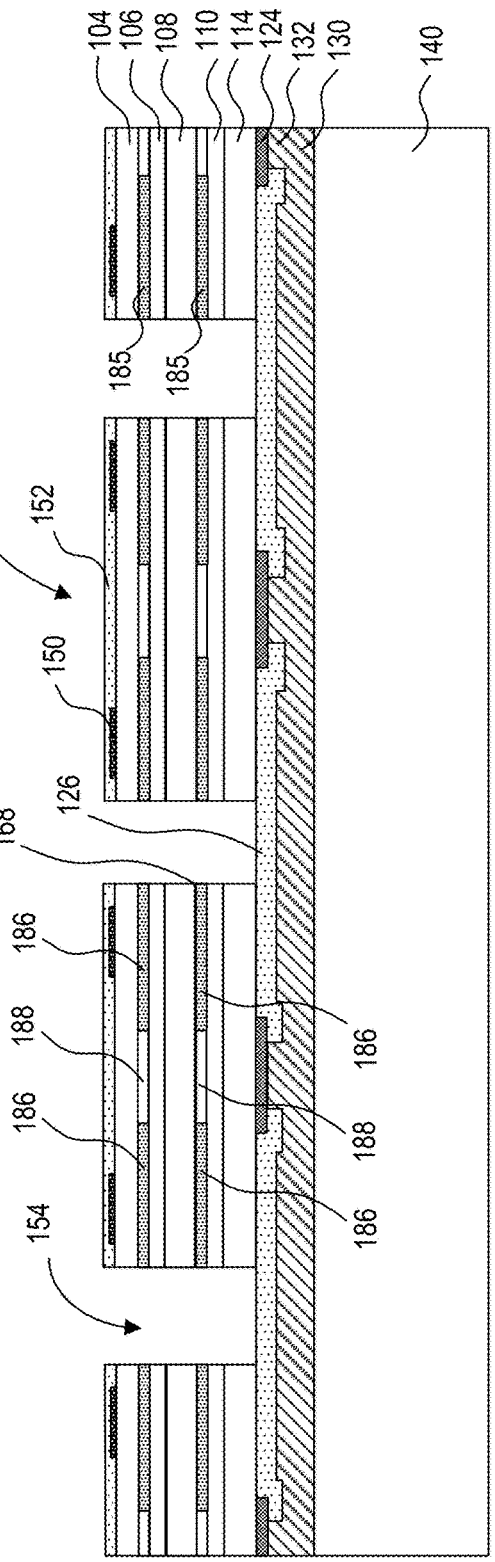

Referring now to FIGS. 27-28 cross-sectional side view illustrations are provided for a one-sided process for forming an array of LED devices including one or more oxidized confinement layers in accordance with an embodiment of the invention. Referring to FIG. 27, the LED devices may be fabricated in accordance with the one-sided processing techniques as described above. The LED devices illustrated in FIG. 27 are essentially functionalized LED devices prior to removal of the sacrificial release layer 126, and without the formation of a current confinement structure. One difference, however, is the inclusion of one or more oxidizable confinement layers 185. The one or more oxidizable confinement layers may be located at a variety of locations within the LED device, such as either above or below the cladding layers. For example, an oxidizable confinement layer 185 is illustrated as being between confinement layer 106 and current distribution layer 104. However, other configurations are possible. For example, an oxidizable confinement layer 185 is illustrated as being between confinement layer 110 and active layer 108. A variety of locations are possible, and embodiments are not limited to those specifically illustrated. In an embodiment, the one or more oxidizable confinement layers 185 are more readily oxidized than other layers within the LED devices. For example, the one or more oxidizable confinement layers 185 may be characterized by a comparatively higher aluminum concentration than the other layers within the p-n diode structure 115. In such a configuration the current injection region includes a first current injection region located within the oxidizable confinement layer, and the current confinement region includes a first oxidized region of the oxidizable confinement layer that laterally surrounds the first current injection region. Referring now to FIG. 28, prior to removal of the sacrificial release layer 126 the LED devices are subjected to an oxidation operation, for example a wet oxidation operation, in order to laterally oxidize one or more confinement layers 185. As illustrated, lateral oxidation of a confinement layer 185 results in a first oxidized region 186 (current confinement region) that laterally surrounds a first current injection region 188 of the oxidizable confinement layer 185 to confine current that flows through the active layer 108 to an interior portion of the LED device and away from sidewalls 168 of the LED device.

Following lateral oxidation of the one or more oxidizable confinement layers 185 the sacrificial release layer 126 spanning between and directly underneath the array of LED devices may be removed similarly as described above with regard to FIG. 11A to condition the array of LED devices so that they are poised for pick up and transfer to a receiving substrate. In an embodiment, oxidized regions 186 include Al$_2$O$_3$ and sacrificial release layer 126 includes SiO$_2$. In such an embodiment, the SiO$_2$ sacrificial release layer 126 may be selectively removed with regard to the Al$_2$O$_3$ regions 186.

In an embodiment a sidewall passivation layer may be formed along sidewalls 168 of the LED devices. For example, a sidewall passivation layer may be used to protect the oxidized regions 186 from etching during removal of the sacrificial release layer 126. A sidewall passivation layer can serve other purposes, such as protecting the active layer from shorting when forming a top contact layer upon transfer to a receiving substrate, and shorting between adjacent LED devices during an electrostatic transfer operation. A sidewall passivation layer can be formed with the one-sided process as previously described. In an embodiment, a sidewall passivation layer is formed using a two-sided process as described with regard to FIGS. 29-32. Referring to FIG. 29, mesa trenches 154 are formed through the p-n diode layer 105 while supported by the handle (growth) substrate 102. Following the formation of mesa trenches 154, the mesa structures are subjected to an oxidation operation, for example a wet oxidation operation, in order to laterally oxidize one or more oxidizable confinement layers 185 as illustrated in FIG. 30.

Figure 31:
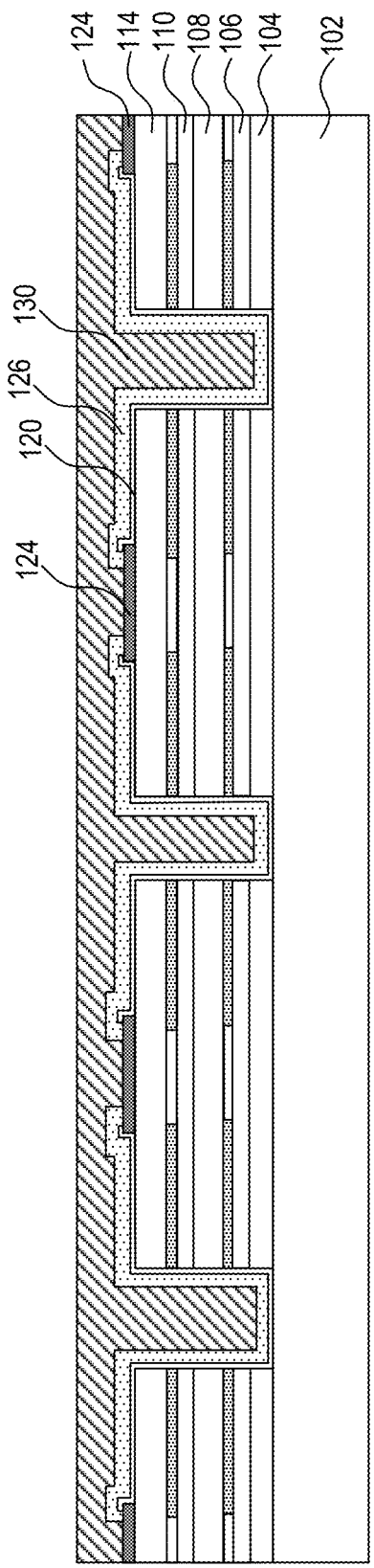
Figure 32:
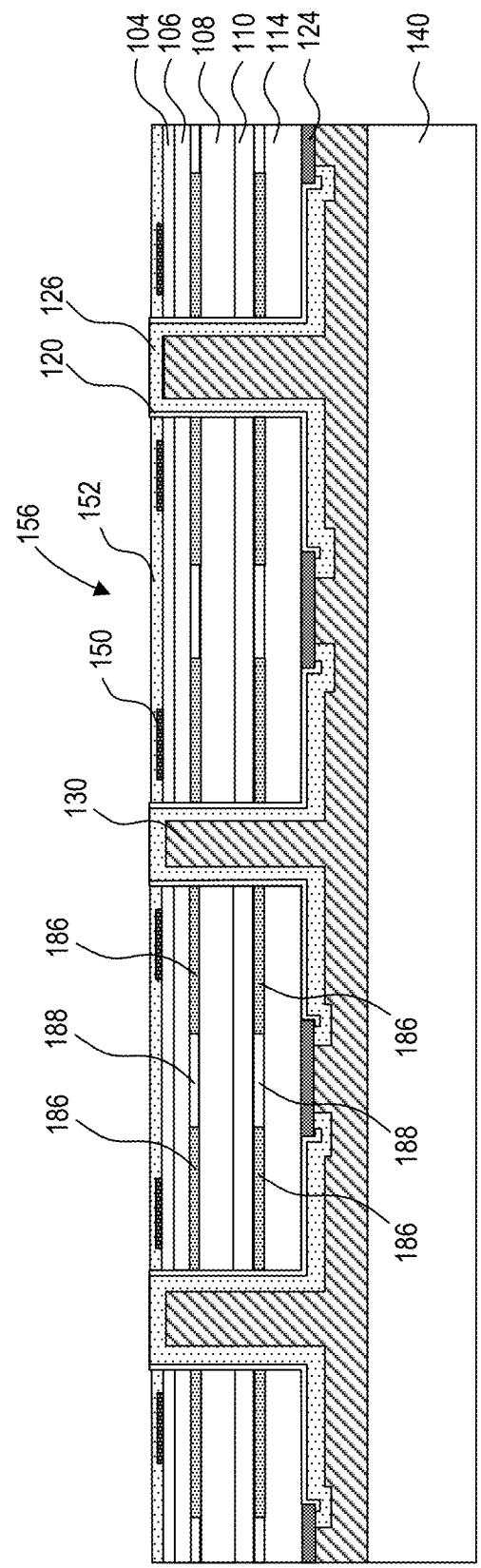

Referring to FIG. 31, a sidewall passivation layer 120 is formed over the mesa structures, and openings formed in the passivation layer 120 to expose contacts 124. Sacrificial release layer 126 is then formed over the passivation layer 120 and patterned to form an opening exposing contacts 124. A stabilization layer 130 may then be formed over the structure for bonding to a receiving substrate. FIG. 32 is a cross-sectional side view illustration of an array of LED devices including oxidized confinement layers 185 after transfer to a receiving substrate and prior to removal of the sacrificial release layer 126 in accordance with an embodiment of the invention. While not illustrated in detail, ohmic contact layer 150 and conductive contact 152 are formed after removal of the growth substrate 102.

Figure 33:
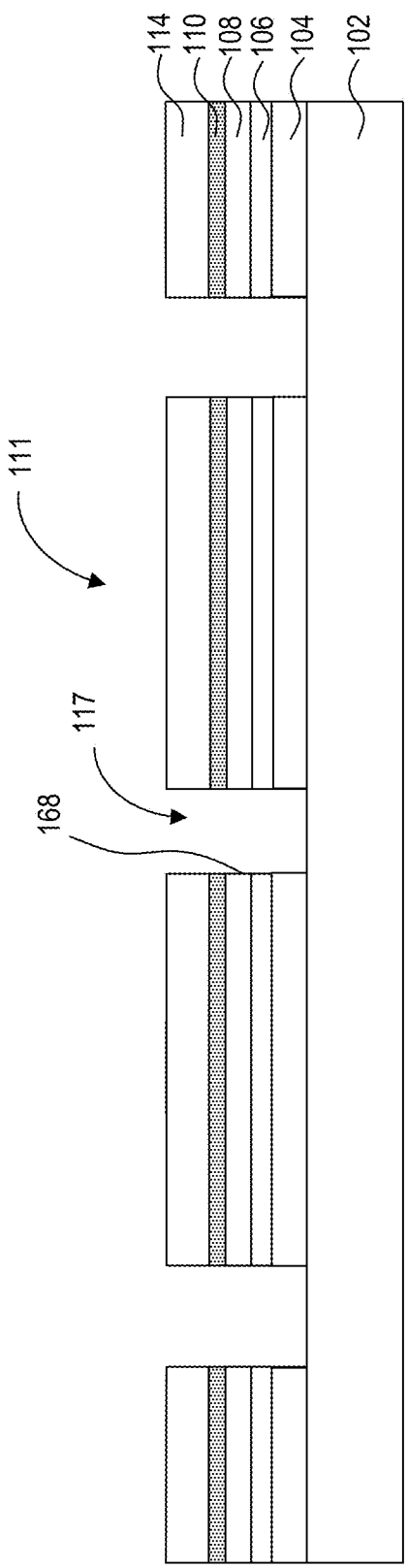
FIG. 33 is a cross-sectional side view illustration of a doped current spreading layer in accordance with an embodiment of the invention.
Figure 34:
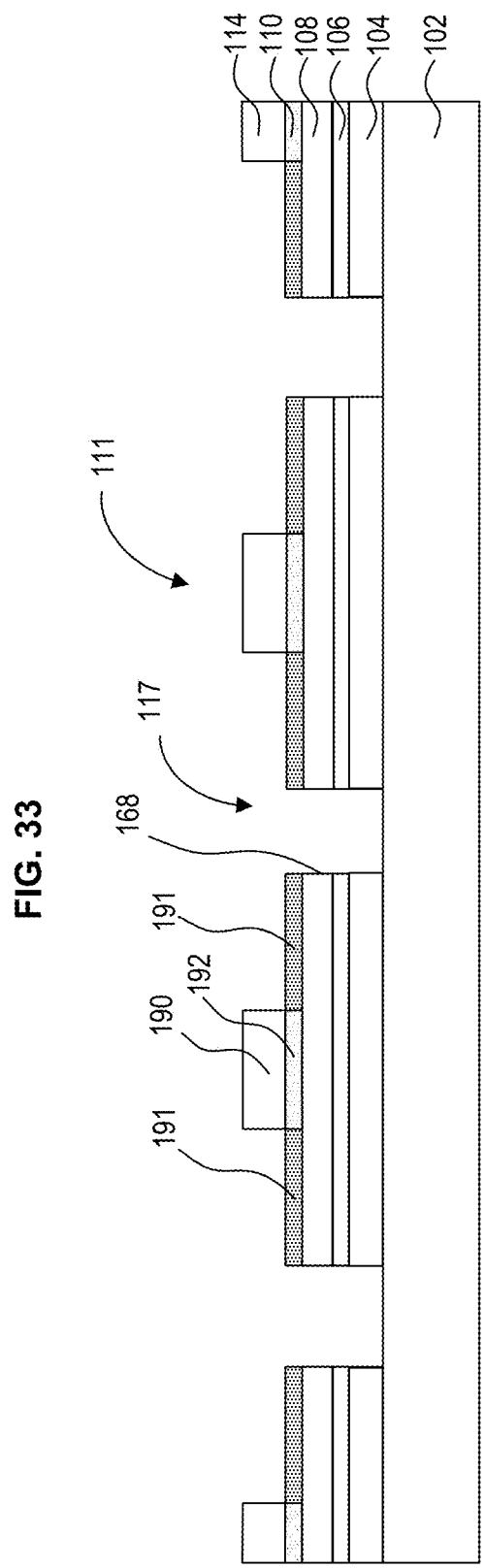
FIG. 34 is a cross-sectional side view illustration of an array of doped current spreading layer pillars and doped cladding layer regions in accordance with an embodiment of the invention.
Figure 35:
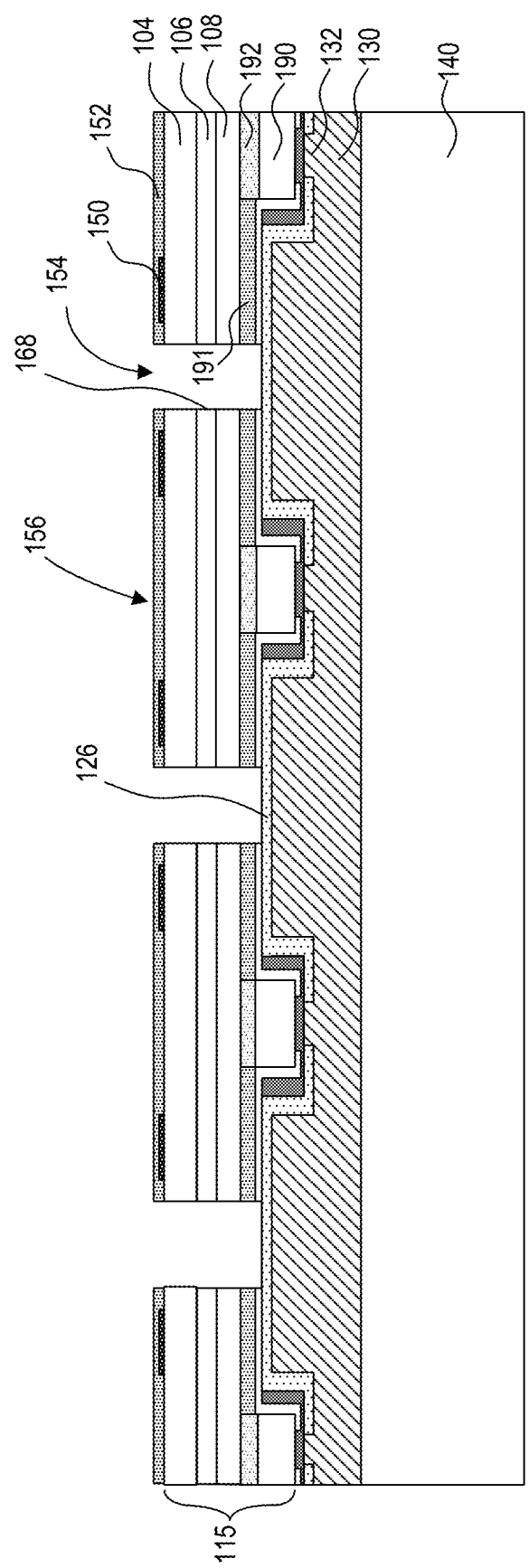
FIG. 35 is a cross-sectional side view illustration of an array of LED devices with doped current spreading layer pillars and doped cladding layer regions in accordance with an embodiment of the invention.

Referring now to FIGS. 33-35, cross-sectional side view illustrations are provided for a manner of forming an array of LED devices including a current confinement region which is formed within a cladding layer adjacent to a current spreading layer pillar. FIG. 33 is a cross-sectional side view illustration of a doped current spreading layer 114 in accordance with an embodiment of the invention. FIG. 33 may be substantially similar to the structure illustrated and described with regard to FIG. 2A with one difference being doping within current spreading layer 114 and/or cladding layer 110. In an embodiment illustrated in FIG. 33, a highly doped current spreading layer 114 is formed over an undoped cladding layer 110. For example, a p-doped current spreading layer 114 may be highly doped with a Zn or Mg dopant. Referring to FIG. 34, the doped current spreading layer 114 is then patterned to form an array of current spreading layer pillar 190 similarly as described with regard to FIG. 3, followed by annealing to drive dopants from the current spreading layer pillar 190 into the underlying cladding layer 110, forming a doped current injection region 192 laterally surrounded by an undoped current confinement region 191 within the cladding layer 110 to confine current that flows through the active layer 108 to an interior portion of the LED device and away from the sidewalls of the LED device. Following diffusion of dopants into the cladding layer 110, the structure may be patterned as described above with regard to FIGS. 4-10 resulting in the structure illustrated in FIG. 35.

Figure 36A:
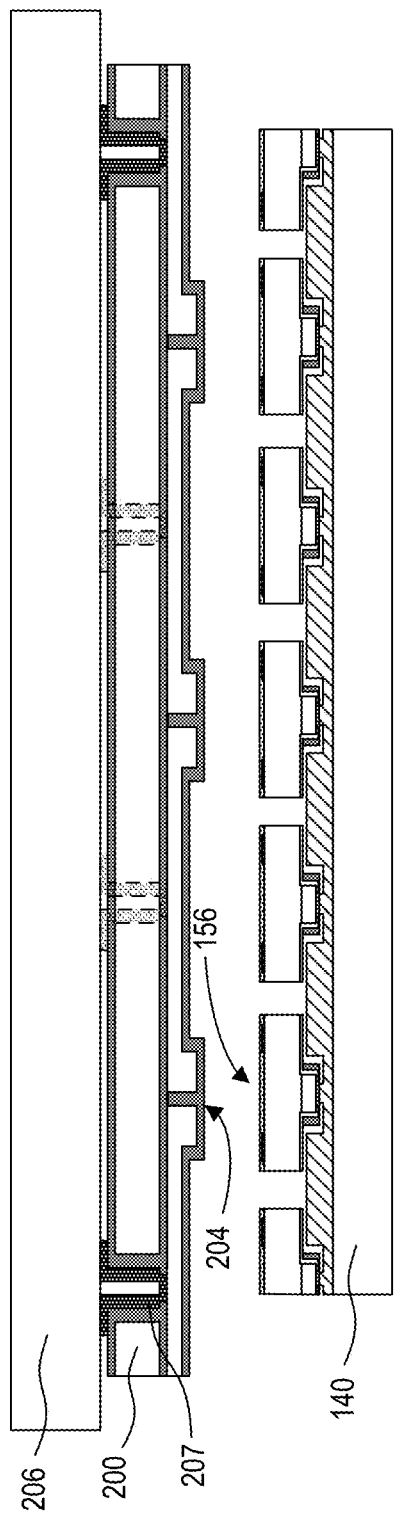
FIG. 36A-36E are cross-sectional side view illustrations of an array of electrostatic transfer heads transferring LED devices from carrier substrate to a receiving substrate in accordance with an embodiment of the invention.
Figure 36B:
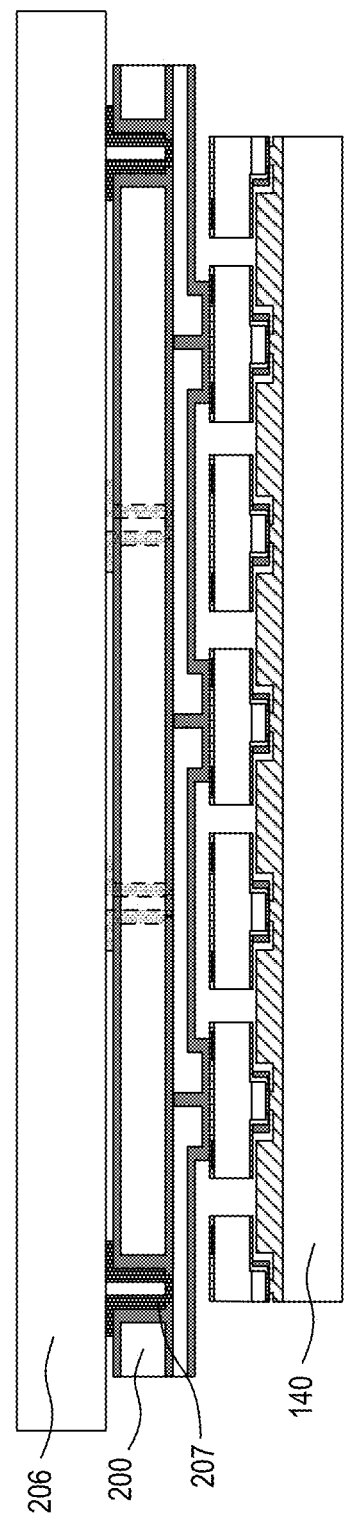

FIGS. 36A-36E are cross-sectional side view illustrations of an array of electrostatic transfer heads 204 transferring LED devices 156, which may be micro LED devices, from carrier substrate 140 to a receiving substrate 300 in accordance with an embodiment of the invention. While FIGS. 36A-36E illustrate the transfer and integration of the specific LED devices of FIG. 11A, this is intended to be exemplary, and the transfer and integration sequence described and illustrated in FIGS. 36A-36E can be used for the transfer and integration of any of the LED devices described herein. FIG. 36A is a cross-sectional side view illustration of an array of micro device transfer heads 204 supported by substrate 200 and positioned over an array of LED devices 156 stabilized on stabilization posts 132 of stabilization layer 130 on carrier substrate 140. The array of LED devices 156 is then contacted with the array of transfer heads 204 as illustrated in FIG. 36B. As illustrated, the pitch of the array of transfer heads 204 is an integer multiple of the pitch of the array of LED devices 156. A voltage is applied to the array of transfer heads 204. The voltage may be applied from the working circuitry within a transfer head assembly 206 in electrical connection with the array of transfer heads through vias 207.

Figure 36C:
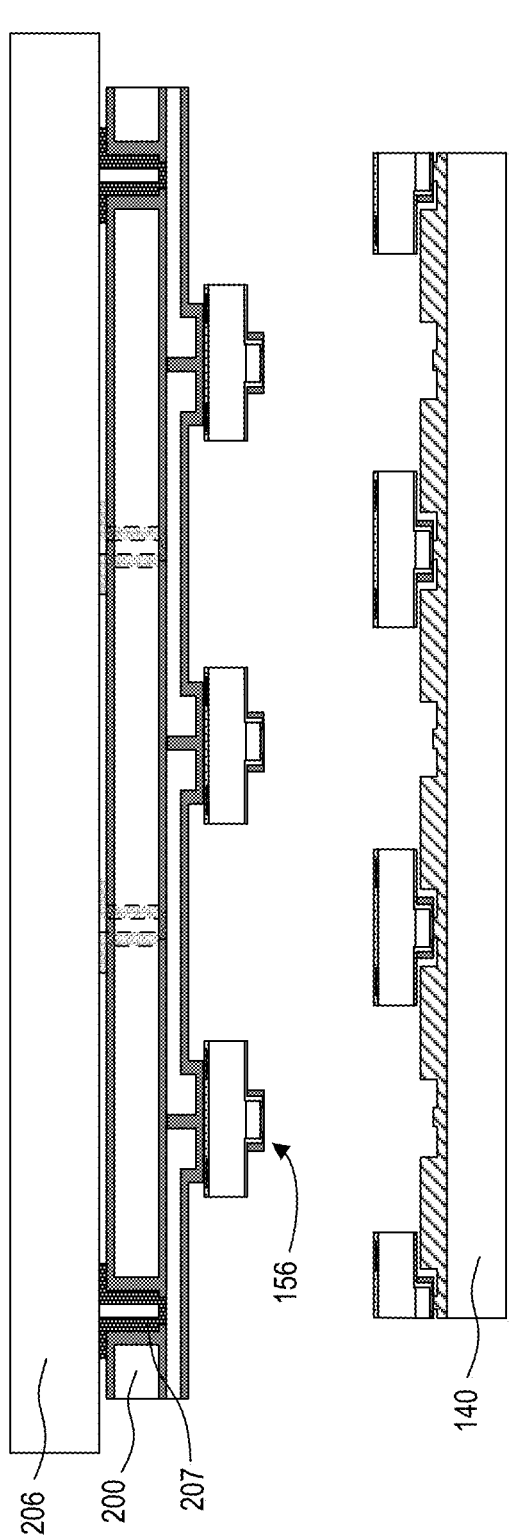
Figure 36D:
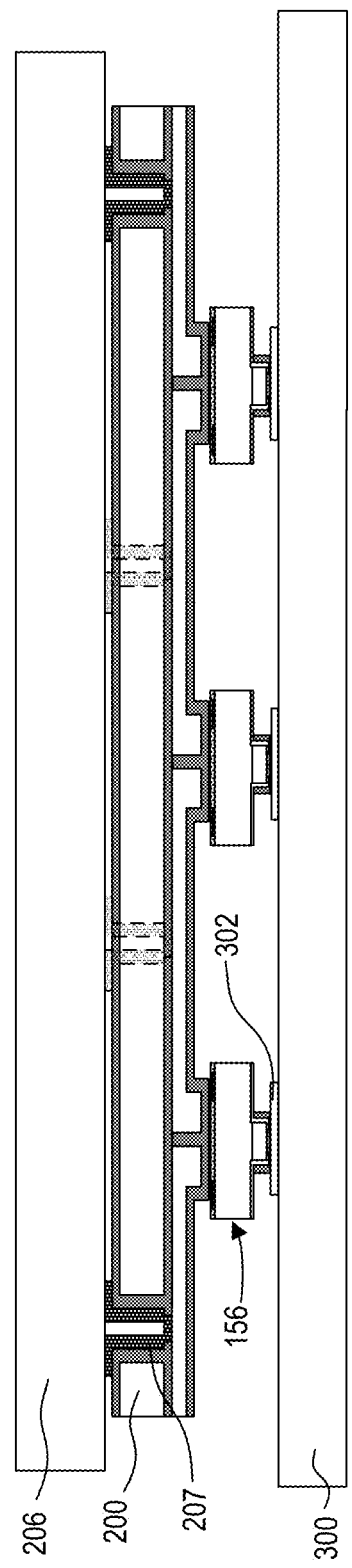
Figure 36E:
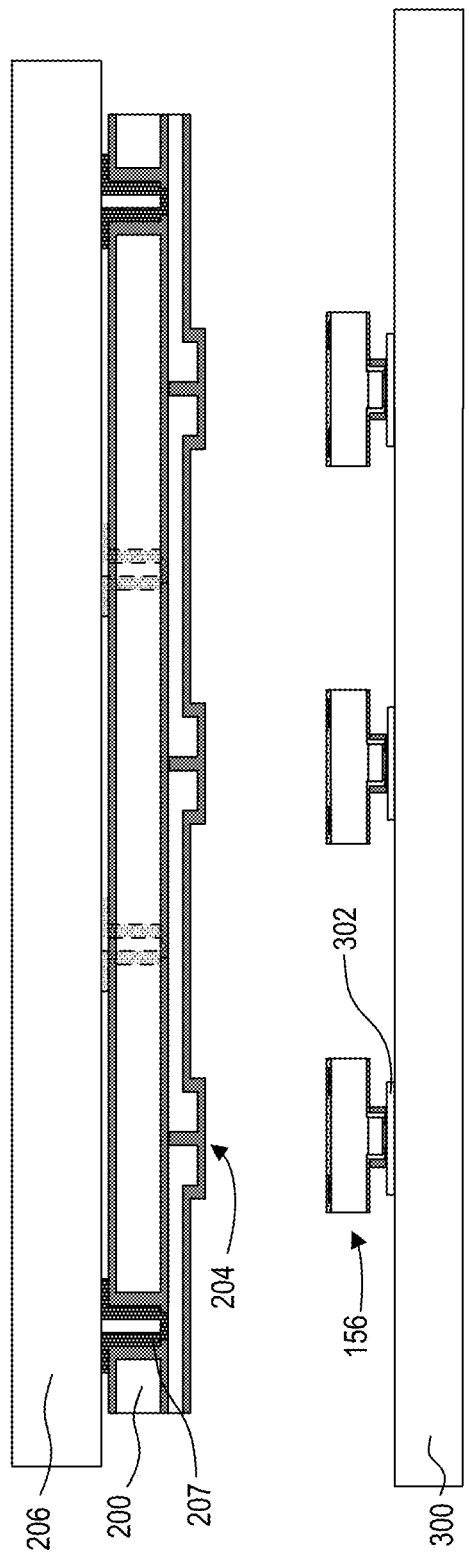

The array of LED devices 156 is then picked up with the array of transfer heads 204 as illustrated in FIG. 36C. The array of LED devices 156 is then placed in contact with contact pads 302 (e.g. gold, indium, tin, etc.) on a receiving substrate 300, as illustrated in FIG. 36D. The array of LED devices 156 is then released onto contact pads 302 on receiving substrate 300 as illustrated in FIG. 36E. For example, the receiving substrate may be, but is not limited to, a display substrate, a lighting substrate, a substrate with functional devices such as transistors or ICs, or a substrate with metal redistribution lines.

In accordance with embodiments of the invention, heat may be applied to the carrier substrate, transfer head assembly, or receiving substrate during the pickup, transfer, and bonding operations. For example, heat can be applied through the transfer head assembly during the pick up and transfer operations, in which the heat may or may not liquefy LED device bonding layers. The transfer head assembly may additionally apply heat during the bonding operation on the receiving substrate that may or may not liquefy one of the bonding layers on the LED device or receiving substrate to cause diffusion between the bonding layers.

The operation of applying the voltage to create a grip pressure on the array of LED devices can be performed in various orders. For example, the voltage can be applied prior to contacting the array of LED devices with the array of transfer heads, while contacting the LED devices with the array of transfer heads, or after contacting the LED devices with the array of transfer heads. The voltage may also be applied prior to, while, or after applying heat to the bonding layers.

Where the transfer heads 204 include bipolar electrodes, an alternating voltage may be applied across a pair of electrodes in each transfer head 204 so that at a particular point in time when a negative voltage is applied to one electrode, a positive voltage is applied to the other electrode in the pair, and vice versa to create the pickup pressure. Releasing the array of LED devices from the transfer heads 204 may be accomplished with a varied of methods including turning off the voltage sources, lowering the voltage across the pair of electrodes, changing a waveform of the AC voltage, and grounding the voltage sources.

Figure 37A:
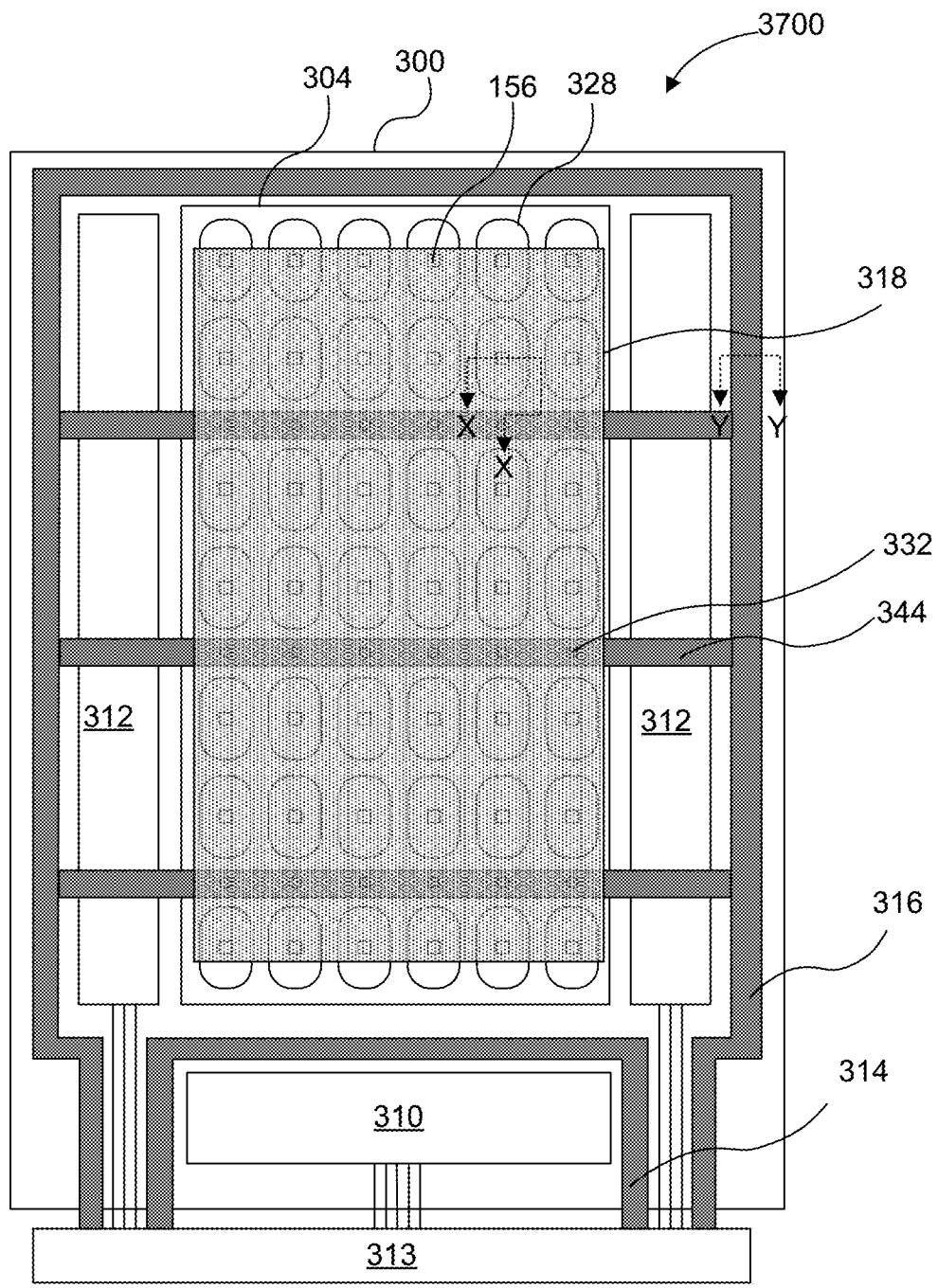
FIG. 37A is a top view illustration of a display panel in accordance with an embodiment of the invention.
Figure 37B:
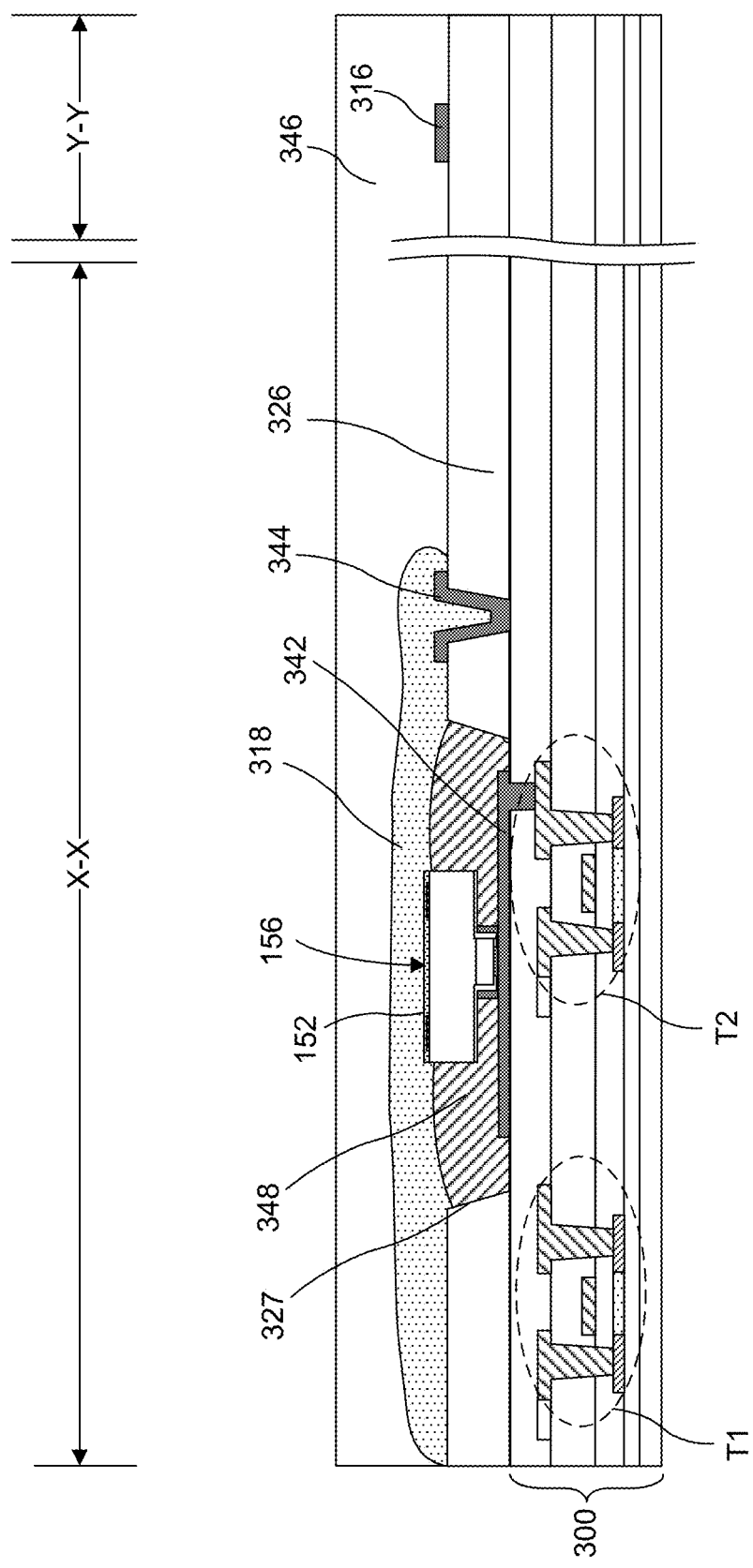
FIG. 37B is a side-view illustration of the display panel of FIG. 37A taken along lines X-X and Y-Y in accordance with an embodiment of the invention.
Figure 37C:
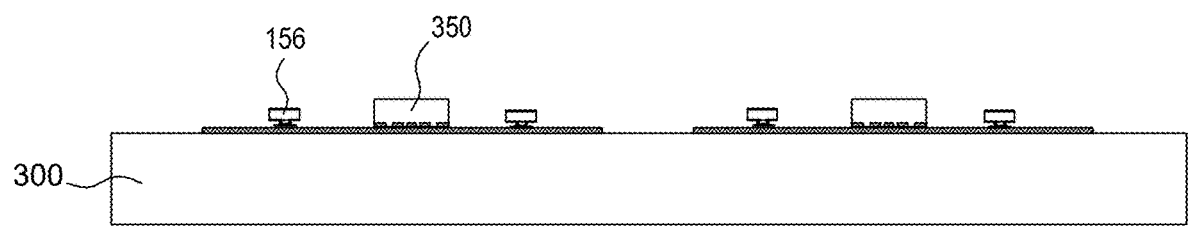
FIG. 37C is a side-view illustration of an LED device in electrical connection with a micro chip bonded to a display substrate in accordance with an embodiment of the invention.

Referring now to FIGS. 37A-37B, in an embodiment, an array of LED devices is transferred and bonded to a display substrate. For example, the display substrate 300 may be a thin film transistor (TFT) display substrate (i.e. backplane) similar to those used in active matrix OLED display panels. FIG. 37A is a top view illustration of a display panel 3700 in accordance with an embodiment of the invention. FIG. 37B is a side-view illustration of the display panel 3700 of FIG. 37A taken along lines X-X and Y-Y in accordance with an embodiment of the invention. In such an embodiment, the underlying TFT substrate 300 may include working circuitry (e.g. transistors, capacitors, etc.) to independently drive each subpixel 328. Substrate 300 may include a non-pixel area and a pixel area 304 (e.g. display area) including subpixels 328 arranged into pixels. The non-pixel area may include a data driver circuit 310 connected to a data line of each subpixel to enable data signals (Vdata) to be transmitted to the subpixels, a scan driver circuit 312 connected to scan lines of the subpixels to enable scan signals (Vscan) to be transmitted to the subpixels, a power supply line 314 to transmit a power signal (Vdd) to the TFTs, and a ground ring 316 to transmit a ground signal (Vss) to the array of subpixels. As shown, the data driver circuit, scan driver circuit, power supply line, and ground ring are all connected to a flexible circuit board (FCB) 313 which includes a power source for supplying power to the power supply line 314 and a power source ground line electrically connected to the ground ring 316. It is to be appreciated, that this is one exemplary embodiment for a display panel, and alternative configurations are possible. For example, any of the driver circuits can be located off the display substrate 300, or alternatively on a back surface of the display substrate 300. Likewise, the working circuitry (e.g. transistors, capacitors, etc.) formed within the substrate 300 can be replaced with micro chips 350 bonded to the top surface of the substrate 300 as illustrated in FIG. 37C. While FIGS. 37A-37C illustrate the integration of the specific LED devices of FIG. 11A, this is intended to be exemplary, and the integration sequence described and illustrated in FIGS. 37A-37C can be used for the transfer and integration of any of the LED devices described herein.

In the particular embodiment illustrated, the TFT substrate 300 includes a switching transistor T1 connected to a data line from the driver circuit 310 and a driving transistor T2 connected to a power line connected to the power supply line 314. The gate of the switching transistor T1 may also be connected to a scan line from the scan driver circuit 312. A patterned bank layer 326 including bank openings 327 is formed over the substrate 300. In an embodiment, bank openings 327 correspond to subpixels 328. Bank layer 326 may be formed by a variety of techniques such as ink jet printing, screen printing, lamination, spin coating, CVD, PVD and may be formed of opaque, transparent, or semi-transparent materials. In an embodiment, bank layer 326 is formed of an insulating material. In an embodiment, bank layer is formed of a black matrix material to absorb emitted or ambient light. Thickness of the bank layer 326 and width of the bank openings 327 may depend upon the height of the LED devices 156 transferred to and bonded within the openings, height of the electrostatic transfer heads, and resolution of the display panel. In an embodiment, exemplary thickness of the bank layer 326 is between 1 μm-50 μm.

Electrically conductive bottom electrodes 342, ground tie lines 344 and ground ring 316 may optionally be formed over the display substrate 300. In the embodiments illustrated an arrangement of ground tie lines 344 run between bank openings 327 in the pixel area 304 of the display panel 3700. Ground tie lines 344 may be formed on the bank layer 326 or alternative, openings 332 may be formed in the bank layer 326 to expose ground tie lines 344 beneath bank layer 326. In an embodiment, ground tie liens 344 are formed between the bank openings 327 in the pixel area and are electrically connected to the ground ring 316 or a ground line in the non-display area. In this manner, the Vss signal may be more uniformly applied to the matrix of subpixels resulting in more uniform brightness across the display panel 3700.

A passivation layer 348 formed around the LED devices 156 within the bank openings 327 may perform functions such as preventing electrical shorting between the top and bottom electrode layers 318, 342 and providing for adequate step coverage of top electrode layer 318 between the top conductive contacts 152 and ground tie lines 344. The passivation layer 348 may also cover any portions of the bottom electrode layer 342 to prevent possible shorting with the top electrode layer 318. In accordance with embodiments of the invention, the passivation layer 348 may be formed of a variety of materials such as, but not limited to epoxy, acrylic (polyacrylate) such as poly(methyl methacrylate) (PMMA), benzocyclobutene (BCB), polymide, and polyester. In an embodiment, passivation layer 348 is formed by ink jet printing or screen printing around the LED devices 156 to fill the subpixel areas defined by bank openings 327.

Top electrode layer 318 may be opaque, reflective, transparent, or semi-transparent depending upon the particular application. In top emission display panels the top electrode layer 318 may be a transparent conductive material such as amorphous silicon, transparent conductive polymer, or transparent conductive oxide. Following the formation of top electrode layer 318 an encapsulation layer 346 is formed over substrate 300. For example, encapsulation layer 346 may be a flexible encapsulation layer or rigid layer. In accordance with some embodiments of the invention, a circular polarizer may not be required to suppress ambient light reflection. As a result, display panels 3700 in accordance with embodiments of the invention may be packaged without a circular polarizer, resulting in increased luminance of the display panel.

In an embodiment, one or more LED devices 156 are arranged in a subpixel circuit. A first terminal (e.g. bottom conductive contact) of the LED device 156 is coupled with a driving transistor. For example, the LED device 156 can be bonded to a bonding pad coupled with the driving transistor. In an embodiment, a redundant pair of LED devices 156 are bonded to the bottom electrode 342 that is coupled with the driving transistor T2. The one or more LED devices 156 may be any of the LED devices described herein including a confined current injection area. A ground line is electrically coupled with a second terminal (e.g. top conductive contact) for the one or more LED devices.

A current can be driven through the one or more LED devices, for example, from the driving transistor T2. In a high side drive configuration the one or more LED devices may be on the drain side of a PMOS driver transistor or a source side of an NMOS driver transistor so that the subpixel circuit pushes current through the p-terminal of the LED device. Alternatively, the subpixel circuit can be arranged in a low side drive configuration in which case the ground line becomes the power line and current is pulled through the n-terminal of the LED device.

In accordance with embodiments of the invention, the subpixel circuit may operate at comparatively low currents or current densities in the pre-droop range of the characteristic efficiency curve of the LED devices, or near a maximum efficiency value past the pre-droop range. Thus, rather than increasing the size of the LED devices to increase efficiency, the effective size of the current injection area is confined in order to increase the current density within the LED device. In embodiments where the LED devices are utilized in display applications, as opposed to high-powered applications, the LED devices can operate at comparatively lower current ranges, where a slight increase in current density may result in a significant improvement in IQE and EQE of the LED devices.

In an embodiment, a subpixel circuit comprises a driving transistor, a first terminal (e.g. bottom electrically conductive contact) of an LED device with confined current injection area is coupled with the driving transistor, and a ground line is coupled with a second terminal (e.g. top electrically conductive contact) of the LED device. In an embodiment, the LED device is operated by driving a current through the LED device in response to sending a control signal to the driving transistor. In some embodiments, the current may range from 1 nA-400 nA. In an embodiment, the current ranges from 1 nA-30 nA. In an embodiment, an LED device is operated with a current from 1 nA-30 nA in a display having a 400 pixel per inch (PPI) resolution. In an embodiment, the current ranges from 200 nA-400 nA. In an embodiment, an LED device is operated with a current from 200 nA-400 nA in a display having a 100 PPI resolution. In some embodiments, an LED device is operated with a confined current density from 0.001 A/cm$^2$ to 40 A/cm$^2$. In an embodiment, the current density ranges from 0.001 A/cm$^2$ to 3 A/cm$^2$. In an embodiment, such a current density range may be applicable to a display having a 400 PPI resolution. In an embodiment, the current density ranges from 0.2 A/cm$^2$ to 4 A/cm$^2$. In an embodiment, such a current density range may be applicable to a display having a 100 PPI resolution.

The following examples are provided to illustrate the effect of current confinement, and the relationship of efficiency, current and current density for LED devices in accordance with embodiments of the invention. In accordance with embodiments of the invention, a designer may select a desired efficiency and luminance of an LED device with a characteristic efficiency curve, such as the exemplary efficiency curve illustrated in FIG. 1. Upon selecting the desired efficiency and luminance, the designer may tune the operating current and size of the confined current injection area (e.g. approximate current spreading layer pillar width) within the LED device to achieve the desired efficiency.

Example 1

In one embodiment, a display panel is a 5.5 inch full high definition display with 1920×1800 resolution, and 400 pixels per inch (PPI) including a 63.5 μm RGB pixel size. To achieve a 300 Nit output (white) with LED devices having a 10% EQE, the display panel uses approximately 10 nA-30 nA of current per LED, assuming one LED per subpixel. For an LED device with a 10×10 μm confined current injection area this corresponds to a current density of 0.01 A/cm$^2$-0.03 A/cm$^2$. This is well below the normal or designed operating conditions for standard LEDs.

Example 2

In an embodiment, the parameters of Example 1 are the same, with a smaller 1 μm×1 μm confined current injection area. With this reduced current injection area the corresponding current density increases to 1 A/cm$^2$-3 A/cm$^2$. Thus, Example 2 illustrates that at operating currents of 10 nA-30 nA, small changes in current injection area from 10 μm×10 μm to 1 μm×1 μm can have a significant effect on current density. In turn, the change in current density may affect efficiency of the LED device.

Example 3

In one embodiment, a display panel is a 5.5 inch full high definition display with 1920×1800 resolution, and 400 pixels per inch (PPI) including a 63.5 μm RGB pixel size. Each subpixel includes an LED device with a 10 μm×10 μm confined current injection area. Luminance is maintained at 300 Nit output (white). In this example, it is desired to achieve a 40% EQE. With this increased efficiency, lower operating currents may be used. In an embodiment, an operating current of 3 nA-6 nA per LED is selected. With these parameters an LED device with a 10 μm×10 μm confined current injection area operates at 0.003 A/cm$^2$-0.006 A/cm$^2$, and an LED device with a 1 μm×1 μm confined current injection area operates at 0.3 A/cm$^2$-0.6 A/cm$^2$.

Example 4

In one embodiment, a display panel is a 5.5 inch display with a lower resolution of 100 PPI including a 254 μm RGB pixel size. To achieve a 300 Nit output (white) with LED devices having a 10% EQE, the display panel uses a higher operating current of approximately 200 nA-400 nA of current per LED, assuming one LED per subpixel. For an LED device with a 10 µm×10 µm confined current injection area this corresponds to a current density of 0.2 A/cm$^2$-0.4 A/cm$^2$. A 1 µm×1 µm confined current injection area corresponds to a current density of 20 A/cm$^2$-40 A/cm$^2$, and a 3 µm×3 µm confined current injection area corresponds to a current density of 2 A/cm$^2$-4 A/cm$^2$. Thus, Example 4 illustrates that with lower resolution displays, there is a smaller density of LED devices, and higher operating currents are used to achieve a similar brightness (300 Nit) as higher resolution displays.

Example 5

In one embodiment, a display panel has 716 PPI including a 35 µm RGB pixel size. To achieve a 300 Nit output (white) with LED devices having a 10% EQE, the display panel uses an operating current of approximately 4-7 nA. With these parameters an LED device with a 10 µm×10 µm confined current injection area operates at 0.004 A/cm$^2$-0.007 A/cm$^2$, and an LED device with a 1 µm×1 µm confined current injection area operates at 0.4 A/cm$^2$-0.7 A/cm$^2$.

Example 6

In another embodiment the required brightness of the display is increased to 3000 Nit. In all examples above the required current would increase about 10× if the same EQE is targeted. Subsequently, the current density would also increase 10× for the above examples. In one embodiment the required operating brightness is a range from 300 Nit to 3000 Nit. The current and subsequently the current density would span a range of 1-10× the 300 Nit range. In the case of Examples 1 and 2 (above) where now 300 Nit to 3000 Nit is required, an LED device with a 10 µm×10 µm confined current injection area operates at a current density of 0.01 A/cm$^2$-0.3 A/cm$^2$ and an LED device with a 1 µm×1 µm confined current injection area operates at 1 A/cm$^2$-30 A/cm$^2$.

In each of the above exemplary embodiments, the brightness of the display is such that the LED devices are operating at very low current densities that are not typical of standard LEDs. The typical performance of standard LEDs show low IQEs at current densities below 1 A/cm$^2$. In accordance with embodiments of the invention, the current injection area is confined such that the current density can be increased to allow operation of the LED devices in a current density regime where IQE, and EQE, are optimized.

In an embodiment, the LED devices are bonded to a display substrate in a display area of the display substrate. For example, the display substrate may have a pixel configuration, in which the LED devices described above are incorporated into one or more subpixel arrays. The size of the LED devices may also be scalable with the available area of the subpixels. In some embodiments, the LED devices are bonded to a display substrate having a resolution of 100 PPI or more. In the Examples provided above, exemplary red-green-blue (RGB) pixel sizes of 35 µm were described for a display having 716 PPI, RGB pixels sizes of 63.5 µm were described for a display having 400 PPI, and RGB pixels sizes of 254 µm were described for a display having 100 PPI. In some embodiments, the LED devices have a maximum width of 100 µm or less. As display resolution increases, the available space for LED devices decreases. In some embodiments, the LED devices have a maximum width of 20 µm or less, 10 µm or less, or even 5 µm or less. Referring back to the above discussion with regard to FIGS. 12A-12C, a non-radiative zone may occur along exterior surfaces of the active layer (e.g. along sidewalls of the LED devices), affecting efficiency of the LED devices. In accordance with embodiments of the invention, current injection regions are formed within the LED devices to confine current that flows through the active layer to an interior portion of the LED device and away from sidewalls of the LED device. In some embodiments, the current injection region is created by forming a current spreading layer in a pillar configuration, in which the current spreading layer pillar protrudes from a cladding layer, and the width of the current spreading layer pillar may be adjusted relative to the width of the LED device (e.g. width of the active layer) in order to confine current within an interior of the active layer. In such a configuration the current injection region corresponds to the width or diameter of the current spreading layer pillar. In other embodiments, the current injection region is created by forming a current confinement region laterally surrounding the current injection region. For example, this may be accomplished by mesa regrowth of a confinement barrier fill, modification of a current spreading layer by implantation or diffusion, quantum well intermixing, and/or cladding layer oxidation. It is to be appreciated that while the above embodiments for providing a confined current injection region have been described separately, that some of the embodiments may be combined. In some embodiments, the current injection region has a width between 1 and 10 µm. In an embodiment, the current injection region has a width or diameter of approximately 2.5 µm.

Figure 38:
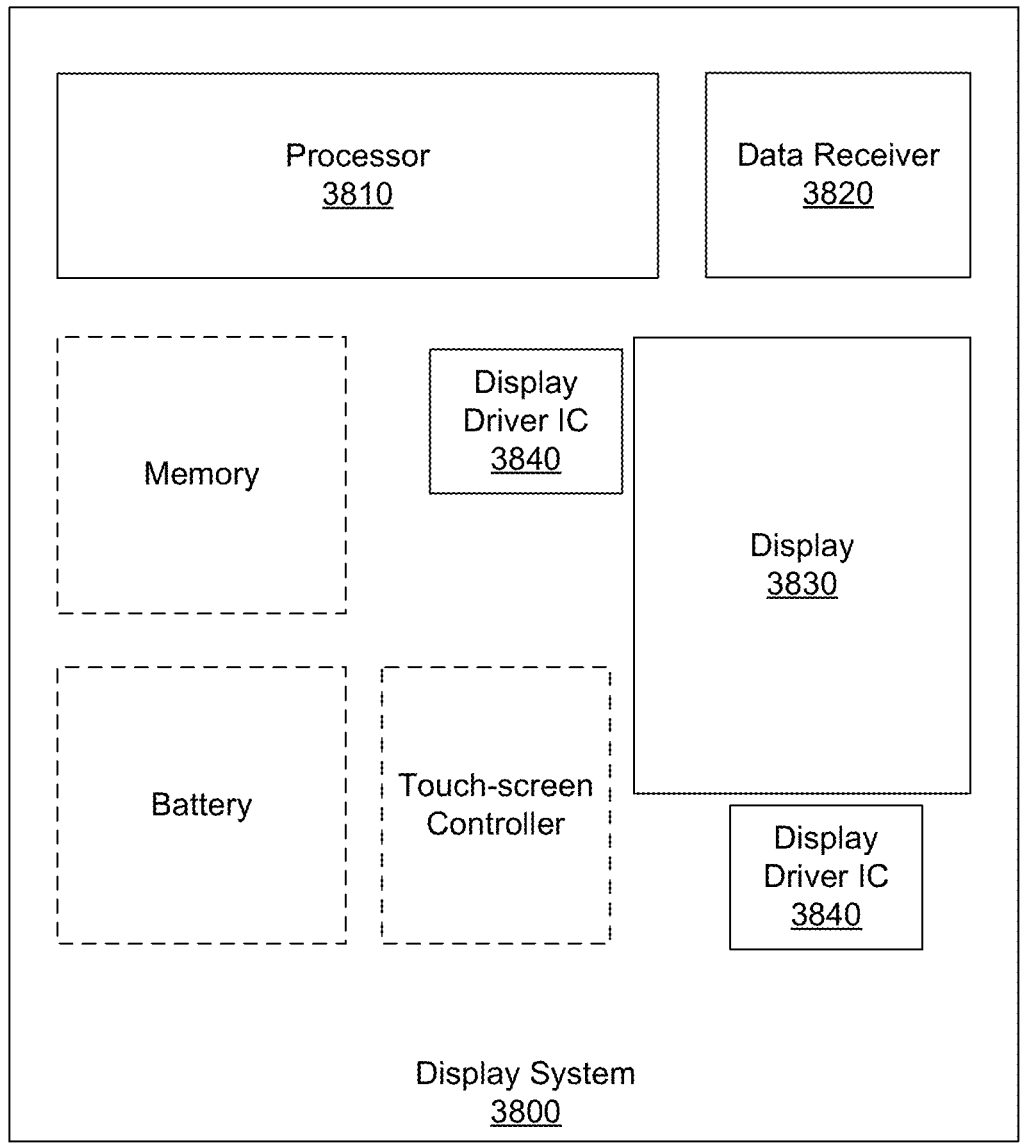
FIG. 38 is a schematic illustration of a display system in accordance with an embodiment of the invention.

FIG. 38 illustrates a display system 3800 in accordance with an embodiment. The display system houses a processor 3810, data receiver 3820, a display 3830, and one or more display driver ICs 3840, which may be scan driver ICs and data driver ICs. The data receiver 3820 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 3840 may be physically and electrically coupled to the display 3830.

In some embodiments, the display 3830 includes one or more LED devices 156 that are formed in accordance with embodiments of the invention described above. Depending on its applications, the display system 3800 may include other components. These other components include, but are not limited to, memory, a touch-screen controller, and a battery. In various implementations, the display system 3800 may be a television, tablet, phone, laptop, computer monitor, kiosk, digital camera, handheld game console, media display, ebook display, or large area signage display.

Figure 39:
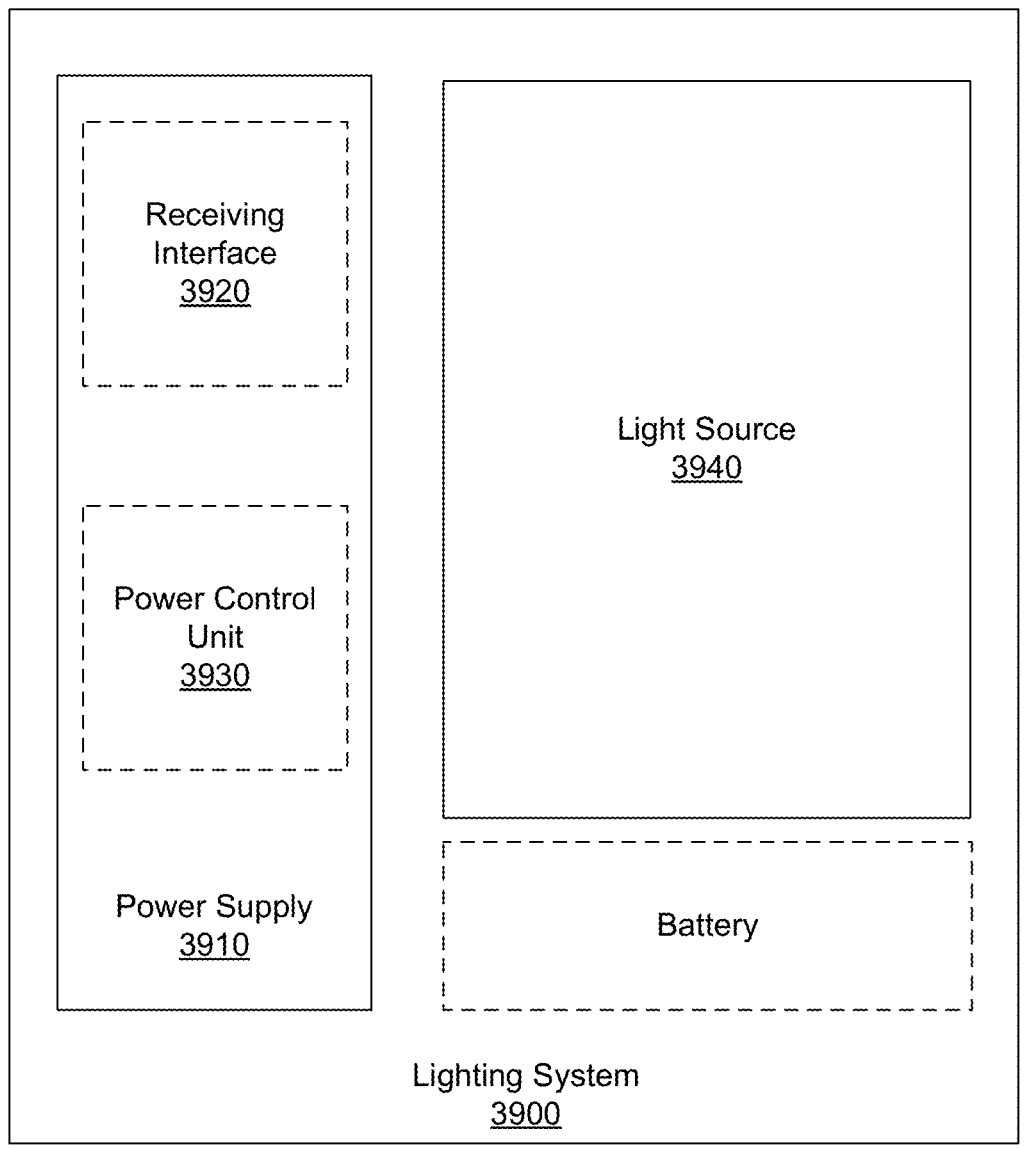
FIG. 39 is a schematic illustration of a lighting system in accordance with an embodiment of the invention.

FIG. 39 illustrates a lighting system 3900 in accordance with an embodiment. The lighting system houses a power supply 3910, which may include a receiving interface 3920 for receiving power, and a power control unit 3930 for controlling power to be supplied to the light source 3940. Power may be supplied from outside the lighting system 3900 or from a battery optionally included in the lighting system 3900. In some embodiments, the light source 3940 includes one or more LED devices 156 that are formed in accordance with embodiments of the invention described above. In various implementations, the lighting system 3900 may be interior or exterior lighting applications, such as billboard lighting, building lighting, street lighting, light bulbs, and lamps.

In utilizing the various aspects of this invention, it would become apparent to one skilled in the art that combinations or variations of the above embodiments are possible for forming an LED device including any one of a confined current injection area. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A display structure comprising:
   a display substrate;
   a bottom electrode over the display substrate;
   a light emitting diode (LED) device bonded to the bottom electrode, wherein the LED device comprises:
      a top current spreading layer doped with a first dopant type;
      a top cladding layer underneath the top current spreading layer, the top cladding layer doped with the first dopant type;
      a bottom cladding layer;
      an active layer between the top cladding layer and the bottom cladding layer; and
      a semiconductor confinement barrier directly on a bottom side of the top cladding layer and completely laterally surrounding the bottom cladding layer and the active layer.

2. The display structure of claim 1, wherein a material transition from the top cladding layer, active layer and the bottom cladding layer to the semiconductor confinement barrier is a continuous crystal structure.

3. The display structure of claim 1, wherein the LED device has a maximum lateral dimension of 50 μm or less.

4. The display structure of claim 1, wherein the semiconductor confinement barrier has a larger bandgap than the active layer.

5. The display structure of claim 1, wherein the semiconductor confinement barrier is doped.

6. The display structure of claim 1, wherein the top current spreading layer is wider than the active layer.

7. The display structure of claim 6, wherein the active layer has a maximum width of less than 20 μm.

8. The display structure of claim 6, wherein the active layer has a maximum width of 1-10 μm.

9. The display structure of claim 6, wherein the active layer has a maximum width of approximately 2.5 μm.

10. The display structure of claim 1, wherein the LED device is bonded within a bank opening in a bank layer over the display substrate.

11. The display structure of claim 10, further comprising a passivation material laterally surrounding the LED device within the bank opening.

12. The display structure of claim 11, further comprising a transparent passivation layer on top of the LED device and spanning over the passivation layer and the bank layer.

13. The display structure of claim 1, wherein the LED device is in electrical connection with a micro chip within a display area of the display substrate.

14. The display structure of claim 1, wherein the first dopant type is n-type.

15. The display structure of claim 14, wherein the bottom cladding layer is undoped AlInP.

16. The display structure of claim 15, wherein the active layer is AlGaInP.

17. The display structure of claim 16, wherein the active layer includes a single-quantum-well (SWQ) configuration.

18. The display structure of claim 1, wherein the active layer includes a multi-quantum well (MQW) configuration.

19. The display structure of claim 18, wherein the MQW configuration includes a plurality of AlGaInP quantum well layers.

20. The display structure of claim 1, wherein the semiconductor confinement barrier has a larger bandgap than one or more quantum well layers in the active layer.

21. A display structure comprising:
    a display substrate;
    a bottom electrode over the display substrate;
    a light emitting diode (LED) device bonded to the bottom electrode, wherein the LED device comprises:
       a top current spreading layer doped with an n-type dopant;
       an undoped AlInP bottom cladding layer;
       an active layer between the top current spreading layer and the undoped AlInP bottom cladding layer; and
       a semiconductor confinement barrier laterally surrounding the undoped AlInP bottom cladding layer and the active layer.

22. The display structure of claim 21, wherein the active layer is AlGaInP.

23. The display structure of claim 21, wherein the active layer includes a single-quantum-well (SWQ) configuration.

* * * * *